United States Patent
Inoue

(10) Patent No.: US 7,248,478 B2
(45) Date of Patent: Jul. 24, 2007

(54) COOLANT COOLED TYPE SEMICONDUCTOR DEVICE

(75) Inventor: Seiji Inoue, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/452,328

(22) Filed: Jun. 14, 2006

(65) Prior Publication Data

US 2006/0232939 A1 Oct. 19, 2006

Related U.S. Application Data

(62) Division of application No. 10/946,210, filed on Sep. 22, 2004, now Pat. No. 7,106,592, which is a division of application No. 10/314,139, filed on Dec. 9, 2002, now Pat. No. 6,845,012, which is a division of application No. 09/837,382, filed on Apr. 19, 2001, now Pat. No. 6,542,365.

(30) Foreign Application Priority Data

| Apr. 19, 2000 | (JP) | ............................. 2000-118093 |
| May 10, 2000 | (JP) | ............................. 2000-136934 |
| Jun. 8, 2000 | (JP) | ............................. 2000-172091 |
| Jun. 29, 2000 | (JP) | ............................. 2000-195887 |
| Jun. 30, 2000 | (JP) | ............................. 2000-200021 |
| Nov. 20, 2000 | (JP) | ............................. 2000-353257 |

(51) Int. Cl.
  *H05K 7/20* (2006.01)
(52) U.S. Cl. ..................... 361/699; 361/689; 174/15.1; 257/712; 165/80.4
(58) Field of Classification Search ..................... None
See application file for complete search history.

(56) References Cited

U.S. PATENT DOCUMENTS

| 3,436,603 A | 4/1969 | Vogt |
| 3,603,381 A | 9/1971 | Scherbaum et al. |
| 3,652,903 A | 3/1972 | Eriksson et al. |
| 3,921,201 A | 11/1975 | Eisele et al. |
| 4,142,577 A | 3/1979 | Klein |
| 4,178,630 A | 12/1979 | Olsson |
| 4,268,850 A | 5/1981 | Lazarek et al. |
| 4,392,153 A | 7/1983 | Glascock, II et al. |
| 4,578,745 A | 3/1986 | Olsson |
| 4,841,355 A | 6/1989 | Parks |
| 5,043,797 A | 8/1991 | Lopes |
| 5,229,915 A | 7/1993 | Ishibashi et al. |
| 5,396,403 A | 3/1995 | Patel |
| 5,489,802 A | 2/1996 | Sakamoto et al. |
| 5,821,161 A | 10/1998 | Covell et al. |
| 5,874,774 A | 2/1999 | Takahashi |
| 5,907,474 A | 5/1999 | Dolbear |

(Continued)

FOREIGN PATENT DOCUMENTS

DE  4322665 A1  1/1994

(Continued)

*Primary Examiner*—Boris Chervinsky
(74) *Attorney, Agent, or Firm*—Oliff & Berridge PLC

(57) ABSTRACT

A semiconductor device includes a cooling unit in which coolant flows, a semiconductor chip having two main surfaces press-pinched by the cooling unit, and an electronic member different from the semiconductor chip. The electronic member is located to contact the cooling unit.

5 Claims, 37 Drawing Sheets

U.S. PATENT DOCUMENTS

| | | | |
|---|---|---|---|
| 5,966,290 A | 10/1999 | Sammakia et al. | |
| 5,990,549 A | 11/1999 | Chiu et al. | |
| 6,014,313 A | 1/2000 | Hesselbom | |
| 6,025,992 A | 2/2000 | Dodge et al. | |
| 6,072,240 A | 6/2000 | Kimura et al. | |
| 6,072,697 A | 6/2000 | Garcia-Ortiz | |
| 6,073,683 A | 6/2000 | Osakabe et al. | |
| 6,084,771 A | 7/2000 | Ranchy et al. | |
| 6,144,101 A | 11/2000 | Akram | |
| 6,181,007 B1 | 1/2001 | Yamazaki et al. | |
| 6,188,575 B1 * | 2/2001 | Azotea | 361/701 |
| 6,215,185 B1 | 4/2001 | Kikuchi et al. | |
| 6,303,974 B1 | 10/2001 | Irons et al. | |
| 6,320,268 B1 | 11/2001 | Lang et al. | |
| 6,326,761 B1 * | 12/2001 | Tareilus | 318/722 |
| 6,333,849 B1 | 12/2001 | Donahoe et al. | |
| 6,349,035 B1 | 2/2002 | Koenen | |
| 6,351,387 B1 | 2/2002 | Prasher | |
| 6,380,622 B1 | 4/2002 | Hirai et al. | |
| 6,495,924 B2 | 12/2002 | Kodama et al. | |
| 6,496,375 B2 | 12/2002 | Patel et al. | |

FOREIGN PATENT DOCUMENTS

| | | |
|---|---|---|
| FR | 2721438 | 12/1995 |
| JP | 355123154 A | 9/1980 |
| JP | A-55-162250 | 12/1980 |
| JP | A-57-186345 | 11/1982 |
| JP | A-58-34951 | 3/1983 |
| JP | A-58-165349 | 9/1983 |
| JP | A-59-119858 | 7/1984 |
| JP | 361279158 A | 12/1986 |
| JP | A-61-279158 | 12/1986 |
| JP | A-62-92349 | 4/1987 |
| JP | A-62-252957 | 11/1987 |
| JP | 363096946 A | 4/1988 |
| JP | A-1-201942 | 8/1989 |
| JP | 2-89352 | 3/1990 |
| JP | 5-55419 | 3/1993 |
| JP | 405082687 A | 4/1993 |
| JP | 06-37219 | 10/1994 |
| JP | 6-291223 | 10/1994 |
| JP | 8-008395 | 1/1996 |
| JP | A-9-307039 | 11/1997 |
| JP | A-10-56131 | 2/1998 |
| JP | A-63-96946 | 4/1998 |
| JP | A-11-87585 | 3/1999 |
| JP | 11-146507 | 5/1999 |
| JP | A-11-297910 | 10/1999 |
| JP | 11-346480 | 12/1999 |
| JP | 2000-174180 | 6/2000 |
| JP | 2001-308263 | 11/2001 |
| JP | 2002-26251 | 1/2002 |

* cited by examiner

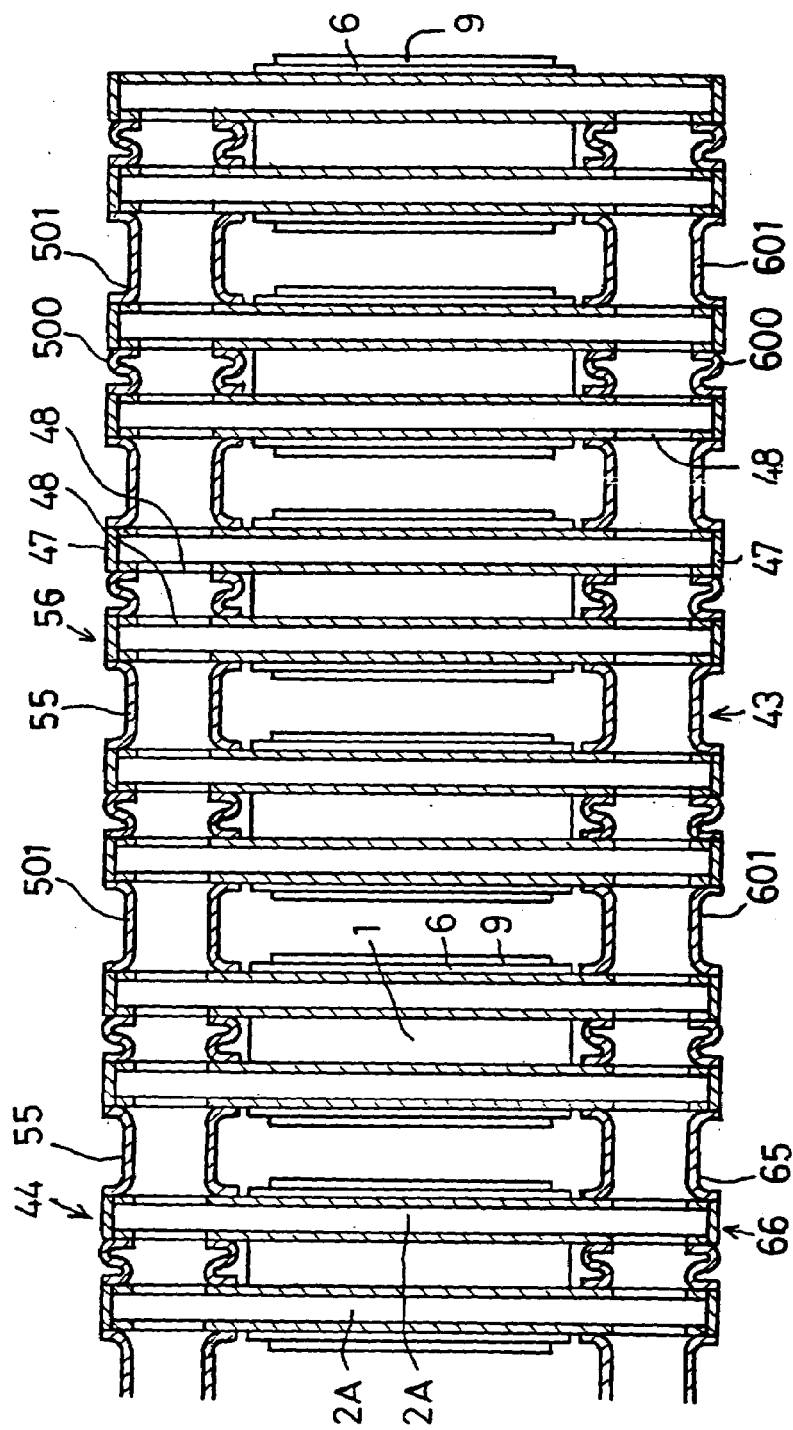

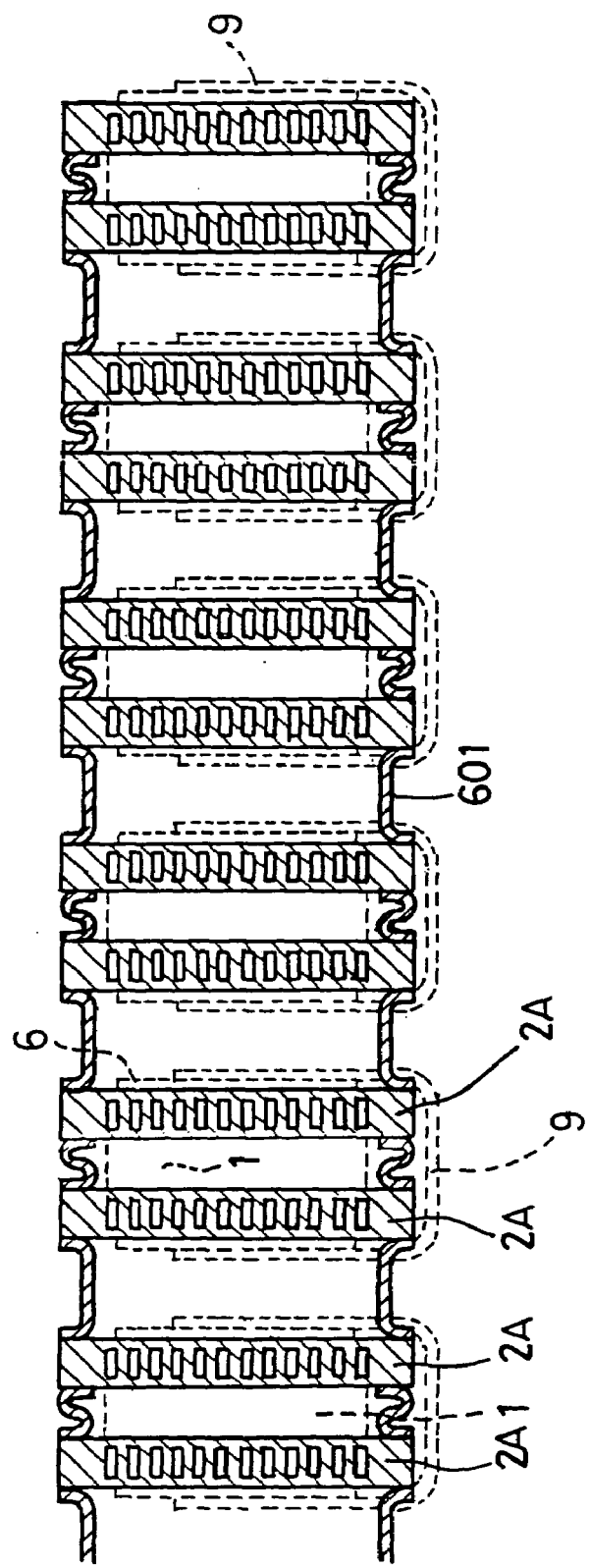

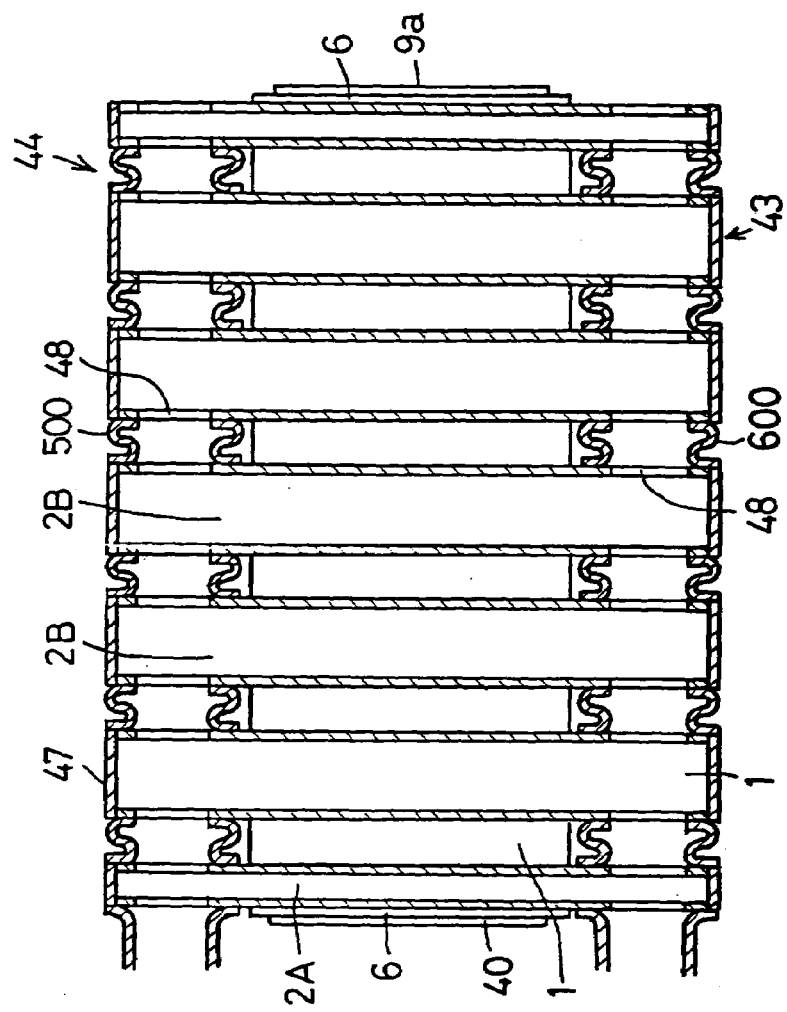
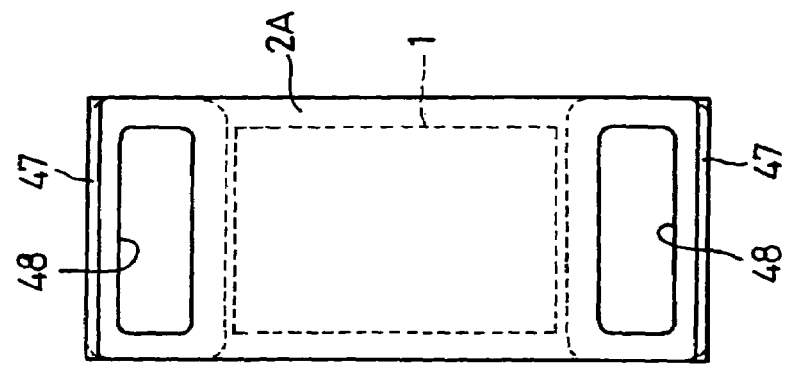

COOLANT COOLED TYPE SEMICONDUCTOR DEVICE

CROSS REFERENCE TO RELATED APPLICATIONS

This is a division of U.S. patent application Ser. No. 10/946,210, filed Sep. 22, 2004, now U.S. Pat. No. 7,106,592 which is a division of U.S. patent application Ser. No. 10/314,139, filed Dec. 9, 2002 (now U.S. Pat. No. 6,845,012), which is a division of U.S. patent application Ser. No. 09/837,382 filed Apr. 19, 2001 (now U.S. Pat. No. 6,542,365). The disclosures of these prior applications are incorporated herein by reference in their entireties.

This application is based upon and claims the benefit of Japanese Patent Applications No. 2000-118093 filed on Apr. 19, 2000, No. 2000-136434 filed on May 10, 2000, No. 2000-172091 filed on Jun. 8, 2000, No. 2000-195887 filed on Jun. 29, 2000, No. 2000-200021 filed on Jun. 30, 2000, and No. 2000-353257 filed on Nov. 20, 2000, the contents of which are incorporated herein by reference.

BACKGROUND OF THE INVENTION

1. Field of the Invention

This invention relates to a coolant cooled type semiconductor device.

2. Description of the Related Arts

To improve cooling characteristics of semiconductor modules that contain semiconductor chips having terminals, it has been proposed that water cooling type cooling members are made in contact with semiconductor modules so as to cool these semiconductor modules. Also, Japanese Laid-open Patent Application No. Hei-6-291223 has proposed a double-sided heat-radiating type semiconductor module in which heat is radiated from both surfaces of this semiconductor module.

However, in the above-described conventional water-cooling type semiconductor modules, a cooling member must be joined to the semiconductor modules, while maintaining superior heat transfer characteristics. To realize such superior heat transfer characteristics, there is the best way such that an electrode (also having heat transfer function) that is exposed from the main surfaces of the semiconductor modules is joined to the cooling member by a soldering material.

If the cooling member is a cooling unit through which water or coolant passes, the cooling unit may be connected to either a refrigerating cycle apparatus or a cooling water circulating apparatus. Therefore, the above-explained electrode member of the semiconductor module and the cooling member is set to a predetermined potential (normally, ground potential) equal to that of the refrigerating cycle apparatus, or the cooling water circulating apparatus.

However, when such an electrically insulating spacer is employed, since the electrode member of the semiconductor module cannot be joined to the cooling member, the electrode member of the semiconductor module and also the cooling member must be strongly pressed against the electrically insulating spacer under such a condition that uniform pinching pressure is given to the respective face portions in order to reduce the thermal resistance between the electrode member of the semiconductor module and the cooling member.

The above-described construction in which both the semiconductor module and the cooling member are strongly pressed against the insulating spacer under uniform pinching pressure would induce the complex entire structure. Also, the pinching force cannot be controlled easily. In other words, when the pinching force is low, the thermal resistance between the semiconductor module and the cooling member is increased, so that the cooling capability is lowered. To the contrary, when the pinching force is excessively high, the semiconductor chips built in the semiconductor module are broken.

Also, in order to cool double-sided of a large number of these semiconductor chips, or double-sided cooling type semiconductor card modules, a large number of the above-explained cooling members are branched, resulting in complex structures and increased manufacture cost. These increase the risk that fluids may be leaked due to an increased total number of joint places of the coolant distribution tubes.

SUMMARY OF THE INVENTION

The present invention has been made to solve the above-explained problem, and therefore, has an object to provide a coolant cooled type semiconductor device having a simple structure and also capable of realizing a superior heat radiation capability, and further capable of reducing a possibility of fluid leakages.

According to a first aspect of the present invention, a semiconductor device is disposed between a first cooling member and a second cooling member, a first insulating member is disposed between the first cooling member and the semiconductor device a second insulating member is disposed between the second cooling member and the semiconductor device. In this way, the semiconductor is insulated from the first and the second cooling member while heat generated in the semiconductor device radiates through the cooling members.

According to a second aspect of the present invention, a cooled type semiconductor device comprises: first and second cooling members, through which a coolant flows, pinching a semiconductor device therebetween tightly by a fixing member.

It is preferable that a cooling unit has a flat shape and has a first portion corresponding to the first cooling member, a second portion corresponding to the second cooling member, and a folded portion connecting the first and second portions.

According to a third aspect of the present invention, a cooled type semiconductor device comprises: a first semiconductor chip having a high side semiconductor switching element which has a first positive and a first negative electrodes, a second semiconductor chip having a low side semiconductor switching element which has a second positive and a second negative electrodes, wherein the first negative electrode and the second positive electrode are connected to a common mid terminal, the first positive electrode is connected to a high potential terminal and the second negative electrode is connected to a low potential terminal whose electric potential is lower than that of the high potential terminal.

According to a fourth aspect of the present invention, a cooled type semiconductor module comprising: a first heat radiating plate disposed on a main surface of the module and a second heat radiating plate disposed on a back surface of the module, wherein a heat sink contacts the first radiating plate, and a biasing-holding member connected with the heat sink presses the semiconductor module to the heat sink.

BRIEF DESCRIPTION OF THE DRAWINGS

Other objects and features of the present invention will become more readily apparent from a better understanding of the preferred embodiments described below with reference to the following drawings, in which:

FIG. 20 is a transversal sectional view showing a main portion of a coolant cooled type semiconductor device of a seventh embodiment;

FIG. 21 is a longitudinal sectional view of the main portion of FIG. 20;

FIG. 22 is a side view of a flat cooling tube of FIG. 20;

FIG. 23 is a transversal sectional view showing a main portion of a coolant cooled type semiconductor device of a eighth embodiment;

DETAILED DESCRIPTION OF THE PREFERRED EMBODIMENTS

First Embodiment

Referring now to drawings, a description will be made of a coolant cooled type semiconductor device according to first preferred embodiment of the present invention.

Figure 1:
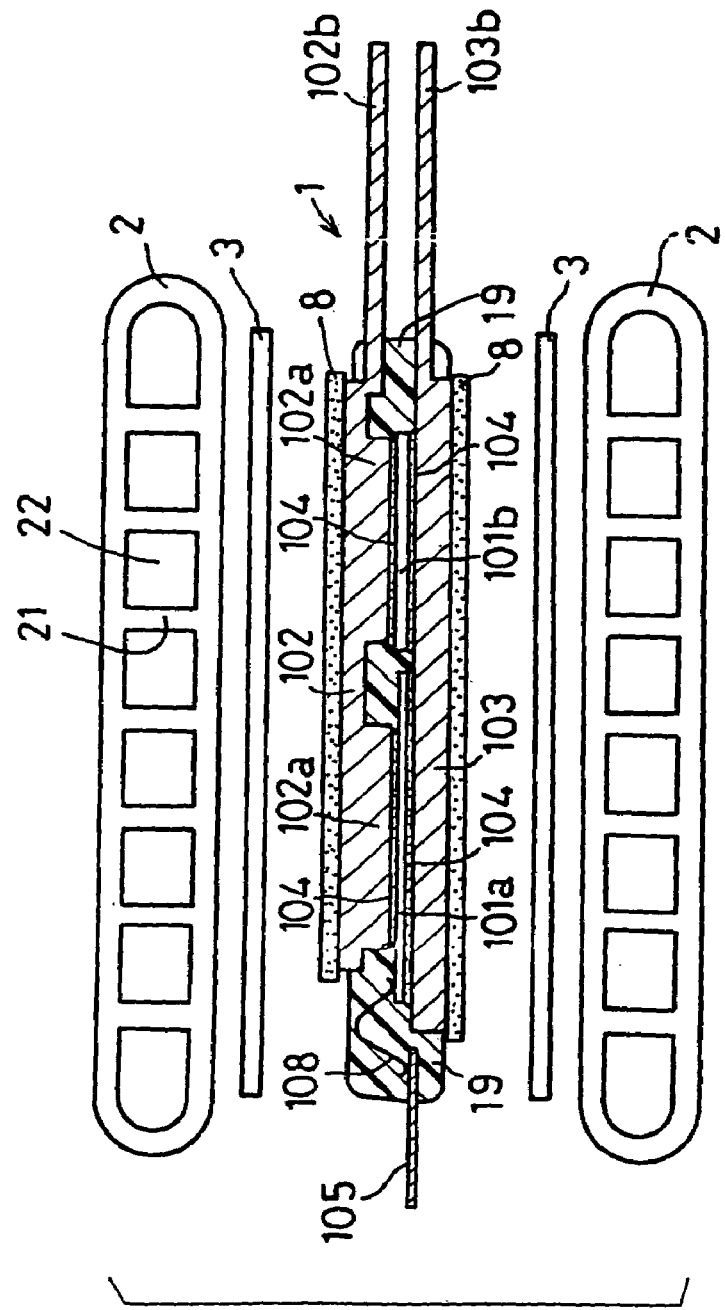
FIG. 1 is a cross-sectional view showing a coolant cooled type semiconductor device of a first embodiment.

FIG. 1 is a sectional view showing a substantial part of this coolant cooled type semiconductor device along a thickness direction thereof

[Structure of Semiconductor Module]

The cooled type semiconductor module 1 has a coolant tube 2 and spacers 3 made of a metal or having a thermal transfer characteristic. More specially, the semiconductor module 1 has a semiconductor chip 101a in which an IGBT element is formed, a semiconductor chip 101b in which a flywheel diode is formed, a metal heat transfer plate 102 working as a heat sink as well as an electrode (namely, emitter side in this embodiment), and a metal heat transfer plate 103 working as a heat sink as well as an electrode (namely, collector side in this embodiment) likewise. Reference numeral 104 denotes soldering layers. A metal heat transfer plate 102 has projecting portions 102a projecting on sides of the semiconductor chips 101a and 101b thereof, and a projecting terminal portion 102b. A metallic heat transfer plate 103 has a projecting terminal portion 103b. A control electrode terminal 105 is connected to a gate electrode of the IGBT through a bonding wire 108. Insulating plates 8 are disposed on both sides of the semiconductor module 1. A sealing resin portion 19 seals the semiconductor chips 101a and 101b.

Both the semiconductor chips 101a and 101b are joined to a main surface (major surface) provided on an inner side of the metal heat transfer plate 103 by the soldering layer 104, and the projecting portions 102a of the metal heat transfer plate 102 are joined to main surfaces of the semiconductor chips 101a and 101b by the soldering layer 104 at an opposite side of the metal heat transfer plate 103. As a result, an anode electrode and a cathode electrode of the flywheel diode are connected to a collector electrode and an emitter electrode of the IGBT in a so-called "back-to-back connection" manner. For instance, Mo and W are employed for the metal heat transfer plates 102 and 103. The soldering layers 104 may be replaced with other joint function materials.

The two projecting portions 102a have a difference in thicknesses which are capable of absorbing a difference in thickness between the semiconductor chip 101a and the semiconductor chip 101b, so that an outer major surface of the metal heat transfer plate 102 constitutes a flat plane.

The sealing resin portion 19 is made of, for example, an epoxy resin, and is molded to cover side surfaces of these metal heat transfer plates 102 and 103. As a result, both the semiconductor chips 101a and 101b are molded by the sealing resin portion 19. It should be understood that the outer main surfaces, namely contact heat receiving surfaces of the metal heat transfer plates 102 and 103 are completely exposed.

The projecting terminal portions 102b and 103b are provided to project from the sealing resin portion 19 in the right direction as viewed in FIG. 1. Plural control electrode terminals 105 so-called "lead frame terminals" are connected to the gate (control) electrode of the semiconductor chip 101a where the IGBT is formed.

In this embodiment, each of the insulating plates 8 corresponding to an insulating spacer is composed of an aluminum nitride film, but alternatively other insulating films may be adopted. The insulating plates 8 closely contact the metal heat transfer plates 102 and 103, while completely covering these heat metal transfer plates 102 and 103. Alternatively, the insulating plates 8 may be simply made in contact with both the metal heat transfer plates 102 and 103, or a heat transfer material such as silicone grease may be coated thereto. The insulating plates 8 can be joined to these metal heat transfer plates 102 and 103 by various methods. Further, each of the insulating plates 8 may closely contact the side of the coolant tube 2.

The coolant tube 2 is manufactured in such a manner that an aluminum alloy is manufactured by either an extract-molding method or an extrude-molding method to form a plate member, and this plate member is cut off at a necessary length. As shown in FIG. 1, a sectional area of the coolant tube 2, as viewed along a thickness direction thereof, has a large number of flow paths 22 which are partitioned by a large number of partition walls 21. These partition walls 21 extend at a given interval in a flow path direction.

In accordance with this structure, the pinching pressure applied to the respective portions on the contact heat-receiving surface 20 of the coolant tube 2 can be made constant.

In this embodiment, each of the spacers (namely, soft material member) 3 is made of a soft metal plate such as a soldering alloy. Alternatively, the spacer 3 may be made of a film that is coated on a contact plane of the coolant tube 2. The surface of this soft-material spacer 3 can be easily deformed by receiving pressure (will be explained later), and the deformed spacer 3 can be easily fitted to very fine concave/convex portions and cambers of the insulating material 8, and also to very small concave/convex portions and cambers of the coolant tube 2 so that thermal resistance can be reduced by closely contacting. Optionally, grease having a thermal transfer characteristic may be coated on surfaces of the spacer 3. Of course this spacer 3 may be omitted.

[Structure of the Semiconductor Device]

Figure 2:
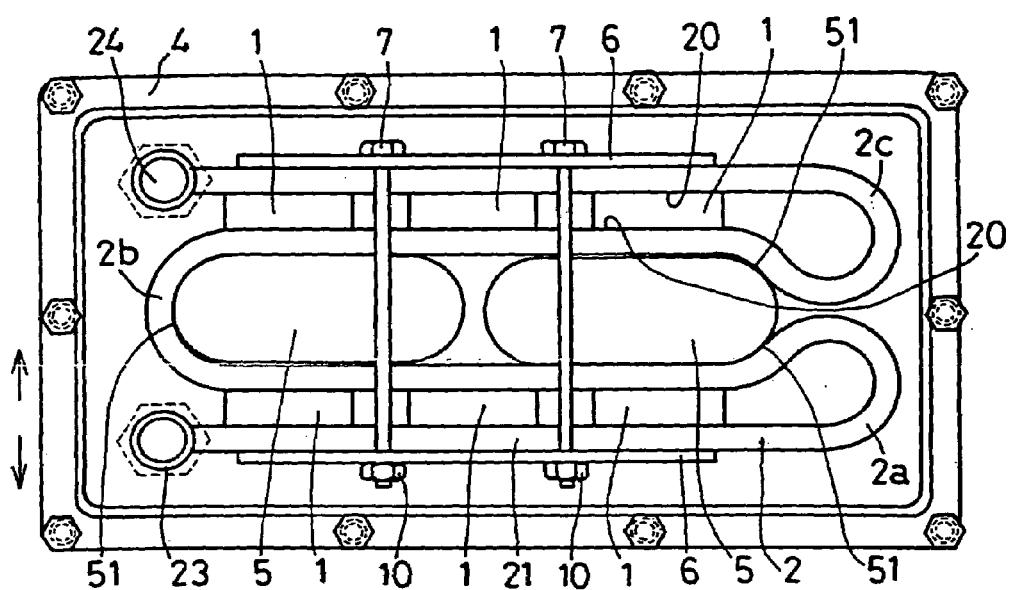
FIG. 2 is a plane view for indicating this semiconductor device whose lid is taken out.
Figure 3:
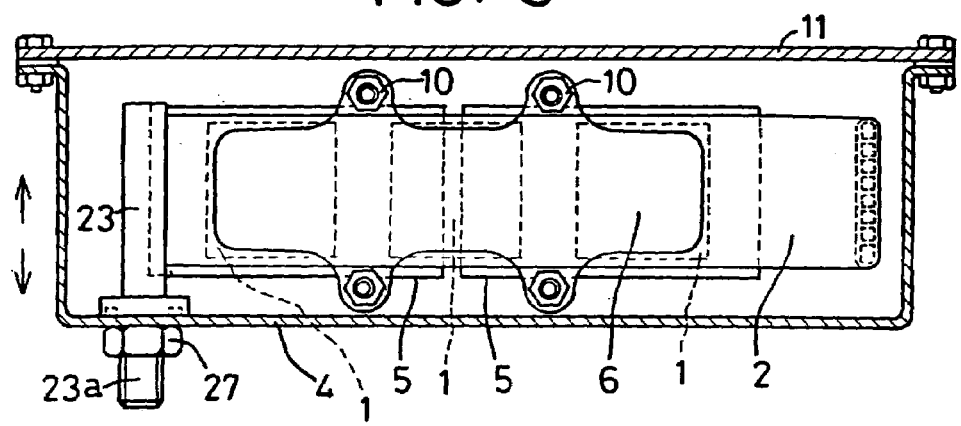
FIG. 3 is a cross-sectional view of this semiconductor device shown in FIG. 2.

Referring now to FIG. 2 and FIG. 3, a description will be made on an example of a coolant cooled type semiconductor device with employment of the above-explained double-sided heat-radiating type semiconductor module. FIG. 2 is a plane view for indicating this semiconductor device whose lid is taken out. FIG. 3 is a cross-sectional view of this semiconductor device shown in FIG. 2.

In the drawings, reference numeral 1 shows semiconductor modules, reference numeral 2 indicates the coolant tube, reference numeral 4 denotes a case whose one end is opened, and reference numeral 5 denotes smoothing capacitors. Also, reference numeral 6 denotes supporting plates, reference numeral 7 denotes through bolts, reference numeral 10 shows nuts, reference numeral 11 denotes a lid, reference numeral 23 denotes a coolant distribution tube on an inlet side, reference numeral 24 is a coolant distribution tube on an outlet side, reference numeral 27 shows a nut used to fix the coolant distribution tube. Reference numeral 23a shows a tip portion of the coolant distribution tube 23.

The coolant flat tube 2 is folded (bent) to have a winding shape and is disposed inside the case 4. In this embodiment, the coolant tube 2 is folded three times so as to have three spaces. These three spaces are isolated from each other by three folded portions 2a, 2b and 2c. Three pairs of contact heat receiving planes 20, 20 of the coolant tube 2 are disposed in each space respectively and are arranged along an up-and-down direction in FIG. 2. Each pair of the contact heat receiving planes 20, 20 extends to a right/left (lateral) direction in FIG. 2, so that each pair of the contact heat receiving planes 20, 20 is disposed parallel to the other pairs as viewed in this drawing. These contact heat receiving planes 20, 20 are made flat, and are located opposite and parallel to each other. Reference numerals 2a, 2b, and 2c represent curved (folded) portions of the coolant tube 2.

One pair of the three pairs of the contact heat receiving planes 20 and 20 that is located at a lower position in FIG. 2, namely the flat portions of the both sides of the curved portion 2a of the coolant tube 2 are closely contacted to both surfaces of the three double-sided heat-radiating type semiconductor modules 1 through a spacer 3 (not shown in FIG. 2 and FIG. 3), so that the semiconductor modules 1 can radiate heat generated therein from both sides thereof which closely contact the contact heat receiving planes 20, 20. These three double-sided heat-radiating type semiconductor module 1 will constitute an upper arm (high side) of a 3-phase inverter circuit which drives a load such as a motor.

Another one pair of the three pairs of the contact heat receiving planes 20 and 20 that is located at an upper position in FIG. 2, namely the flat portions of the both sides of the curved portion 2c of the coolant tube 2 are closely contacted to both surfaces of the three double-sided heat-radiating type semiconductor modules 1 through a spacer 3 (not shown in FIG. 2 and FIG. 3), so that the semiconductor modules 1 can radiate heat generated therein from both sides thereof which closely contact the contact heat receiving planes 20, 20. These three double-sided heat-radiating type semiconductor module 1 will constitute a lower arm (low side) of a 3-phase inverter circuit.

The remaining pair of the three pairs of contact heat receiving planes 20, 20 that are located at a center position, namely the flat portions of the both sides of the curved portion 2b of the coolant tube 2 are closely contacted to the outer surface of two smoothing capacitors 5.

Each of these semiconductor switching elements is arranged in such a manner that one flywheel diode has a back-to-back connection to one IGBT element, as explained in the above embodiment.

The smoothing capacitors 5 are connected between a positive DC power supply and a negative DC power supply of the above-explained 3-phase inverter circuit. These smoothing capacitors 5 are employed so as to prevent a switching noise from entering to the DC power supplies through a power supply line.

As previously described, both the surfaces of the respective double-sided heat-radiating type semiconductor modules 1 are closely contacted the contact heat receiving planes 20 of the coolant tubes 2. Moreover, pinching plates 6 abut against the flat planes of the coolant tubes 2 and 2 provided on the lower and upper outermost sides. The through bolts 7 pass through both the upper end portions and the lower end portions of both the pinching plates 6 and 6 along a stacking direction, i.e., the up and down direction in FIG. 2, and are fastened by nuts 10.

Fastening force of the nuts 10 is adjusted in such a manner that the pressure force applied to the semiconductor modules 1 exerted by the coolant tubes 2 becomes a predetermined value. In other word, such a pressuring member constituted by the pinching plate 6, the through bolt 7, and the nut 10 may have a function capable of setting the pinching force applied to the semiconductor module 1 exerted by the coolant tubes 2, and also another function as a structural member capable of supporting the 3-phase inverter circuit apparatus.

As shown in FIG. 3, one end of the coolant tube 2 is joined to an inlet of a coolant distribution tube 23, and the other end of the coolant tube 2 is joined to an outlet coolant distribution tube 25. Both a tip end portion 23a of the coolant distribution tube 23 and a tip end portion (not shown) of the coolant distribution tube 25 are projected from the bottom portion of the case 4 downwardly. A screw (thread) is formed on this tip end portion 23a, and this screw may be coupled to a coolant distribution tube of an externally provided refrigerating cycle apparatus (not shown). It should be understood that this coolant tube 2 may constitute a portion of an evaporator of this refrigerating cycle apparatus, or the entire portion thereof. Reference numeral 27 shows a nut which fastens/fixes the coolant distribution tubes 23 and 25 onto a bottom portion of the case 4.

In accordance with this structure, since the coolant tubes 2 can be detachably coupled to the external cooling mechanism (heat radiation apparatus) outside the case, even when the fluids (coolant) are leaked from these coupling portions (above-mentioned tip end portions), it is possible to avoid such an adverse influence caused by the short-circuit occurred in the circuit. Also, the apparatus can be partially replaced.

In accordance with this embodiment, since both the arms of the 3-phase inverter circuit are cooled by the same coolant which flows along the both of arms, fluctuations in the heat radiation capabilities between these arms can be reduced.

Also, a difference in cooling capabilities among the respective double-sided heat-radiating type semiconductor modules 1 disposed in the same arm can be reduced.

Furthermore, each of the double-sided heat-radiating type semiconductor modules 1 is pressured by a common pressuring member, i.e., the folded coolant tube 2, so that pinching force per unit area as well as pinching areas, which is applied between each of the semiconductor modules 1 and the coolant tube 2, is made substantially equal to each other.

As a result, a difference in the pinching force of the coolant tubes 2 with respect to the semiconductor modules 1 can be reduced. In other words, all of the semiconductor modules 1 are applied a substantial uniform pinching force with the folded coolant tube 2.

After all, while the difference in the cooling capabilities among the respective semiconductor modules 1 is made small, such a compact semiconductor device having a superior cooling characteristic can be realized.

Also, while the smoothing capacitor 5 may also be cooled under better condition, in such a case that the double-sided heat-radiating type semiconductor module 1 radiates very large heat under a transient state, this smoothing capacitor 5 can absorb heat through the coolant tubes 2, thereby functioning as a heat sink.

(Modification)

Even when the above-explained semiconductor module 1 of the embodiment is replaced by a semiconductor chip, a similar operation and effect may be achieved.

Second Embodiment

Figure 4:
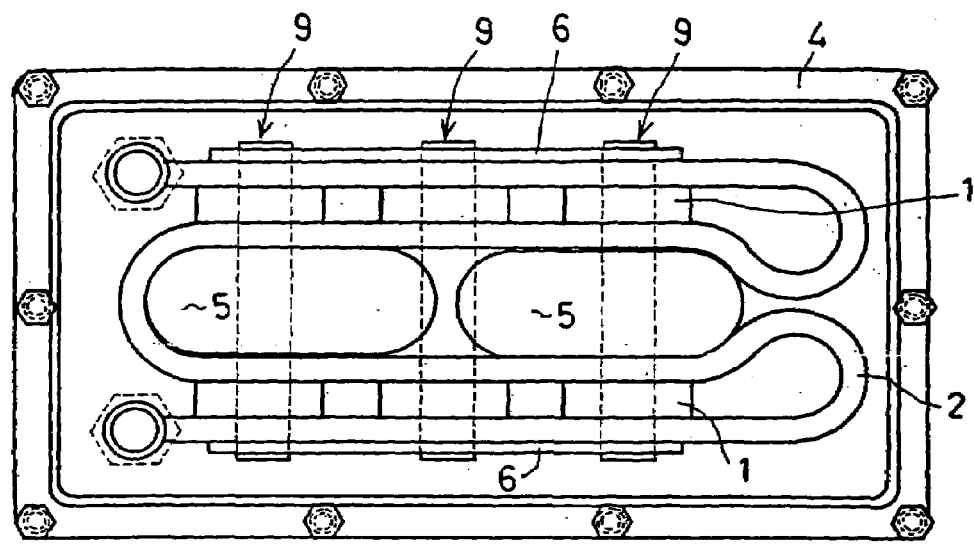
FIG. 4 is a plan view for indicating a coolant indirect cooling type semiconductor device of another embodiment.
Figure 5:
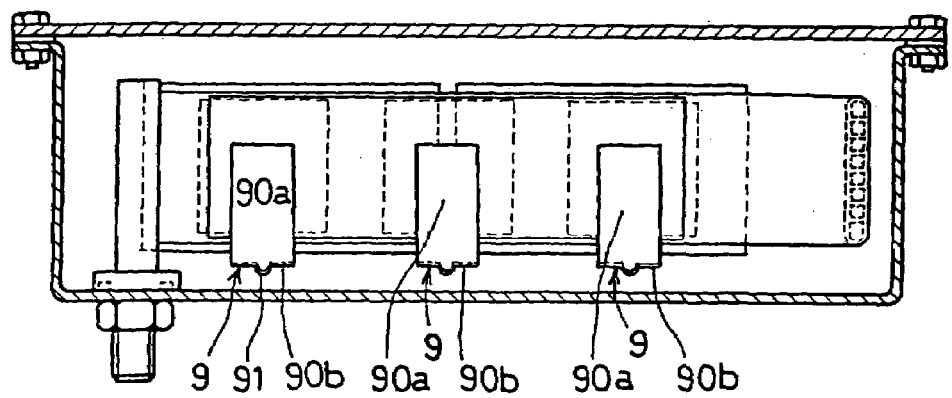
FIG. 5 is a cross-sectional view for indicating the coolant indirect cooling type semiconductor device shown in FIG. 4.

FIG. 4 and FIG. 5 show a coolant cooled type semiconductor device according to another embodiment of the present invention. FIG. 4 is a plan view for indicating this semiconductor device from which a lid thereof is taken out. FIG. 5 is a cross-sectional view for representing this semiconductor device of FIG. 4.

(Structure of Semiconductor Device)

Figure 6:
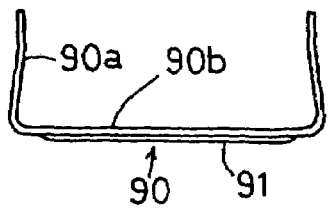
FIG. 6 is a side view for indicating a leaf spring member shown in FIG. 5.

In this semiconductor device of this embodiment, while the semiconductor module 1, the coolant tube 2, the smoothing capacitor 5, and the pinching plate 6 are made in the same array as that of the embodiment 1, this above-mentioned component set is sandwiched by three sets of leaf spring members 9. This leaf spring member 9, as shown in FIG. 6, is constituted by one piece of center leaf portion 90b, and one pair of plate-shaped both edge portions 90a and 90a. The center leaf portion 90b is arranged parallel to a bottom portion of the case 4. One pair of both edge portions 90a and 90a are elongated from the respective both edge portions of this center leaf portion 90b at a right angle, respectively, and also are located opposite to each other. Reference numeral 91 shows a groove portion which is formed in the center leaf portion 90b of a large-sized spring member 90.

In accordance with this embodiment, the respective members can be assembled in a simpler manner. In addition, pinching forces applied to the respective members do not have so much fluctuation in each other. In other words, the constant pinching force can be obtained in a simple manner, and also either the semiconductor chip or the double-sided heat-radiating type semiconductor module can be detachably mounted in a very simple manner, so that the replacement workability can be considerably improved.

Third Embodiment

Figure 7:
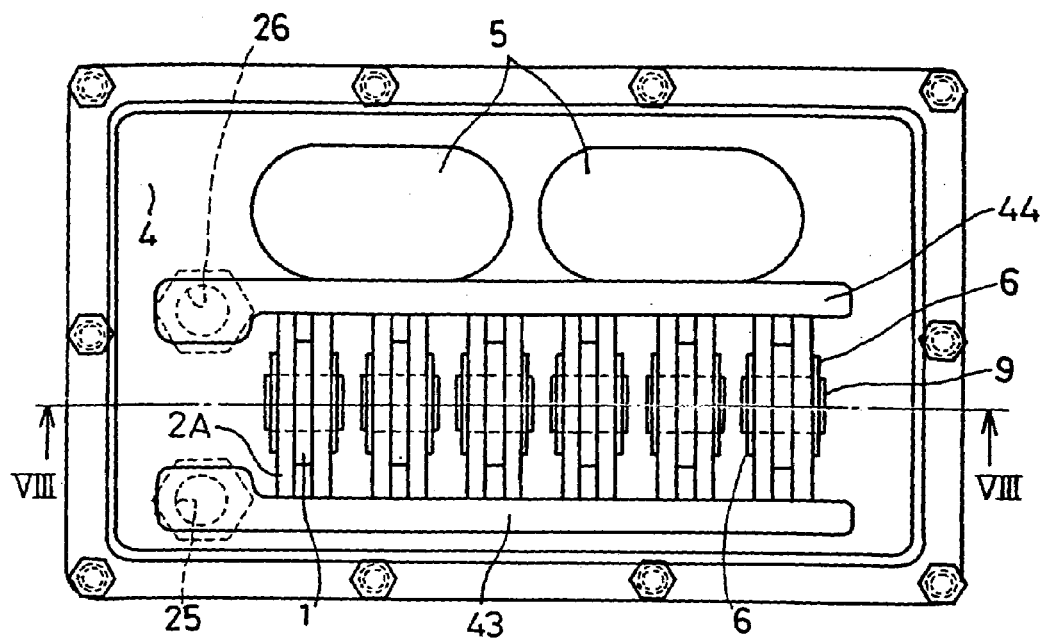
FIG. 7 is a plane view for indicating this semiconductor device whose lid is taken out.
Figure 8:
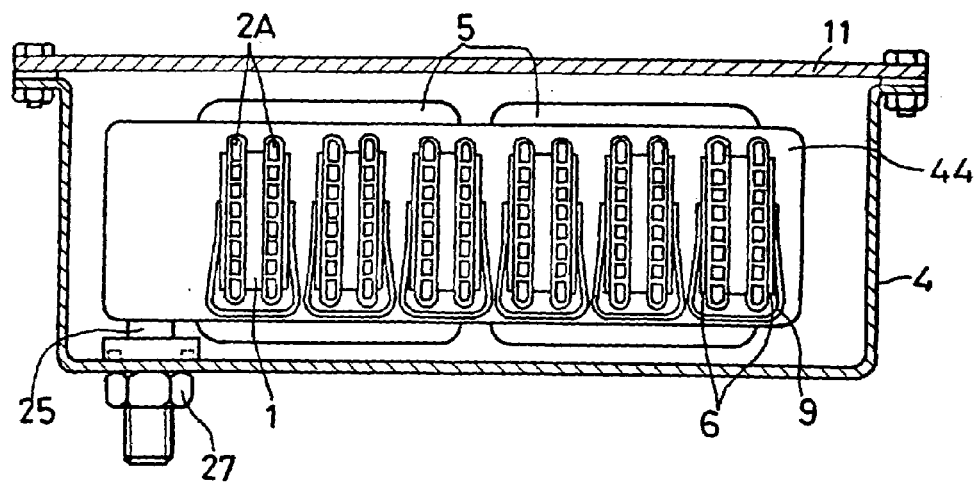
FIG. 8 is a cross sectional view for representing this semiconductor device of FIG. 7.

Referring now to FIG. 7 and FIG. 8, a description will be made of an example of a coolant cooled type semiconductor device with employment of a dual-plane heat-radiating type semiconductor module. FIG. 7 is a plane view for indicating this semiconductor device whose lid is taken out. FIG. 8 is a cross sectional view for representing this semiconductor device of FIG. 7.

Reference numeral 1 shows a semiconductor module, reference numeral 2A indicates a coolant tube, reference numeral 4 denotes a case whose one end is opened, and reference numeral 5 represents one pair of smoothing capacitors which are connected in parallel to each other. Also, reference numeral 6 denotes a pinching plate, reference numeral 9 shows a leaf spring member, reference numeral 11 indicates a lid, reference numeral 43 denotes an inlet header, reference numeral 44 is an outlet header, and reference numerals 25 and 26 show coolant distribution tubes, and reference numeral 27 shows a nut used to fix the coolant distribution tubes.

The coolant distribution tubes 25 and 26 are fixed on a bottom portion of the case 4 by using nuts. Tip portions of the coolant distribution tubes 25 and 26 penetrate the bottom portion of the case 4 to be projected along the downward direction.

Both the coolant distribution tubes 25 and 26 are communicated to lower edges of the inlet header 43 and the outlet header 44 in an integral form within the case 4. Both the inlet header 43 and the outlet header 44 own hollow plane shape. The headers 43 and 44 are stood on the bottom surface of the case 4 at a right angle within the case 4, and are positioned opposite to each other in a parallel manner with an interval. Six pairs of coolant tubes 2 are arranged among main counter surfaces of both the inlet header 43 and the outlet header 44.

The respective coolant tubes 2 are arranged in parallel to each other on the main surfaces of both the inlet and outlet headers 43 and 44 at the right angle. Both edges of these coolant tubes 2 are separately communicated and joined to both the inlet and outlet headers 43 and 44. As will be explained later, each of these coolant tubes 2 owns a hollow thick-plate shape.

The coolant tubes 2 in each pair pinches the double-sided heat radiating type semiconductor module 1. Six pieces of semiconductor modules 1 which constitute a 3-phase inverter circuit are sandwiched by different pairs of coolant tubes 2 and 2.

The pinching plates 6 made of metal flat plates are closely contacted to outer-sided main surfaces of such coolant tubes 2 and 2 which sandwich the semiconductor module 1. One set of these pinching plate 6, coolant tube 2, semiconductor module 1, coolant tube 2, and pinching plate 6 are pressed by the leaf spring member 9. The pinching plate 6 may also function as a heat sink. The leaf spring member 9 has an U-shaped form made of a spring rigid plate. This plate spring member 9 sandwiches the above-explained set between both edge portions of this plate spring member 9 under certain pressure. It should also be noted that while the pinching plate 6 is omitted, one pair of coolant tubes 2 and 2, the semiconductor module 1, and the coolant tube 2 may be directly sandwich-pressured by this leaf spring member 6.

The smoothing capacitor 5 owns a compressed shape, and a flat outer surface of this smoothing capacitor 5 is closely contacted to a rear main surface of the header 44.

Each of the semiconductor modules 1 constitutes each of semiconductor switching elements of the 3-phase inverter circuit. Each of these semiconductor switching elements is arranged in such a manner that one flywheel diode is cross-coupled to one IGBT element. One of the paired semiconductor modules 1 and 1 constitutes a high-sided semiconductor module of a single-phase inverter circuit, whereas the other module of the paired semiconductor modules 1 and 1 constitutes a low-sided semiconductor module of the same single-phase inverter circuit. As a consequence, 3 pairs of these semiconductor modules 1 and 1 constitute a single-phase inverter circuit for a U-phase, a single-phase inverter circuit for a V-phase, and a single-phase inverter circuit for a W-phase, respectively. The smoothing capacitor 5 corresponds to such a smoothing capacitor which is connected between a positive DC power supply and a negative DC power supply of the above-explained 3-phase inverter circuit. This smoothing capacitor 5 is employed so as to suppress switching noise.

The coolants having the same flow rates and the same temperatures are supplied through the inlet header 43 to the respective coolant tubes 2. Furthermore, since these coolant tubes are sandwich-pressured by a common sandwich-pressuring member, sandwich-pressure force per unit area, which is applied between each of the semiconductor modules 1 and the coolant tube 2 is made substantially equal to each other, and also the sandwich-pressure areas are made equal to each other. As a result, the sandwich-pressure force of the coolant tubes 2 with respect to the semiconductor modules 1 is made substantially equal to each other. As a result, the cooling capabilities of the respective semiconductor modules 1 can be made substantially equal to each other.

Fourth Embodiment

Figure 9:
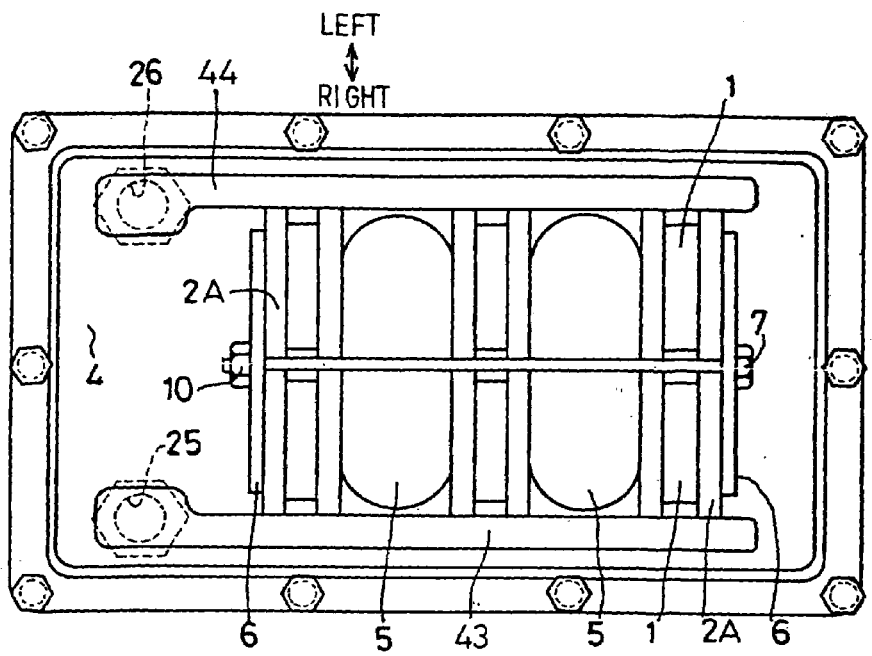
FIG. 9 is a plan view for indicating this semiconductor device whose lid is taken out.
Figure 10:
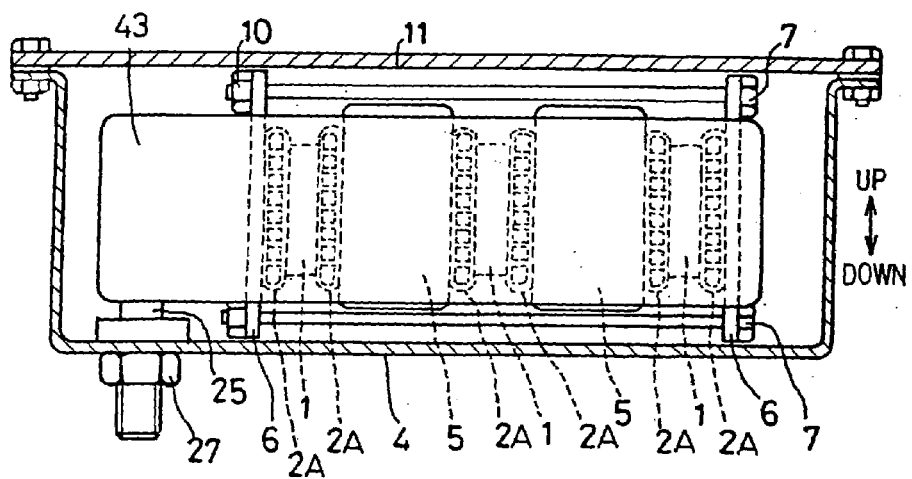
FIG. 10 is a cross-sectional view for representing this semiconductor device of FIG. 9.

FIG. 9 and FIG. 10 show a coolant cooled type semiconductor device.

(Structure of Semiconductor Device)

FIG. 9 is a plan view for indicating this semiconductor device whose lid is taken out. FIG. 10 is a cross-sectional view for representing this semiconductor device of FIG. 9.

In the drawings, reference numeral 7 indicates a through bolt, reference numeral 10 represents a nut.

Different features between the semiconductor device in the third embodiment and the semiconductor device in the fourth embodiment will be mainly explained below.

Six pairs of compressed coolant tubes 2A are separately provided with a interval along a thickness direction thereof. Among each pair of these coolant tubes 2A and 2A, one pair of semiconductor modules 1 and 1 are sandwiched along a vertical direction of FIG. 9.

As previously explained in FIG. 7, both surfaces of each phase of the semiconductor modules 1 and 1 are sandwiched by the coolant tubes 2A and 2A, while the smoothing capacitors 5 having the compressed cylindrical shapes are also sandwiched between the coolant tubes 2A and 2A as shown in FIG. 9. In other words, Five spaces are disposed among the coolant tubes 2A, one pair of the semiconductor modules and the smoothing capacitor 5 is disposed alternately in each space. Moreover, the pinching plates 6 abut against the coolant tubes 2A and 2A provided on the right and left outermost sides. The through bolts 7 pass through both the upper end portions and the lower end portions of both the pinching plates 6 and 6 along the stacking direction, and are fastened by the nuts 10.

The fastening force of the nut 10 is adjusted in such a manner that the sandwich-pressure force applied to the semiconductor module 1 exerted by the coolant tubes 2A and 2A becomes a predetermined value. In other words, such a sandwich-pressuring member constituted by the pinching plate 6, the through bolt 7, and the nut 10 may have a function capable of setting the sandwich-pressure force applied to the semiconductor module 1 exerted by the coolant tubes 2A and 2A, and also another function as a structural member capable of assembling/supporting the 3-phase inverter circuit apparatus.

Therefore, since these coolant tubes are sandwich-pressured by a common sandwich-pressuring member, sandwich-pressure force per unit area, which is applied between each of the semiconductor modules 1 and the coolant tube 2 is made substantially equal to each other, and also the sandwich-pressure areas are made equal to each other as described above-mentioned embodiment.

(Modification)

Even when the above-explained semiconductor module 1 of the embodiment is replaced by a semiconductor chip, a similar operation effect may be achieved.

Fifth Embodiment

Figure 11:
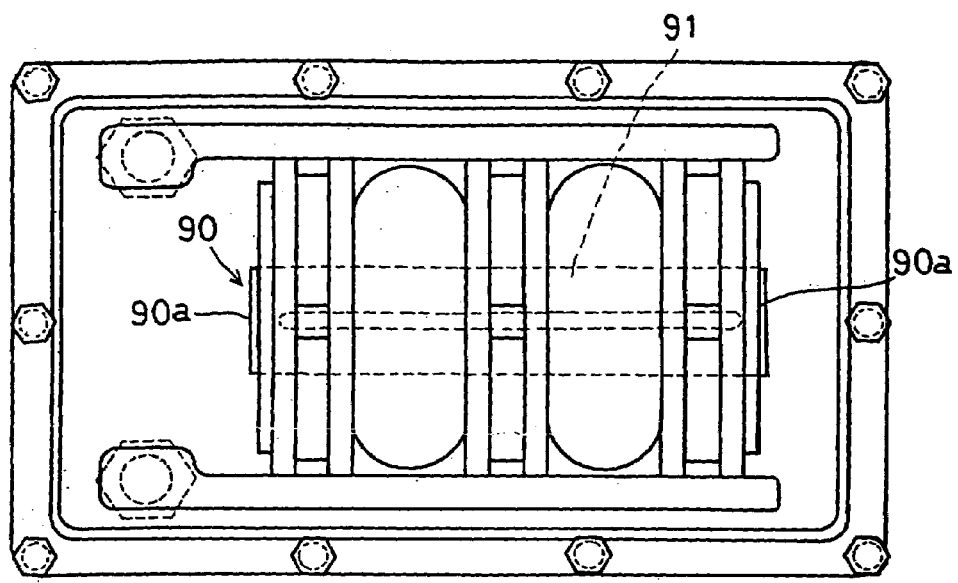
FIG. 11 is a plan view for indicating this semiconductor device, from which a lid thereof is taken out.
Figure 12:
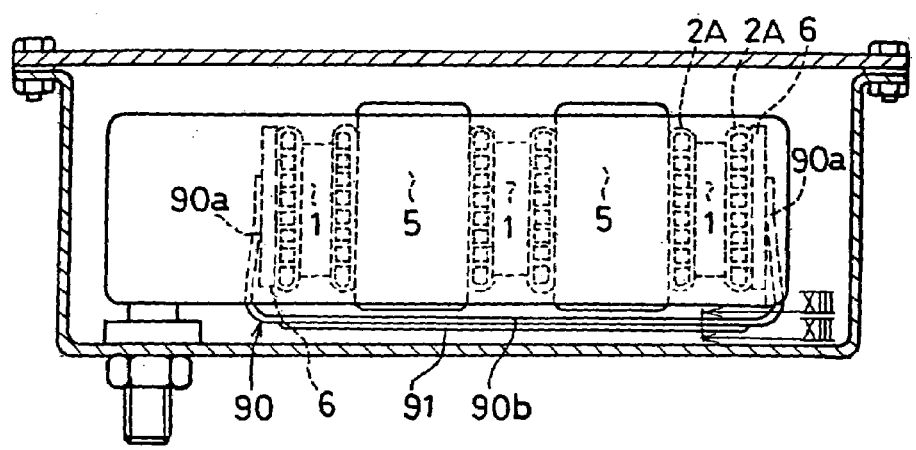
FIG. 12 is a cross-sectional view for representing this semiconductor device of FIG. 11.

FIG. 11 and FIG. 12 show a coolant cooled type semiconductor device.

(Structure of Semiconductor Device)

FIG. 11 is a plan view for indicating this semiconductor device, from which a lid thereof is taken out, and FIG. 12 is a cross-sectional view for representing this semiconductor device of FIG. 11.

In this semiconductor device of this embodiment, while a set of the semiconductor module 1, the coolant tube 2A, the smoothing capacitor 5, and the pinching plate 6 are made in the same array as that of the fourth embodiment, this component set is sandwiched by a large-sized leaf spring member 90 in a batch mode.

Figure 13:
FIG. 13 shows a large-sized spring member, as shown in FIG. 12, having a groove portion formed therein.

This large-sized leaf spring member 90 is made by enlarging the leaf spring member 9 as explained in the third embodiment. The large-sized leaf spring member 90 is constituted by one piece of center leaf portion 90b, and one pair of plate-shaped both edge portions 90a and 90a. The center leaf portion 90b is arranged at an attitude parallel to the bottom portion of the case 4. One pair of both edge portions 90a and 90a are elongated from the respective both edge portions of this center leaf portion 90b at a right angle, respectively, and also are located opposite to each other. Reference numeral 91 shows a groove portion which is formed in the center leaf portion 90b of the large-sized spring member 90 as shown in FIG. 13.

In accordance with this embodiment, the respective members can be assembled in a simpler manner, and the pinching force having a small fluctuation can be applied to the respective members.

Moreover, since one piece of the pinching structure (large-sized spring member 90) can apply the pinching force equal to each coolant tube 2A, semiconductor module (semiconductor chips), and smoothing capacitor 5, such a large current control semiconductor device having a compact and simple pinching construction can be realized.

(Modifications of Detail Construction of Cooling System)

Figure 14:
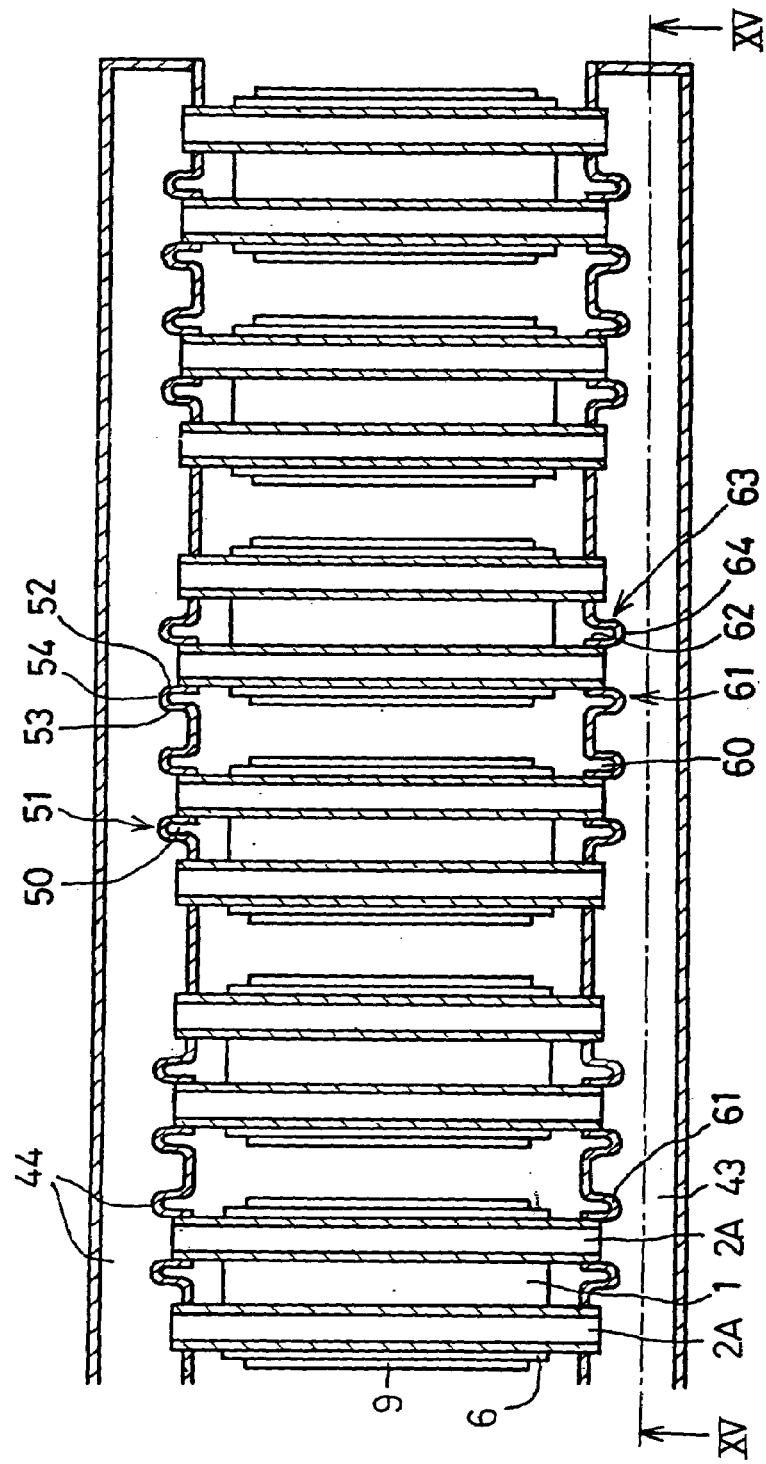
FIG. 14 is a transversal sectional view of a main portion of the semiconductor device of FIG. 7.
Figure 15:
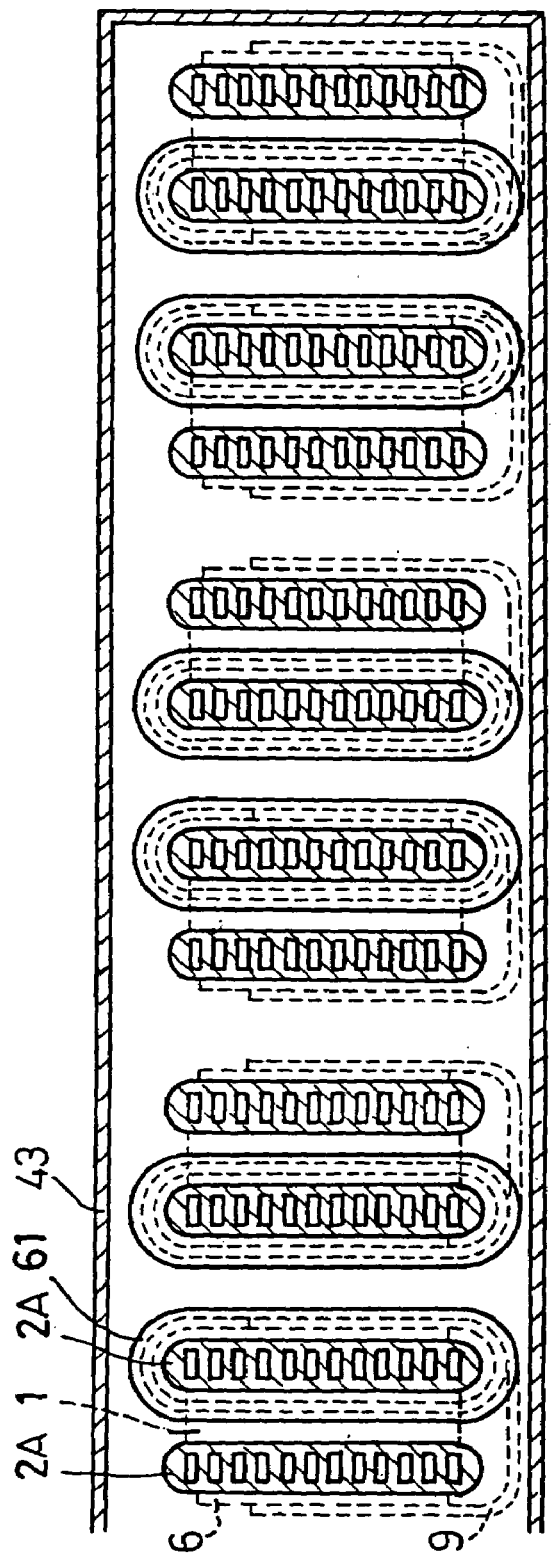
FIG. 15 is a cross-sectional view taken along an arrow XV-XV of FIG. 14.

A connecting structure of the headers 43, 44 and the flat cooling tube 2A shown in FIG. 7, for example, will next be explained with reference to FIGS. 14 and 15. FIG. 14 shows a transversal sectional view of a main portion of the semiconductor device of FIG. 7. FIG. 15 shows a cross-sectional view taken along an arrow XV-XV of FIG. 14.

The headers 43, 44 respectively have opening portions 50, 60 fitting the flat cooling tube 2 thereinto in connecting positions of the flat cooling tube 2. The opening portions 50, 60 are surrounded by concave portions 51, 61 having a ring shape. These ring-shaped concave portions 51, 61 are respectively constructed by inside sleeve wall portions 52, 62 joined to end portions of the flat cooling tube 2A, outside sleeve wall portions 53, 63, and ring-shaped bottom wall portions 54, 64 connecting the inside sleeve wall portions 52, 62 and the outside sleeve wall portions 53, 63.

The outside sleeve wall portions 53, 63 face the inside sleeve wall portions 52, 62 at predetermined intervals, and surround the inside sleeve wall portions 52, 62 on outer sides. In FIG. 14, the concave portions 51, 61 are formed in a U-shape biting into sides of the headers 5, 6. End portions of the flat cooling tube 2 are fitted into these opening portions 50, 60, and are soldered to inner circumferential faces of the inside sleeve wall portions 52, 62.

Incidentally, the opening portions 50, 60 and concave portions 51, 61 constitute connecting tube portions. Similar members of the headers 43 and 44 described in any following embodiments also constitute the connecting tube portions.

In accordance with this embodiment, the concave portions 51, 61 of the headers 43, 44 can be easily elastically deformed in the thickness direction (also called an X-direction) of the semiconductor module 1 in comparison with the flat cooling tube 2A. Therefore, when positions of the flat cooling tube 2A and the semiconductor module 1 are shifted in the above X-direction in assembly, this position shift can be absorbed by the elastic deformation.

In accordance with the coolant cooled type semiconductor device of the above embodiment, the following effects can be obtained.

A cooling fluid (coolant) at low temperature is uniformly distributed to each semiconductor module 1, and dispersion of cooling effects can be reduced. Each semiconductor module 1 can radiate heat to the flat cooling tubes 2A on both sides so that the cooling effects are excellent.

A pair of flat cooling tubes 2A and the semiconductor module 1 are nipped and pressed by the U-shaped leaf spring member 9 as a pinching member. Accordingly, the semiconductor module 1 can come in close contact with the flat cooling tubes 2A by a simple structure using uniform force in each portion so that contact heat resistance can be reduced.

The ring-shaped concave portions 51, 61 constituting flat cooling tube connecting portions of the headers 43, 44 surround the flat cooling tubes 2A. In addition, plate thickness of these ring-shaped concave portions 51, 61 are set to be equal to or smaller than an average thickness of the flat cooling tubes 2A in the X-direction so that rigidity of the ring-shaped concave portions 51, 61 in the X-direction is set to be smaller than that of the flat cooling tubes 2A. Accordingly, when a space width between the pair of flat cooling tubes 2A is smaller than a thickness of the semiconductor module 1, and positions of the flat cooling tubes 2A and the semiconductor modules 1 are misarranged, this error in size can be preferably absorbed without curving the flat cooling tubes 2A in a bow shape. As a result, the flat cooling tube 2A can preferably come in contact with the above metallic heat radiating plate of the semiconductor module 2A without irregularities on each portion of main faces of the flat cooling tube coming in contact with the semiconductor module.

(Modified Mode)

In the above embodiment, the flat cooling tube 2A can be displaced by the ring-shaped concave portions 51, 61 in the X-direction. However, a thin sleeve portion may be projected from each of the headers 43, 44 to an end portion of the flat cooling tube 2A, and the flat cooling tube 2A may be also joined to this sleeve portion.

In this case, this sleeve portion can be easily elastically deformed in the X-direction with main portions of the headers 43, 44 as starting points. Therefore, while the deformation of the flat cooling tube 2A itself is restrained, the flat cooling tube 2A is displaced in the X-direction, and the flat cooling tube 2A and the semiconductor module 1 can preferably come in close contact with each other.

When a thin connecting tube portion formed separately from the flat cooling tube 2A and the headers 43, 44 is interposed between the flat cooling tube 2A and the headers 43, 44, similar to the above case, this connecting tube portion can be preferentially elastically deformed so that similar effects can be obtained. Further, portions of the headers 43, 44 connected to the flat cooling tube 2A may be also plastically deformed instead of the elastic deformation. However, the elastic deformation is advantageous since no hindrance is caused in repetitious exchange of the semiconductor module 1, etc. Furthermore, there are also effects in that force of this elastic deformation can be utilized as one portion or all portions of force for pressing and biasing the flat cooling tube 2A against the semiconductor module 1.

Sixth Embodiment

Figure 16:
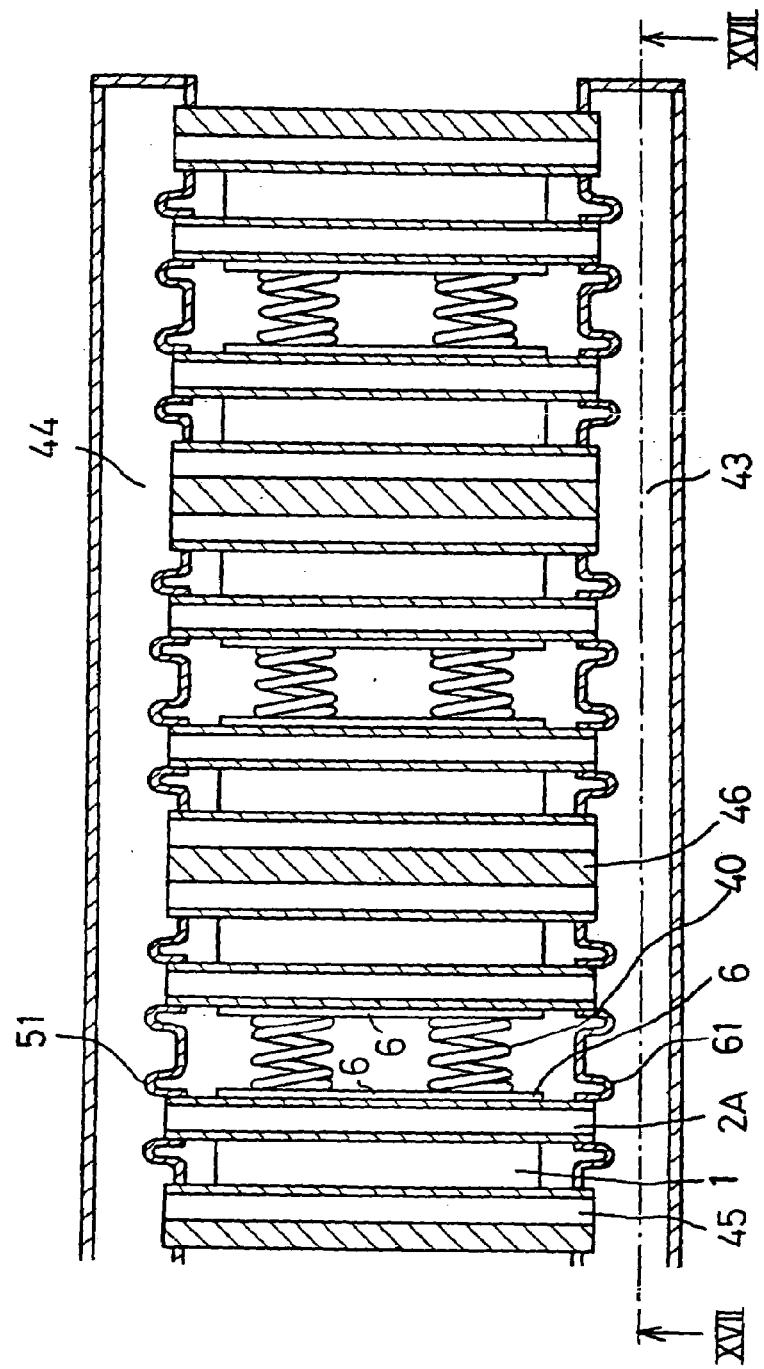
FIG. 16 is a transversal sectional view showing a main portion of a coolant cooled type semiconductor device of the third embodiment.
Figure 17:
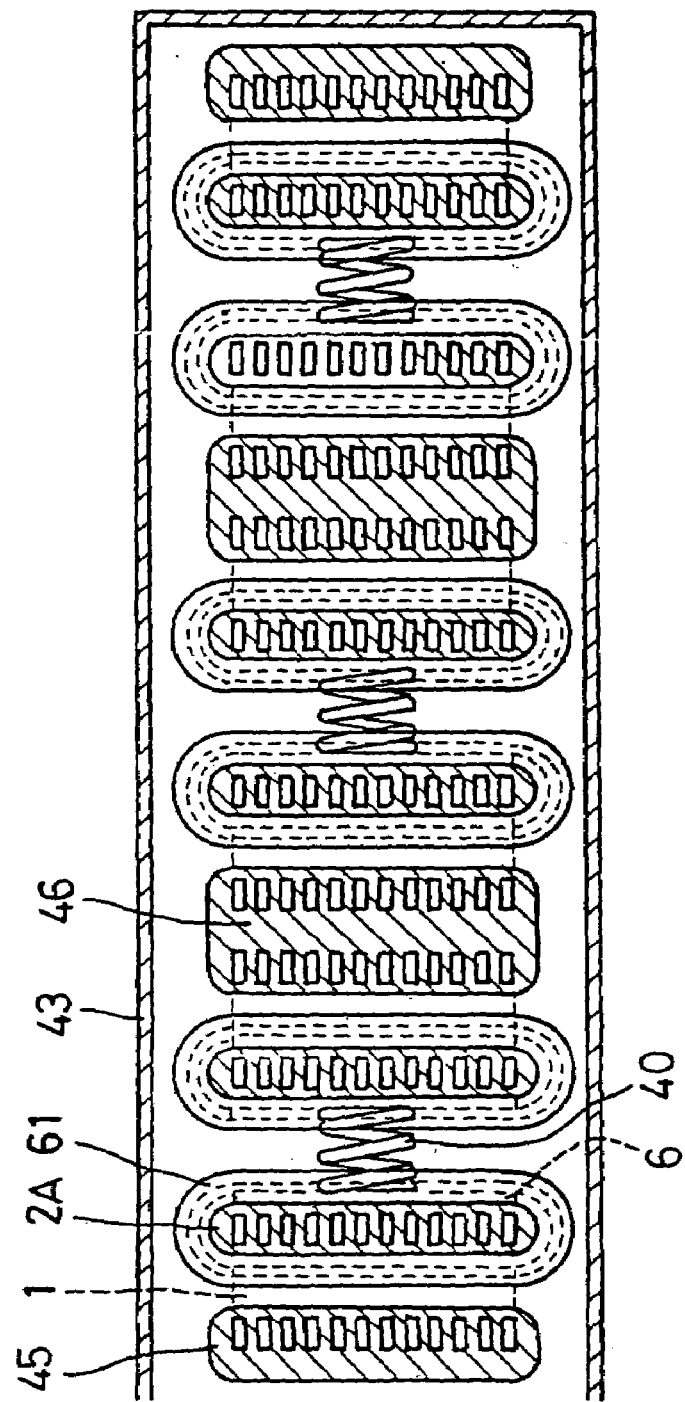
FIG. 17 is a cross-sectional view taken along an arrow XVII-XVII of FIG. 16.

A coolant cooled type semiconductor device in another embodiment will be explained with reference to FIGS. 16 and 17. In this embodiment, the flat cooling tube 2A on an outermost side in the X-direction among the flat cooling tubes 2A in FIGS. 14 and 15 is replaced with a first high rigid flat cooling tube 45, and an (N+2)-th flat cooling tube 2A (N is an integer equal to or greater than one) from the first high rigid flat cooling tube 45 is changed to a second high rigid flat cooling tube 46. The first and second high rigid flat cooling tubes 45, 46 are fixed to the headers 43, 44 without the ring-shaped concave portions 51, 61 shown in FIGS. 14 and 15.

In this embodiment, a coil spring 40 is interposed instead of the U-shaped leaf spring member 9 shown in FIGS. 14 and 15 between a pair of flat cooling tubes 2A, 2A facing each other.

The central second flat cooling tube 46 in the X-direction cools semiconductor modules 1 on both sides in the X-direction. Therefore, the second high rigid flat cooling tube 46 has a flow path section larger than that of each of the other flat cooling tubes 2A, 45.

The first and second flat cooling tubes 45, 46 are set to be thick and have very high rigidity so that no first and second flat cooling tubes 45, 46 are easily displaced in the X-direction in comparison with the flat cooling tube 2A. As a result, if a bus bar is wired with these first and second flat cooling tubes 45, 46 as references in connection of the bus bar to the semiconductor module 1, dispersion of a connecting position of the bus bar and the semiconductor module 1 is reduced, and a connecting work of a joining portion can be easily made.

(Modified Mode)

Figure 18:
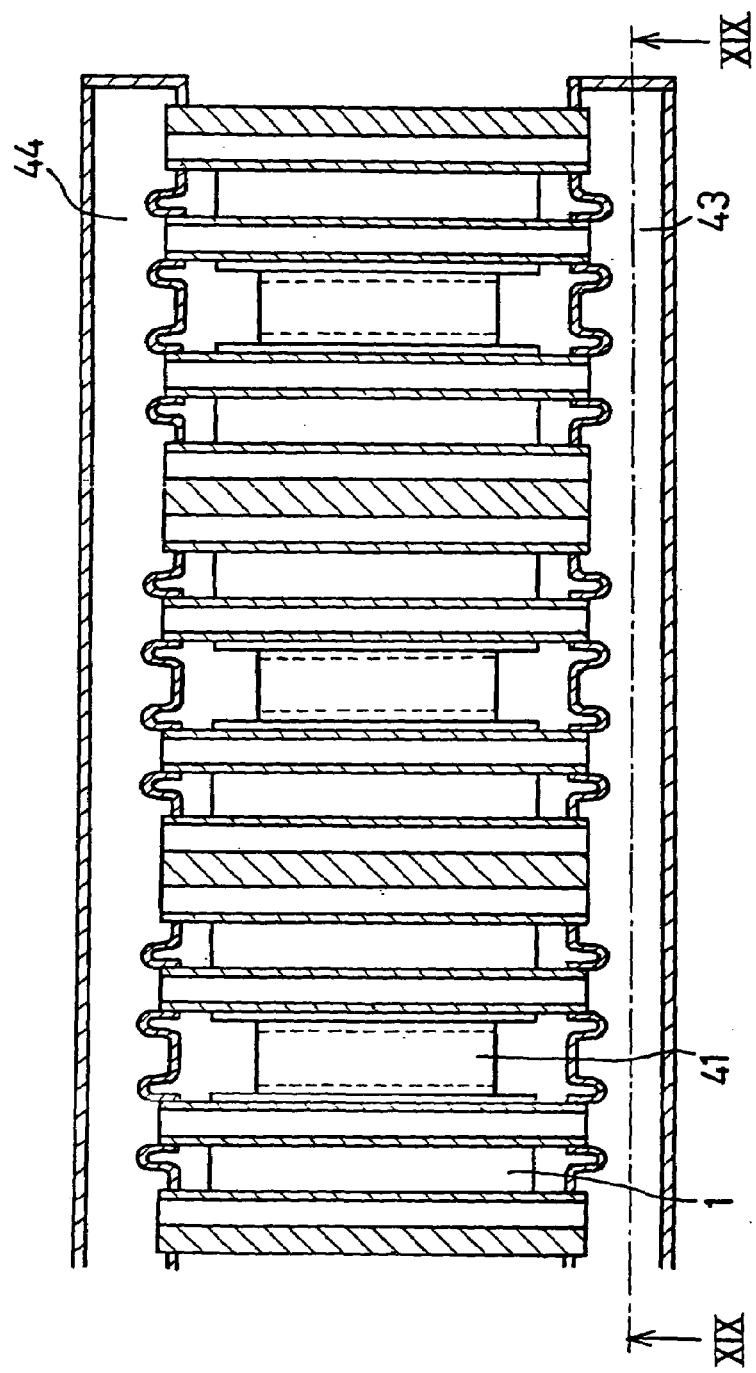
FIG. 18 is a transversal sectional view of a main portion showing a modified mode of a sixth embodiment.
Figure 19:
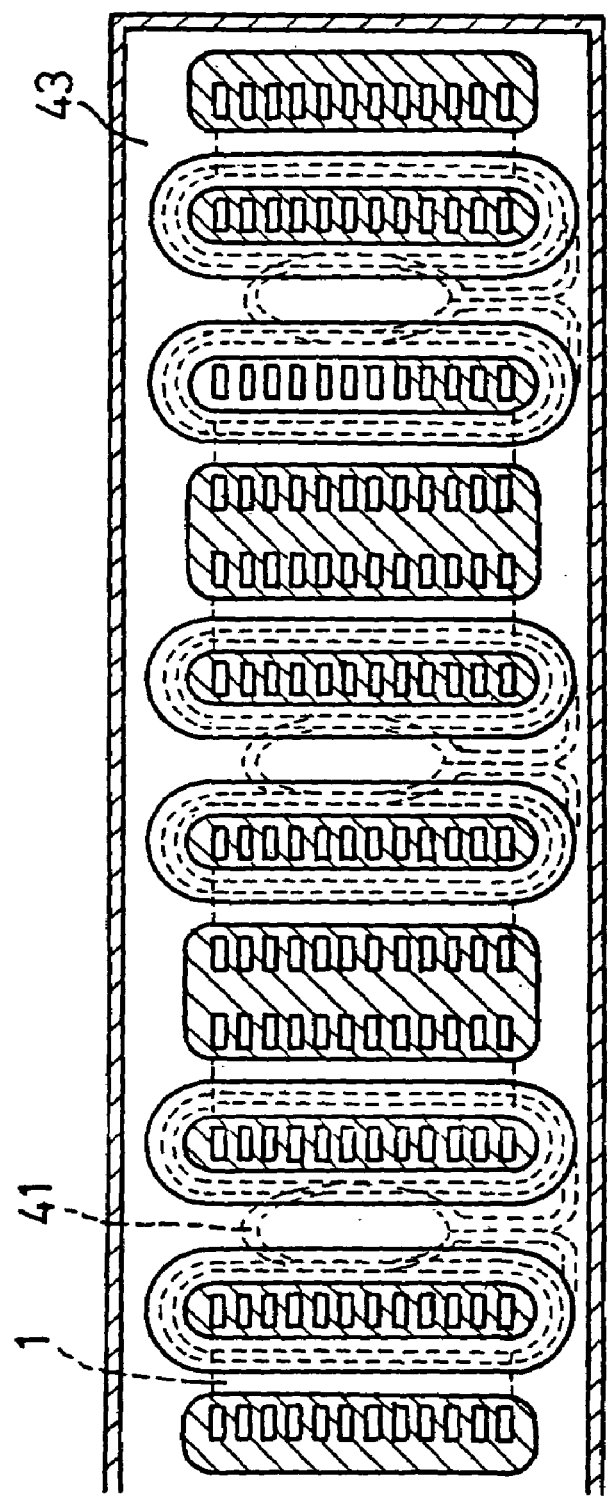
FIG. 19 is a cross-sectional view taken along an arrow XIX-XIX of FIG. 18.

A modified example of the semiconductor device of this embodiment will be explained with reference to FIGS. 18 and 19. In this embodiment, the coil spring 40 of the above embodiment shown in FIGS. 16 and 17 is changed to a leaf spring 41. In accordance with this construction, an insertion work of the leaf spring 41 is easily made in comparison with the coil spring 40 so that an assembly process can be simplified. Further, since the leaf spring 41 can face the flat cooling tube 2A over a wide area in comparison with the coil spring 40, the leaf spring 41 can further uniformly bias each portion of the flat cooling tube 2A through the pinching plate 6.

Seventh Embodiment

A coolant cooled type semiconductor device of another embodiment will be explained with reference to FIGS. 20 to 22. In this embodiment, a cap 47 is attached to each of end faces of the flat cooling tube 2A, and each of end faces is covered with the cap 47. Instead of this, a pair of header communication opening portions 48, 48 opened into headers 43, 44 in a cooling fluid circulating direction (in the X-direction) is formed in the flat cooling tube 2A.

The headers 43, 44 respectively have elastic sleeve portions 500, 600. The elastic sleeve portions 500, 600 are located between a pair of flat cooling tubes 2A, 2A nipping the semiconductor module 1, and have a bellows shape in both end openings each surrounding the header communication opening portion 48 and soldered to the flat cooling tube 2A. The headers 43, 44 also respectively have rigid sleeve portions 501, 601. The rigid sleeve portions 501, 601 are located between a pair of flat cooling tubes 2A, 2A adjacent to each other on a non-existing side of the semiconductor module 1, and have a straight tube shape in both end openings each surrounding the header communication opening portion 48 and soldered to the flat cooling tube 2A. Each of the elastic sleeve portions 500, 600 has a through hole communicated with the header communication opening portion 48 and a circumferential wall portion surrounding the through hole. This circumferential wall portion is constructed by a short metallic sleeve formed in a bellows shape, etc. Accordingly, both end portions of the flat cooling tube 2A, the elastic sleeve portions 500, 600 and the rigid sleeve portions 501, 601 are integrated with each other by soldering and the like so as to constitute the headers.

In accordance with this embodiment, since the elastic sleeve portions 500, 600 are formed in the bellows shape easily elastically deformed, the elastic sleeve portions 500, 600 can be extended and contracted by nipping pressure of the U-shaped leaf spring member 9 in accordance with the thickness of the semiconductor module 1. Thus, the semiconductor module 1 and the flat cooling tube 2A can preferably come in contact with each other without curving and deforming the flat cooling tube 2A. Further, a clearance for inserting the semiconductor module between the flat cooling tubes 2A, 2A prior to the insertion of the semiconductor module 1 can be set to be large so that an insertion work of the semiconductor module 1 can be easily made. FIG. 22 is a side view of the flat cooling tube 2A seen from the X-direction.

Eighth Embodiment

Figure 24:
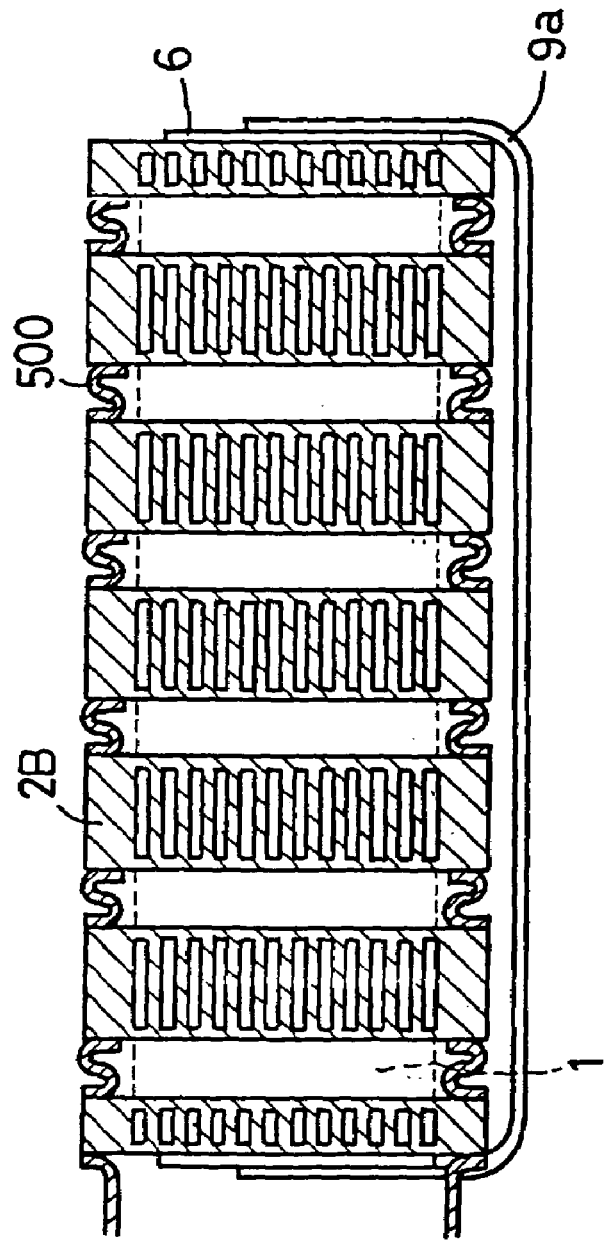
FIG. 24 is a longitudinal sectional view of the main portion of FIG. 23.
Figure 25:
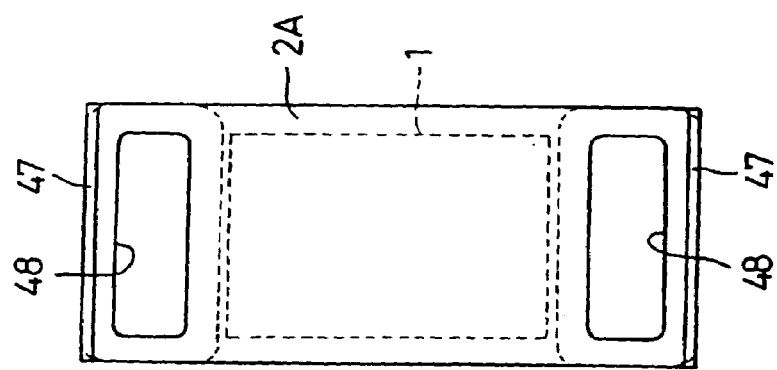
FIG. 25 is a side view of a flat cooling tube of FIG. 23.

A coolant cooled type semiconductor device in another embodiment will be explained with reference to FIGS. 23 to 25. In this embodiment, in the semiconductor device of the above embodiment shown in FIGS. 20 to 22, the rigid sleeve portions 501, 601 are omitted, and a central flat cooling tube 2B except for flat cooling tubes 2A in both end portions in the X-direction comes in contact with each of semiconductor modules 1, 1 on both sides in the X-direction. An entire set of the semiconductor module and the flat cooling tube is nipped and pressed by a single U-shaped leaf spring member 9a in the X-direction.

In accordance with this embodiment, the rigid sleeve portions 501, 601 of the above embodiment can be omitted, and the semiconductor device can be made compact and the number of assembly works can be reduced in comparison with the above embodiment. However, in this embodiment, it is preferable to uniformly cool each semiconductor module 1 by increasing a cooling fluid flow path section of the central flat cooling tube 2A for cooling the semiconductor modules 1 on both sides.

Ninth Embodiment

Figure 26:
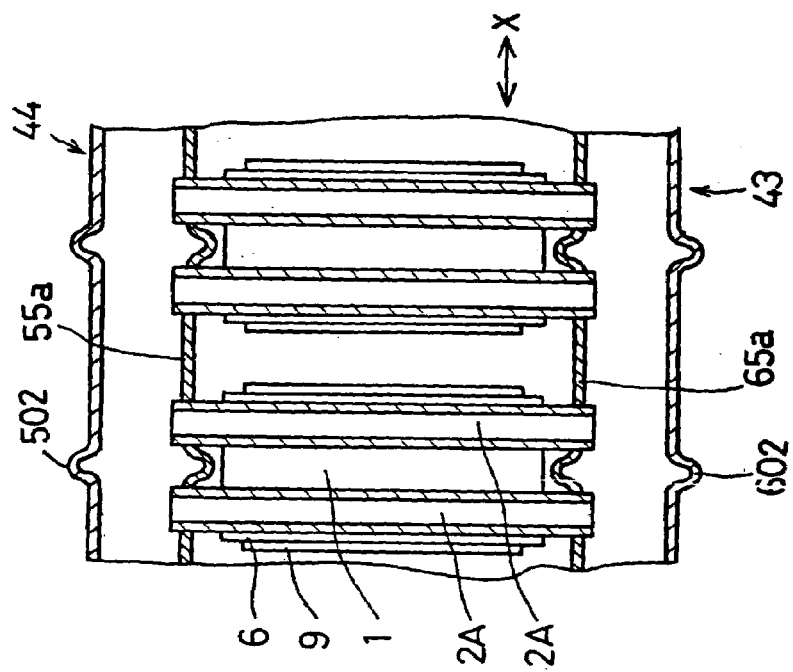
FIG. 26 is a transversal sectional view showing a main portion of a coolant cooled type semiconductor device of a ninth embodiment.

A coolant cooled type semiconductor device in another embodiment will be explained with reference to FIG. 26. This embodiment is characterized in that the headers 43, 44 respectively have flange-shaped sleeve portions 502, 602 having a large diameter and adjacent to the semiconductor module 1.

This flange-shaped sleeve portion 501 can easily elastically deformed in the X-direction so that the flat cooling tube 2A can be displaced on each of both sides of the semiconductor module 1. When ring-shaped concave portions are arranged instead of the flange-shaped sleeve portions 502, 602 around the headers 43, 44, similar effects can be obtained, but a problem of an increase in fluid resistance within the headers 43, 44 is caused.

In this embodiment, portions of the headers 43, 44 between the flat cooling tubes 2A, 2A adjacent to each other without nipping and supporting the semiconductor module 1 are set to rigid sleeve portions 55a, 65a having a straight tube shape. However, the flat cooling tube 2A can be easily elastically or plastically deformed in the X-direction by setting these header portions to flange-shaped sleeve portions, ring-shaped concave portions or bellows portions.

Tenth Embodiment

A coolant cooled type semiconductor device in another embodiment will be explained with reference to FIGS. 27 and 28.

This embodiment is characterized in that a flat cooling tube 2C on one side of the semiconductor module 1 is set to be thick and have high rigidity in a thickness direction of the semiconductor module in the semiconductor device, and a flat cooling tube 2D on the other side of the semiconductor module 1 is set to be thin and have low rigidity (easily deformed) in the thickness direction of the semiconductor module, and the ring-shaped concave portions 51, 61 of the headers 43, 44 are omitted.

The above difference in rigidity may be also obtained by changes in materials and shapes instead of the construction in which the flat cooling tube 2D is thinly formed in comparison with the flat cooling tube 2C.

Figure 27:
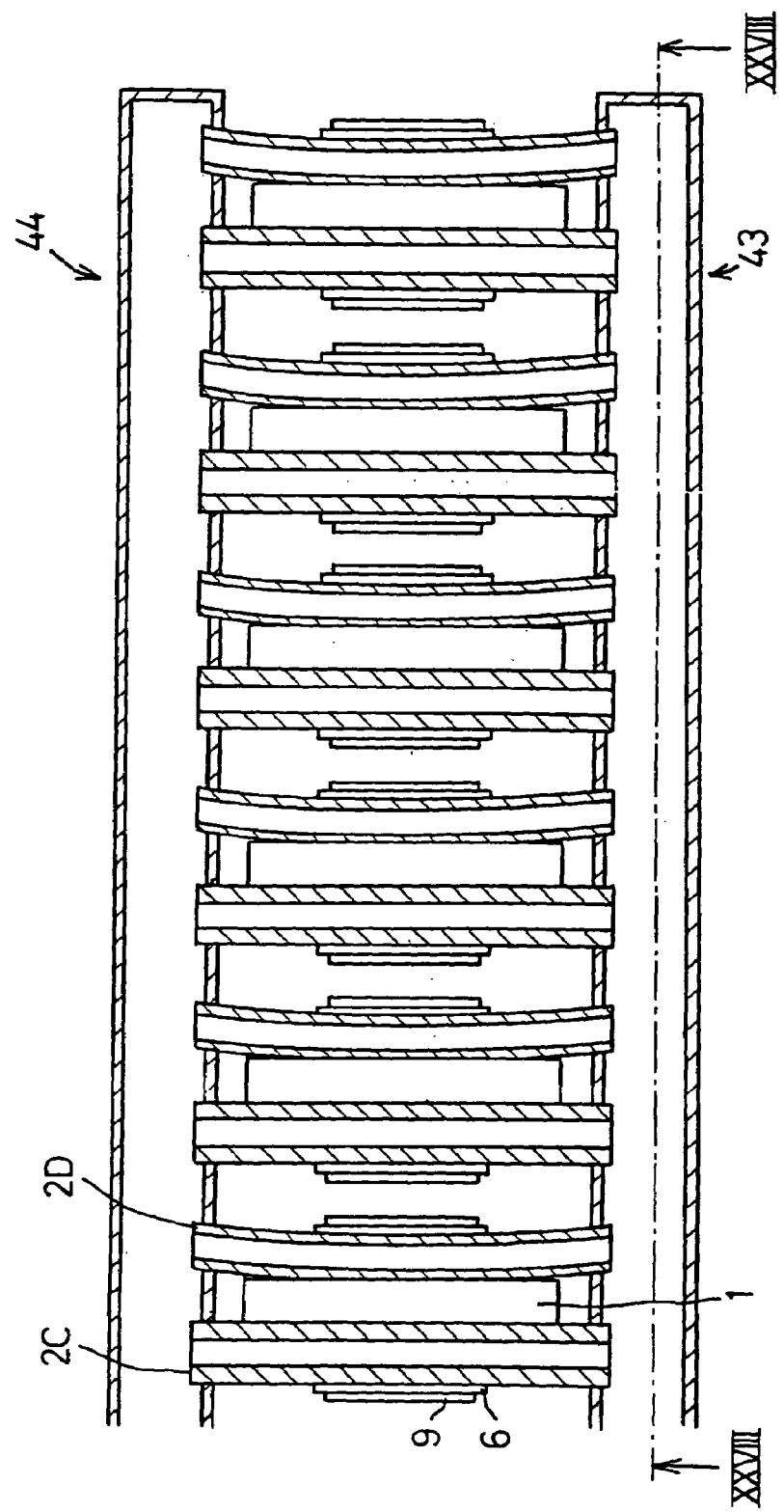
FIG. 27 is a transversal sectional view showing a main portion of a coolant cooled type semiconductor device of a tenth embodiment.
Figure 28:
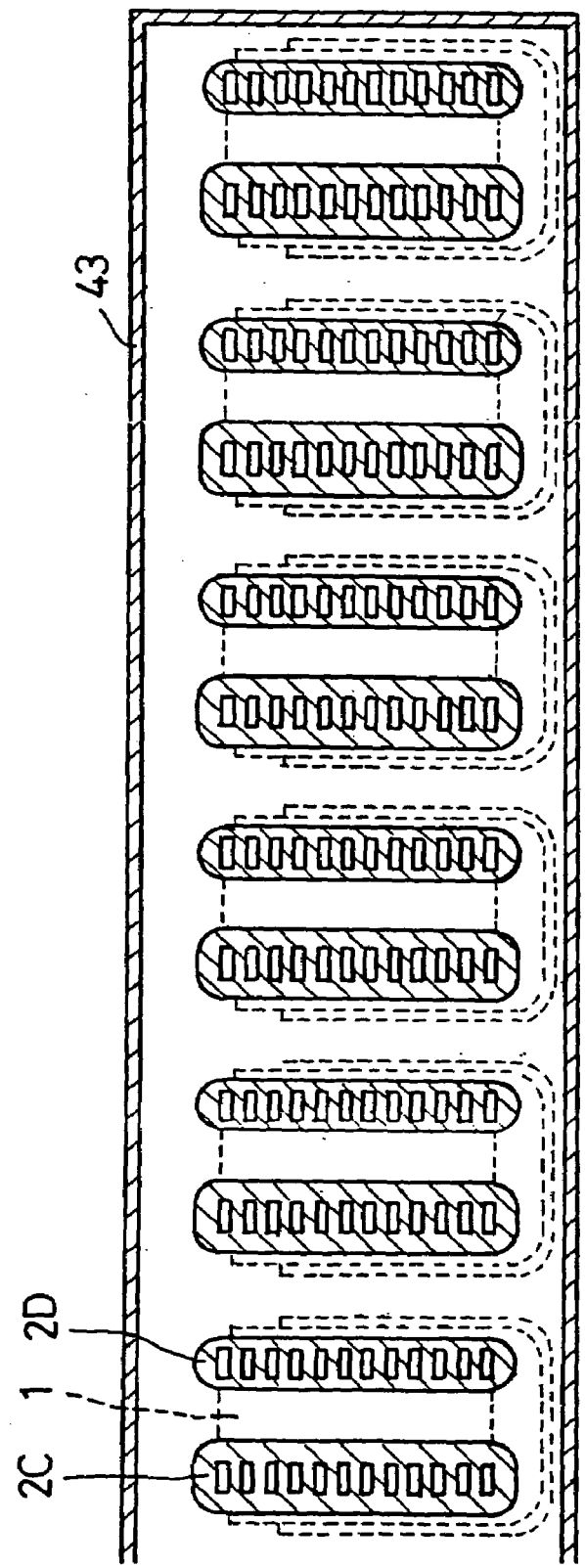
FIG. 28 is a cross-section view taken along an arrow XXVIII-XXVIII of FIG. 27.

In accordance with such a construction, when the flat cooling tube 2A is nipped and pressed by the U-shaped leaf spring 9, the flat cooling tube 2A on the low rigid side is curved in a bow shape on a side of the semiconductor module 1 and comes in close contact with the semiconductor module 1 as shown in FIG. 27 so that the following effects can be obtained.

The semiconductor module 1 can preferably come in face contact with the flat cooling tube 2C on one side even when an error in size is caused. Accordingly, cooling can be secured.

The position of the semiconductor module 1 in the X-direction can be positioned with respect to the high rigid flat cooling tube 2C.

At least a central portion of the other flat cooling tube 2c curved in a bow shape can also come in close contact with the semiconductor module 1 by bow-shaped curvature of this flat cooling tube 2c. Accordingly, great heat radiating performance can be secured in comparison with a case in which there is no such curvature.

It is not necessary to form an elastic deforming structure in the headers 43, 44 or connecting portions of the headers 43, 44 and the flat cooling tubes 2C, 2D so that the structure becomes simple.

The flat cooling tube 2D of low rigidity may be curved by the U-shaped leaf spring member 9 in the bow shape in the X-direction in an elastic limit range, and may be also curved in a plastic deforming range exceeding the elastic limit.

In this embodiment, connecting tube portions of headers 43 and 44, which connect to the flat cooling tubes 2C and 2D, are rigid in comparison with those constituted by the opening portions 50, 60 and concave portions 51, 61 shown in FIG. 14.

Incidentally, both ends of each flat cooling tube 2D or 2C connecting to both of the header 43 and 44, respectively serve as connecting tube portions to the header 43 and 44.

Eleventh Embodiment

Figure 29:
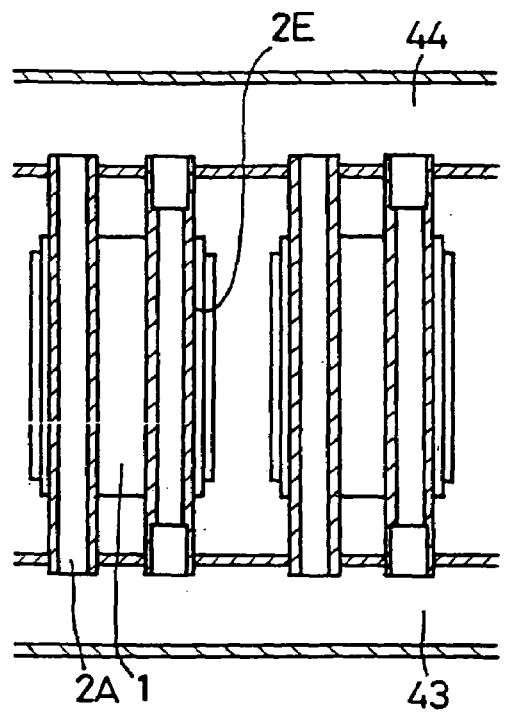
FIG. 29 is a transversal sectional view showing a main portion of a coolant cooled type semiconductor device of a eleventh embodiment.

A coolant cooled type semiconductor device in another embodiment will be explained with reference to FIG. 29.

In this embodiment, one of a pair of flat cooling tubes nipping the semiconductor module 1 is set to have low rigidity by a method different from that in the tenth embodiment. Namely, a flat cooling tube 2E is formed as a low rigid portion by boring in both end portions of the flat cooling tube 2A of the third embodiment, for example. The flat cooling tube 2E is also set to be thin and have no partition wall.

Thus, while deformation of the flat cooling tube 2E is restrained by giving high rigidity to a central portion of the flat cooling tube 2E coming in contact with the semiconductor module 1, both end portions of the flat cooling tube 2E can be set to have low rigidity. Accordingly, the central portion of the flat cooling tube 2E can preferably come in close contact with the semiconductor module 1 by biasing the U-shaped leaf spring member 9.

(Modified Mode)

Figure 32:
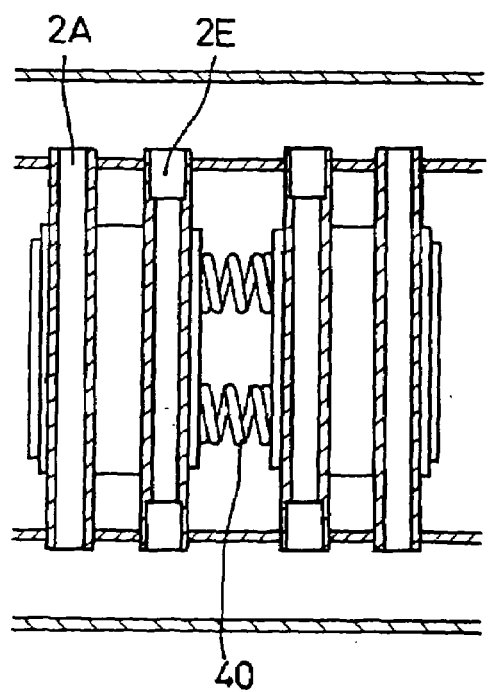
FIG. 32 is a transversal sectional view of a main portion showing a modified mode of the eleventh embodiment.

FIG. 32 shows a modified structure of the cooling unit. This modified mode adopts a structure in which the flat cooling tube 2E is pressed against the semiconductor module 1 by the coil spring 40 already described instead of the U-shaped leaf spring member 9.

Twelfth Embodiment

Figure 30:
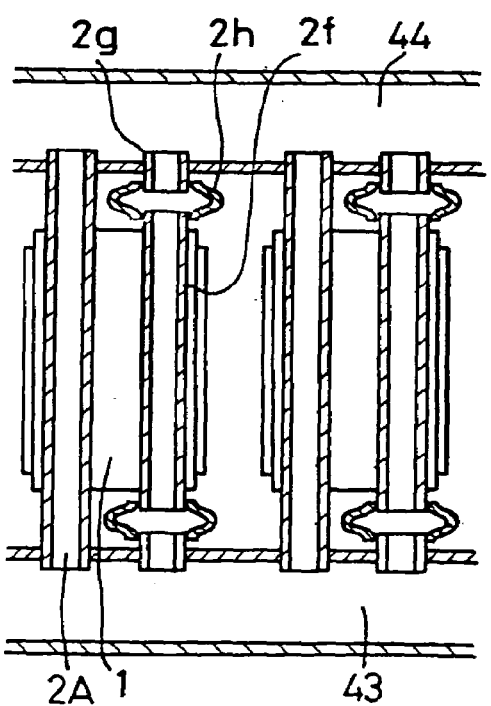
FIG. 30 is a transversal sectional view showing a main portion of a coolant cooled type semiconductor device of a twelfth embodiment.

A coolant cooled type semiconductor device in another embodiment will be explained with reference to FIG. 30.

In this embodiment, the flat cooling tube 2A is set to have low rigidity by a method different from that in the tenth or eleventh embodiments. Namely, a central portion 2f of the flat cooling tube in this embodiment is connected to a tip portion 2g of the flat cooling tube connected to the headers 43, 44 by a thin flange-shaped sleeve portion 2h having a large diameter. A central portion of the flange-shaped sleeve portion 2h is formed such that a diameter of this central portion is larger than that of each of both end portions of the flange-shaped sleeve portion 2h. The same shape as the central portion is formed.

Thus, while deformation of the flat cooling tube is restrained by giving high rigidity to the central portion 2f of the flat cooling tube coming in contact with the semiconductor module 1, the flange-shaped sleeve portion 2h can be set to have low rigidity. Accordingly, the central portion 2f of the flat cooling tube can preferably come in close contact with the semiconductor module 1 by biasing the U-shaped leaf spring member 9.

(Modified Mode)

Figure 33:
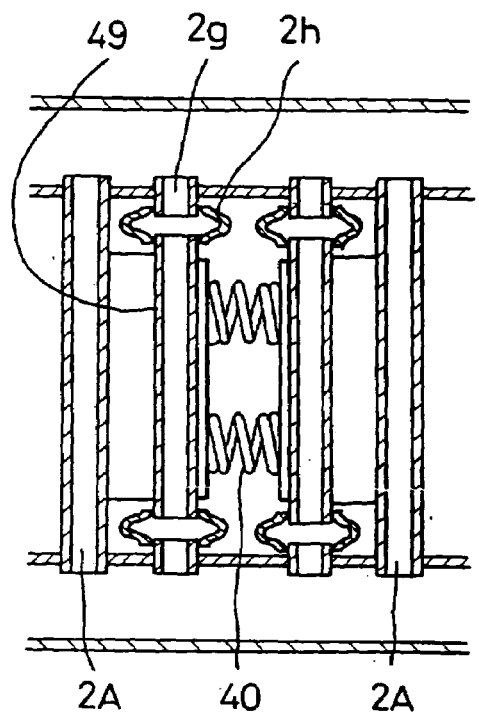
FIG. 33 is a transversal sectional view of a main portion showing a modified mode of the twelfth embodiment.

FIG. 33 shows a modified structure of the cooling unit. In this modified mode, the coil spring 40 described above is used instead of the U-shaped leaf spring member 9.

Thirteenth Embodiment

Figure 31:
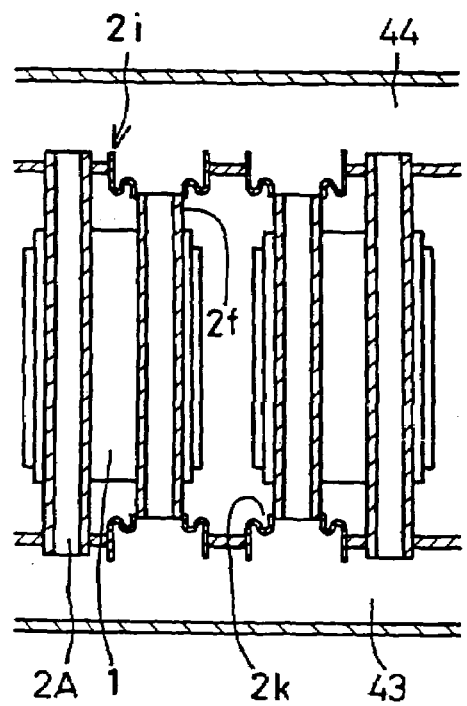
FIG. 31 is a transversal sectional view showing a main portion of a coolant cooled type semiconductor device of a thirteenth embodiment.

A coolant cooled type semiconductor device in another embodiment will be explained with reference to FIG. 31.

In this embodiment, both end portions of the flat cooling tube are set to have low rigidity by a method different from that in the tenth through twelfth embodiments. Namely, each of both end portions of the flat cooling tube in this embodiment has a thin flange-shaped sleeve portion 2i having a large diameter. This flange-shaped sleeve portion 2i has a ring-shaped concave portion 2k surrounding a thick central portion 2f of the flat cooling tube.

(Modified Mode)

Figure 34:
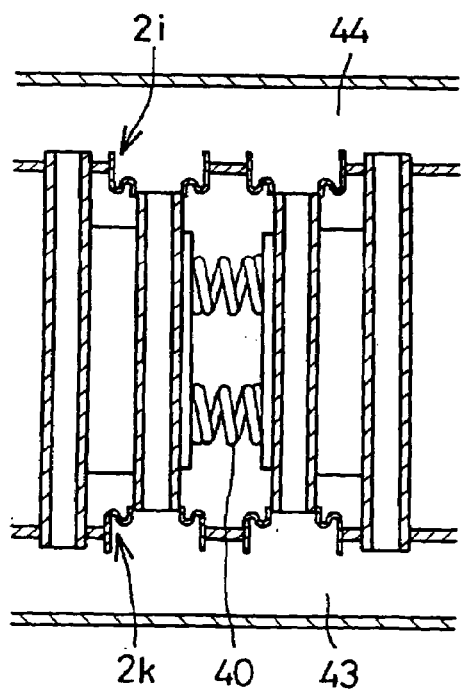
FIG. 34 is a transversal sectional view of a main portion showing a modified mode of the thirteenth embodiment.

FIG. 34 shows a modified mode. In this modified mode, the coil spring 40 already described is used instead of the U-shaped leaf spring member 9.

Fourteenth Embodiment

Figure 35A:
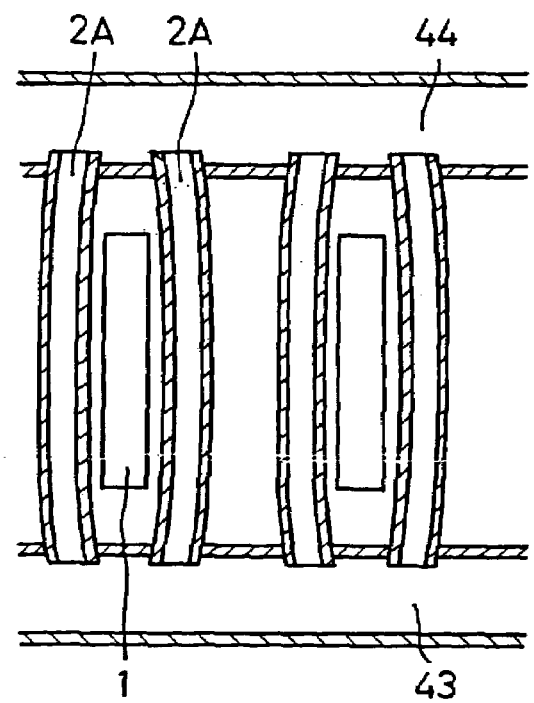
FIG. 35A is a transversal sectional view showing a main portion of a coolant cooled type semiconductor device of a fourteenth embodiment.
Figure 35B:
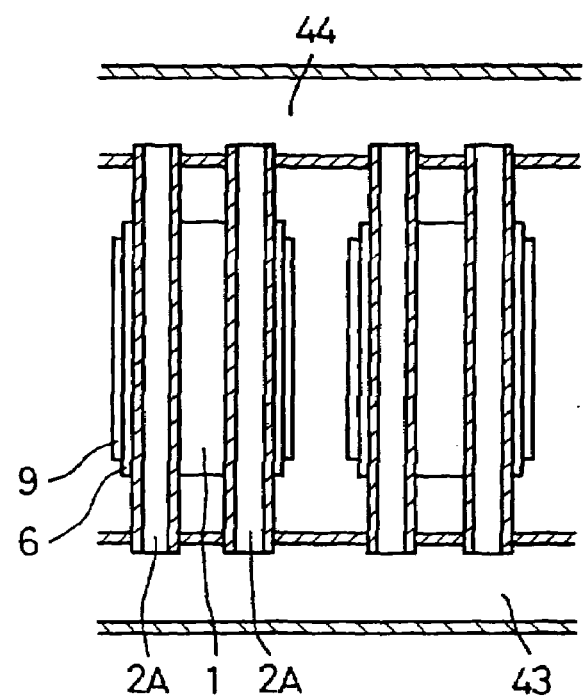
FIG. 35B is a completion view of the coolant cooled type semiconductor device.

A coolant cooled type semiconductor device in another embodiment will be explained with reference to FIGS. 35A and 35B.

In this embodiment, flat cooling tubes 2A, 2A of the semiconductor module 1 are formed in the same shape, and are plastically deformed in a direction away from the semiconductor module 1 previously (FIG. 35A), whereby the width of a space for inserting the semiconductor module 1 thereinto is sufficiently secured. After the semiconductor module 1 is inserted, the flat cooling tubes 2A, 2A are deformed by biasing the U-shaped leaf spring member 9, and come in contact with the semiconductor module 1 by a predetermined pressure (FIG. 35B). Thus, an insertion work of the semiconductor module 1 can be simplified.

The flat cooling tube 45 having low rigidity as described above and the flat cooling tube 2A having high rigidity may be also utilized instead of the flat cooling tubes 2A, 2A.

Fifteenth Embodiment

Figure 36:
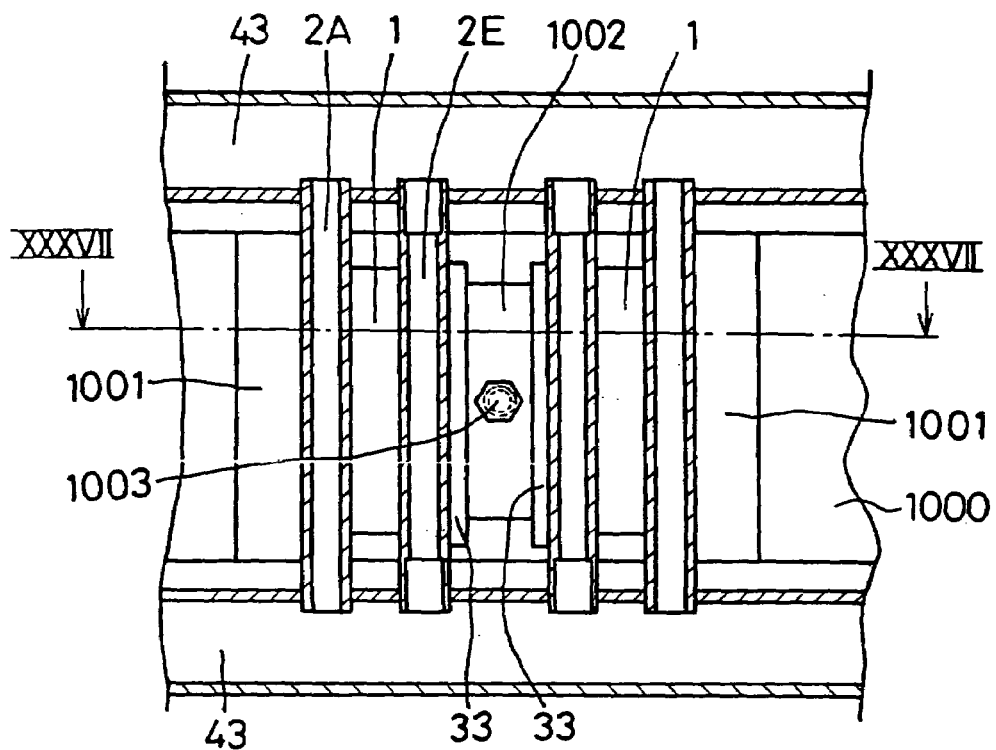
FIG. 36 is a transversal sectional view showing a main portion of a coolant cooled type semiconductor device of a fifteenth embodiment.
Figure 37:
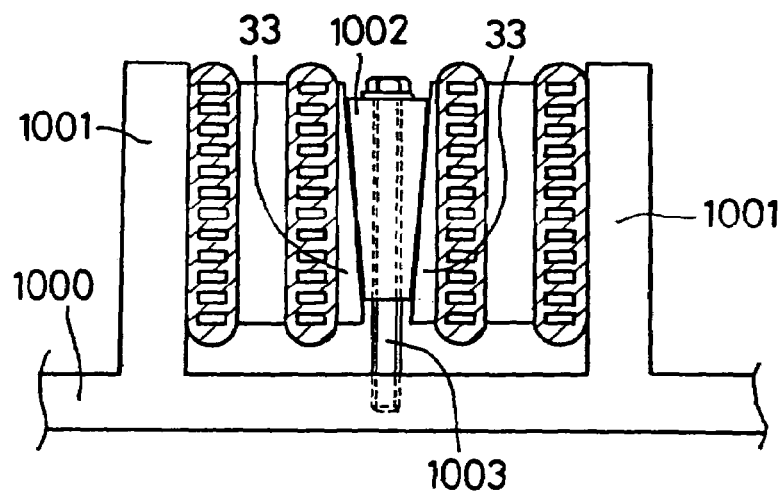
FIG. 37 is a cross-sectional view taken along an arrow XXXVII-XXXVII of FIG. 36.

A coolant cooled type semiconductor device in another embodiment will be explained with reference to FIGS. 36 and 37.

In this embodiment, a base plate 10000 is arranged below the flat cooling tube 2A in an arranging direction (X-direction) of the semiconductor modules. The headers 43, 44 are fixed to this base plate 1000.

A pair of fixing wall portions 1001 is fixed vertically to the base plate 1000. Two sets each constructed by a pair of the flat cooling tube 2A and the flat cooling tube 2E having low rigidity in comparison with the flat cooling tube 2A and a semiconductor module 1 pinched by these flat cooling tubes 2A, 2E are arranged between both the fixing wall portions 1001. Pressing (sandwiching) plates 33, 33 and a wedge-shaped member 1002 are arranged between both sets. Each of the pressing plates 33, 33 comes in close contact with a main face of the flat cooling tube 2E on a side opposed to the semiconductor module, and is increased in thickness toward a downward direction. A surface of the pressing plate 33 on a side of the wedge-shaped member is set to a slanting face. The wedge-shaped member 1002 is formed in a shape thinned toward the downward direction. A bolt is inserted into the wedge-shaped member 1002, and a tip portion of the bolt is screwed into the base plate 1000 as shown in FIG. 37. Accordingly, the wedge-shaped member 1002 is moved toward the base plate 1000, so that the wedge-shaped member 1002 thrust the pressing plates 33, 33 and the flat cooling tubes 2E, 2E in a lateral direction parallel to the base plate 1000. As a result, semiconductor modules 1 come in close contact with the flat cooling tubes 2A, 2A by fastening the bolt. The wedge-shaped member 1002 is pushed steady and prevented from returning backward by the bolt.

(Modified Mode)

The pressing plate 33 can be molded integrally with the flat cooling tube 2A.

Sixteenth Embodiment

This embodiment will be explained to show another type of semiconductor module having an object to provide both a semiconductor switching module capable of constituting a compact three-phase power inverter circuit, and also a semiconductor device realized by employing this semiconductor switching module.

Figure 38:
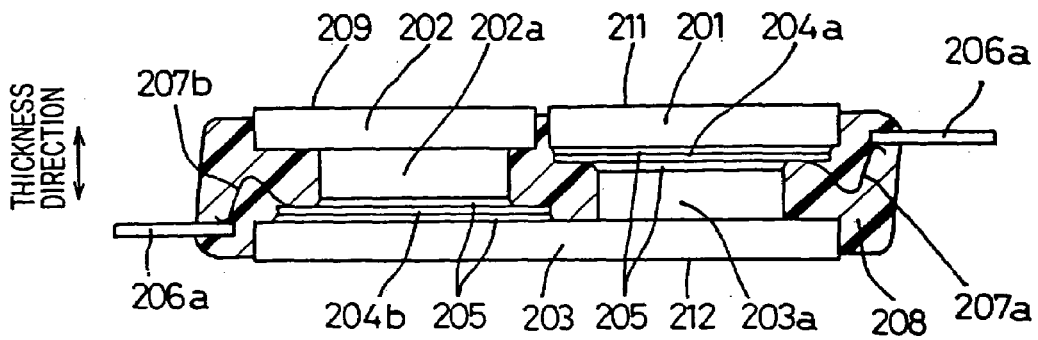
FIG. 38 is a sectional view for showing a semiconductor switching module along a thickness direction thereof.
Figure 39:
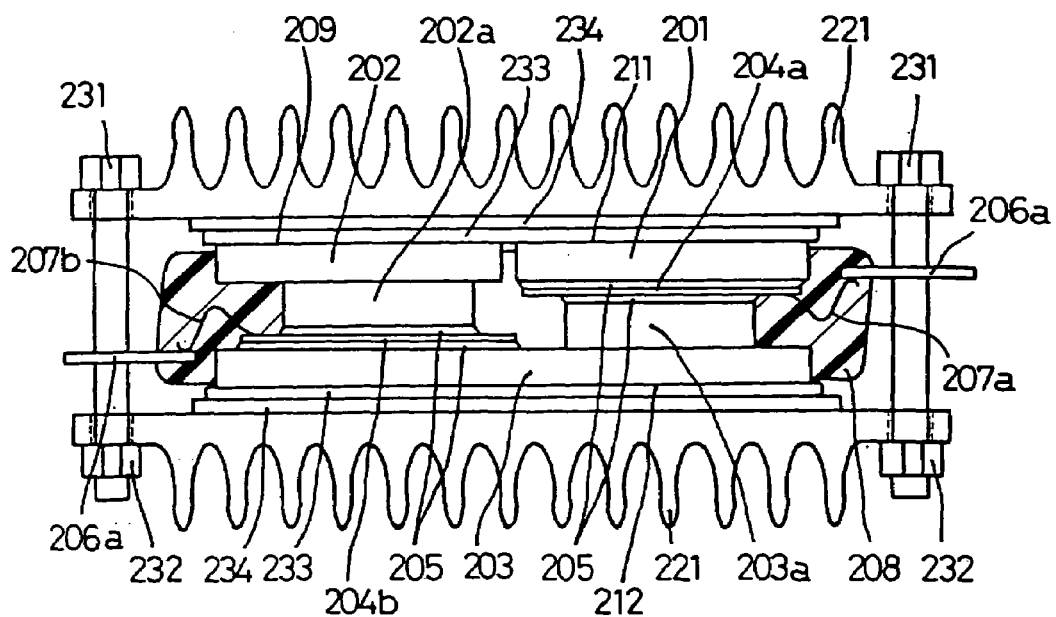
FIG. 39 is a sectional view for a semiconductor device having the semiconductor switching module in FIG. 38.

FIG. 38 is a sectional view for showing a semiconductor switching module along a thickness direction thereof, and FIG. 39 is a sectional view for representing a semiconductor device with employment of this semiconductor switching module along a thickness direction thereof.

(Structure of Semiconductor Switching Module)

In FIG. 38, reference numeral 201 shows a high-sided plate, reference numeral 202 indicates a low-sided plate, reference numeral 202a shows a spacer, reference numeral 203 indicates a middle-sided plate, reference numeral 203a represents another spacer, reference numeral 204a denotes a semiconductor chip provided on the high side, and reference numeral 204b shows a semiconductor chip provided on the low-side. Also, reference numeral 205 shows a soldering layer, reference numeral 206a represents a control electrode terminal, reference numerals 207a and 207b indicate bonding wires, reference numeral 208 denotes a sealing resin portion, reference numeral 209 shows an outer main surface (major plane) of the low-sided plate 202, reference numeral 11 represents an outer main surface (major plane) of the high-sided plate 201, and reference numeral 212 shows an outer main surface of the middle-sided plate 203.

The high-sided plate 1, the low-sided plate 202, the spacer 202a, the middle-sided plate 203, and the spacer 203a are plane plates and made of metal such as tungsten and molybdenum. Alternatively, these members may be made of such as copper, or an aluminum alloy.

The semiconductor chip 204a is interposed between an inner main surface of the high-sided plate 201, and one surface of main surfaces of the spacer 203a. Therefore, semiconductor chip 204a is joined to both these surfaces by way of the soldering layer 205. The other surface of the main surfaces of the spacer 203a is joined to an inner main surface of the middle-sided plate 203 by the soldering manner.

The semiconductor chip 204b is interposed between an inner main surface of the middle-sided plate 203, and one surface of main surfaces of the spacer 202a. Therefore, the semiconductor chip 204b is joined to both these surfaces by way of the soldering layer 205. The other surface of the main surfaces of this spacer 202a is joined to an inner main surface of the low-sided plate 202 by the soldering manner.

The spacers 202a and 203a own a difference in thickness thereof which are capable of absorbing a difference in a thickness between the semiconductor chip 4a and the semiconductor chip 204b, which is different in thickness from the semiconductor chip 204a. As a result, an outer main surface of the high-sided plate 201 may be made at the same height with respect to the outer main surface of the low-sided plate 202. In other words, the outer main surfaces of the high-sided plate 201 and the low-sided plate 202 is disposed in a substantially same plane.

In accordance with this arrangement, both the high-sided plate 201 and the low-sided plate 202 may be made in close contact with a cooling member through a thinner electric insulating member, for example, on the same plane of the cooling member. Thus, the superior double-sided cooling effect may be achieved with having the simple construction.

In addition, an extra gap can be secured by the spacers 202a and 203a between either the high-sided plate 201 or the low-sided plate 202, and the middle-sided plate 203, for example, so that a connection member for connecting the control electrode of the semiconductor chip and the control electrode terminal thereof, e.g., an arranging space of the bonding wire may be secured without any design problem.

Figure 40:
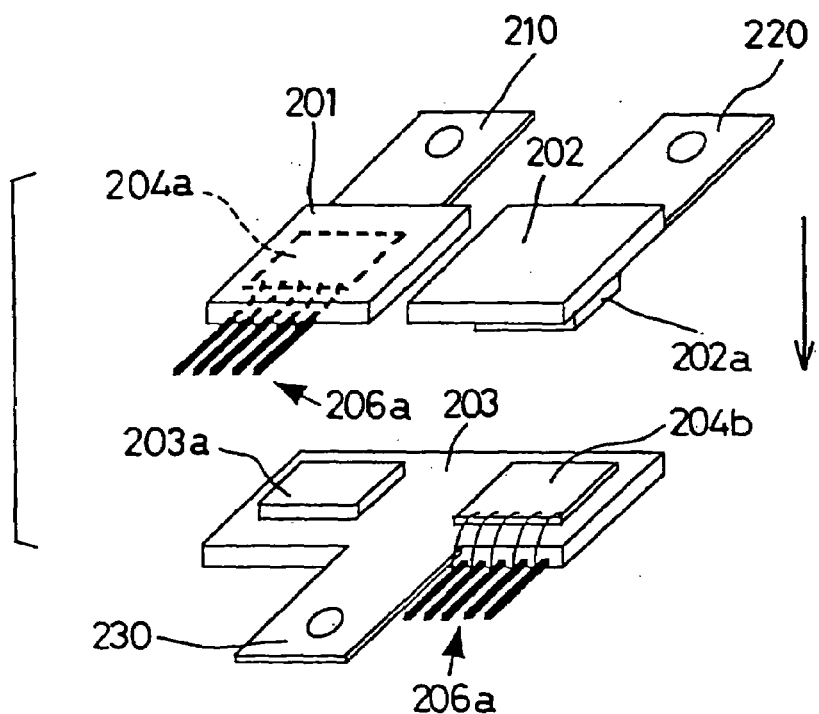
FIG. 40 is an exploded diagram for indicating the semiconductor switching module of FIG. 38.
Figure 41:
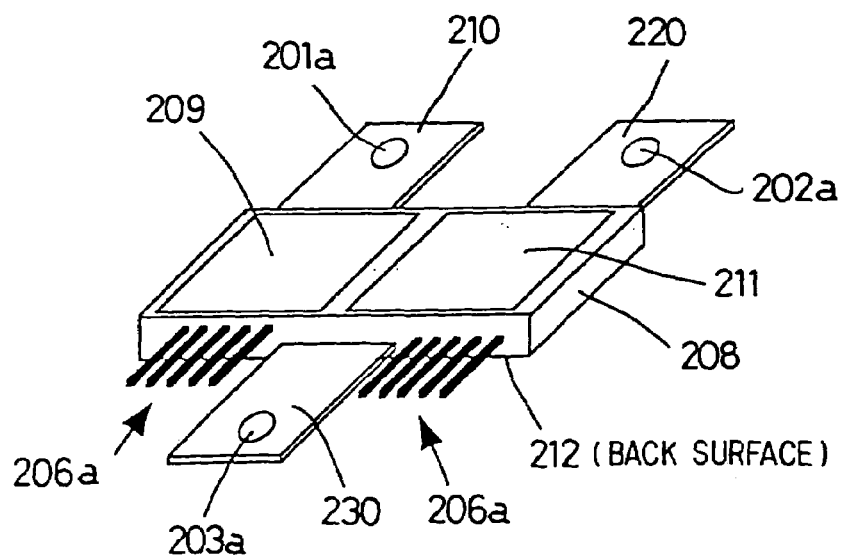
FIG. 41 is an oblique perspective figure for indicating the semiconductor switching module of FIG. 38.

The respective plates 201 to 203 own projected terminal portions 210, 220, 230 (see FIGS. 40 and 41) which are elongated along either front in a depth direction of a plane in FIG. 38 or rear in the depth direction thereof. The projected terminal portions 210, 220, 230 are connected to external bus bars (not shown). FIG. 40 is an exploded diagram for indicating such a semiconductor switching module made before the spacers 202a and 203a are joined to the semiconductor chips 204a and 204b. FIG. 41 is an oblique perspective figure for showing such a semiconductor switching module made after the spacers 202a and 203a have been joined to the semiconductor chips 204a and 204b.

It should be understood in this embodiment that the control electrode terminals 206a are firstly formed with the respective plates 201 and 203 in an integral form, and are cut away from these plates 201 and 203 after the wire bonding or the resin molding. Since such a manufacturing manner is generally known in the normal lead frame resin molding technique, a detailed explanation thereof is omitted. While five sets of these control electrode terminals 206a are illustrated as to a single semiconductor chip in the drawings, these control electrode terminals are constituted by a gate terminal, a drain terminal, a current mirror sense terminal, and two temperature detecting terminals for detecting the temperature of the semiconductor chip. If no sensor such as temperature sensor is required, then only both the gate terminal and the drain terminal may be required in this minimum condition.

It should also be noted that the widths of the respective plates 201 to 203 are made wider than those of the spacers 202a and 203a, and thus, the respective plates 201 to 203 are further projected from the peripheral portions of the spacers 202a and 202b outwardly along the plane direction. As a result, the base portions of the terminals may be joined to the inner main surfaces of the respective plates 201 to 203, and then, may be projected outwardly along the plane direction.

It should also be noted that the respective plates 201 to 203 have connecting holes 201a, 202a, and 203a for connecting these plates to bus bars or electrodes and the like of other element or device and the like. Screws and the like are fixed through the connecting holes.

The bonding wires 207a and 207b are used to connect bonding pads with the control electrode terminal 206a. These bonding pads may constitute control electrodes of the semiconductor chips 204a and 204b. The control electrode terminal 206a is projected outwardly along the plane direction.

The sealing resin portion 208 may be, for example, an epoxy molding resin, and may mold both the semiconductor chips 204a and 204b. While the sealing resin portion 208 covers the side surfaces of the respective plates 201 to 203 and also covers the side surfaces of the semiconductor chips 204a and 204b, the outer main surfaces 209, 211 and 212 of the respective plates 201, 202 and 203 are exposed, and an edge portion of the sealing resin portion 208 along the thickness direction thereof is limited to inner sides rather than the outer main surfaces 209 to 212. As a consequence, the outer main surfaces 209 to 212 can be readily made in close contact with a flat surface of a cooling member.

The soldering layer 205 may be replaced with a solder material, an electrically conductive adhesive agent and the like. Also, these electrically conductive joint materials may be employed for connecting the spacers 202a and 203a to the respective plates 201 to 203. Alternatively, the spacers 202a and 203a may be formed with the respective plates 201 and 203 in an integral form.

Apparently, the control electrodes of the semiconductor chips 204a and 204b may be connected to the control electrode terminals 206a by the bonding wires 207a and 207b or bump joints.

FIG. 41, while both the low-sided plate and the high sided plate are arranged on one main side, other components such as the middle-sided plate and the control electrode are arranged on the opposite side. Alternatively, for instance, both the low-sided plate and the middle-sided plate may be arranged on one side. Also, the position of the low-sided plate may be changed by the position of the middle-sided plate.

In accordance with the arrangement above described, while a double-sided cooling functions of the semiconductor chips (modules) are maintained, the single-phase inverter circuit can be formed in a single inverter module. The single-phase circuit can be made compact and also a total number of assembling steps can be reduced, whereby when the semiconductor module is applied to a vehicle, for example, an anxiety about loosening of fastening portions with respect to vehicle vibrations and others can be mitigated.

Also, since the middle-sided plate (either output electrode bus bar of single-phase inverter circuit or a portion thereof) may constitute a common board of both the semiconductor chips, the high packaging arrangement of both the semiconductor chips can be realized. Moreover, a total number of wiring components can be reduced, a total number of connecting steps can be decreased, and loss occurred in the wiring lines can be reduced.

(Modification Mode)

Figure 42:
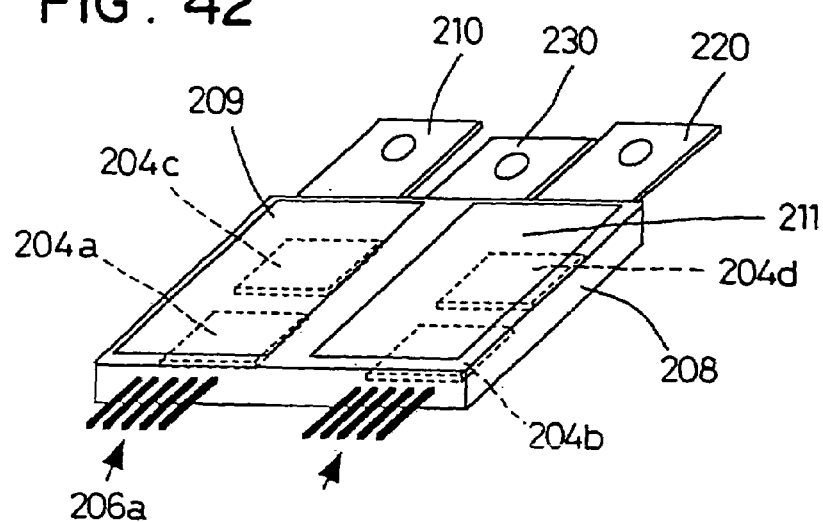
FIG. 42 is an oblique perspective figure for modification of the semiconductor switching module of FIG. 41.

A modification mode of the present invention is shown in FIG. 42.

In the above-explained embodiment, the semiconductor chips 204a and 204b are constructed of the MOS transistors. In FIG. 42, an IGBT is employed as these semiconductor chips 204a and 204b. In the case that an IGBT is employed so as to control switching of an inductive load, a flywheel diode must be cross-coupled to this IGBT. As a result, a semiconductor chip 204c in which the flywheel diode is formed is connected parallel between the respective plates 201 and 203, and another semiconductor chip 204d in which the flywheel is formed is connected parallel between the respective plates 202 and 203.

Also, in FIG. 42, a projected terminal portion 230 of the middle-sided plate 203 is extracted along the same direction to the projected terminal portion 210 of the high-sided plate 201 and the projected terminal portion 220 of the low-sided plate 202.

Furthermore, in this modification, the control electrode terminal 206a is projected to a side opposite to the projected terminal portions 210, 220, and 230 of the respective plates 201 to 203. As a result, the wiring lines can be easily detoured, and the electric insulation can be easily made between the terminals and the wiring lines. Entering of the switching noise into the control electrode terminal 206a can be reduced.

In FIG. 42, the semiconductor chip is constituted by both a transistor chip and a flywheel diode chip, which are interposed in a parallel manner between one of the high-sided plate 201 and the low-sided plate 202 and the middle-sided plate 203, while being separated from each other.

In accordance with this construction, each of the semiconductor chips owns such a two-chip structure that one of an IGBT (insulated-gate bipolar transistor), an MOST (insulated-gate transistor) and a BPT (bipolar transistor), for example, and a flywheel diode are connected in a parallel manner, so that a compact single-phase large current inverter circuit having the superior cooling characteristic can be realized.

It should be noted that since a thickness of either an IGBT chip or a BPT chip is normally different from a thickness of a flywheel diode chip, a difference in thickness between these chips may be solved by interposing one pair of spacers having a difference in thickness between the high-sided plate 201 and the middle-sided plate as between the low-sided plate 202 and the middle-sided plate 203, respectively.

Incidentally, the spacers 202a and 203a may also own projected terminal portions elongated from the sealing resin portion 208 along a direction substantially equal to a plane direction instead of the terminal 210, 220 or 230.

According to this arrangement, since the spacers are projected from the sealing resin portions along the plane direction so as to constitute the terminals, the simple terminal structures having high reliability can be realized.

Moreover, main electrode terminals may be joined to inner main surfaces of the high-sided plate 201, the low-sided plate 202, and the middle-sided plate 203, and also are projected outside along the plane direction instead of the terminal 210, 220 or 230 formed in the respective plates 201, 202 and 203.

With employment of such a structure, for instance, low-cost terminals having very low resistance values, made of copper and the like, can be employed as compared with electric resistance values of Mo and W.

Furthermore, it is preferably that a metal material having a coefficient of linear expansion approximately equal to that of the semiconductor chip is employed as the spacers and the middle-sided plate and the. The shape of this metal material may be easily processed, and also both the material cost and the shape-processing cost may be reduced.

(Structure of Semiconductor Device)

A semiconductor device with employment of this semiconductor switching module is indicated in FIG. 39.

Reference numerals 221 and 221 show cooling members corresponding to heat radiation fins. Reference numeral 233 shows an insulating material, and reference numeral 234 represents a silicon grease layer.

The insulating material 233 is made in close contact with the outer main surfaces 209 and 211 of the respective plates 201 and 202. A silicon grease layer may be coated or interposed between both the outer main surfaces 209 and 211. The cooling member 221 is made in close contact with flat contact planes of the cooling members 221 and 221 through the silicone grease layer 234. A large number of concave/convex portions, namely fin are formed on the outer main surfaces of the plates 201 and 202.

In FIG. 39, through holes are formed in both a right edge portion and a left edge portion of the cooling members 221 and 221. A through bolt 231 is inserted into these through holes, and a nut 232 is screwed to the through bolt 231, so that the semiconductor switching module is pinched by one pair of these cooling members 221 and 221. In other words, in accordance with this embodiment, these cooling members 221 and 221 may work not only the cooling member but a force-transferring member so that the pinching force produced by the bolt and the nut is transferred to the contact planes in order that the cooling members 221 and 221 can be made in close contact with the semiconductor switching module under better condition. Alternatively, these heat-radiating members 221 and 221 may be replaced by, for instance, the coolant tube as described above embodiments.

FIG. 39 represents such a condition that the cooling members 221 and 221 pinch only one phase of the semiconductor switching module in the three-phase inverter system (namely, single-phase inverter circuit). Alternatively, these cooling members 221 and 221 may sandwich the other two phases of the semiconductor switching modules at the same time toward the rear depth direction of the plane in FIG. 38.

Seventeenth Embodiment

Figure 43:
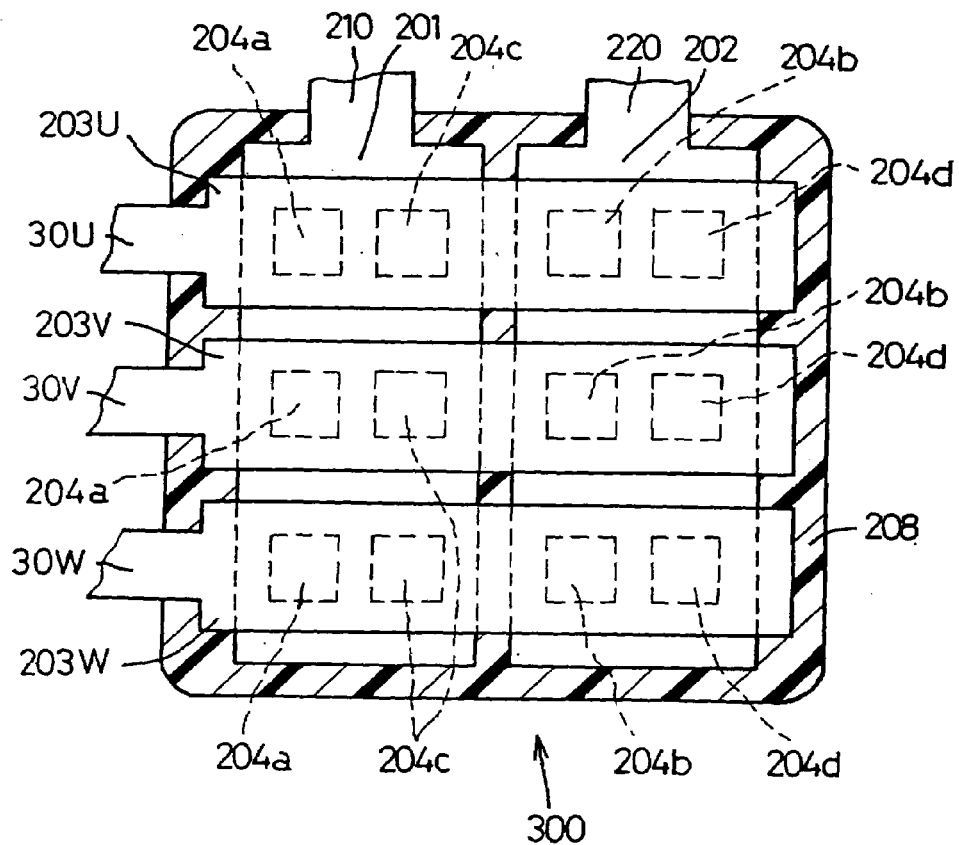
FIG. 43 is a plan view for indicating a major portion of this semiconductor device.

Referring now to FIG. 43, a description will be made of a semiconductor switching module according to another embodiment, and also a semiconductor device for constituting a 3-phase inverter circuit with employment of this switching module. FIG. 43 is a plan view for indicating a major portion of this semiconductor device.

In this embodiment, FIG. 43 shows a plan view of a semiconductor switching module 300 containing the 3-phase inverter circuit in which three sets of the single-phase inverter circuit shown in FIG. 42 are integrated inside the sealing resin portion 208.

Also, in this embodiment, while the semiconductor switching module 300 is pinched by the cooling members 221 and 221 shown in FIG. 39 from both sides thereof, a semiconductor device which constitutes an one module of a 3-phase inverter circuit may be realized.

It should be noted that symbol 203U shows a middle-sided plate for a U-phase, symbol 203V indicates a middle-sided plate for a V-phase, and symbol 203W represents a middle-sided plate for a W-phase, which are arranged in parallel to each other. One edge of each of these middle-sided plates constitutes a projected terminal portion 30U, 30V, or 30W, respectively.

While the semiconductor chips 204a and 4b in which the IGBT is formed, respectively, the semiconductor chips 204c and 204d in which the flywheel diode is formed, respectively. The respective flywheel diodes are cross-coupled to the respective IGBTs similar to the above-mentioned semiconductor switching module.

Although a control electrode terminal is not shown in this drawing, the control electrode terminal may be formed by way of a so-called "lead frame manufacturing process."

Namely, the three-phase semiconductor switching module has a high-sided semiconductor chip in which a high-sided semiconductor switching element is formed, and a low-sided semiconductor chip in which a low-sided semiconductor switching element is formed. The three-phase semiconductor switching module is also arranged by connecting three sets of a single-phase inverter circuit in a parallel manner. The single-phase inverter circuit is arranged by series-connecting both the semiconductor switching elements.

The three-phase semiconductor switching module comprises of a high-sided plate and a low-sided plate, which are made of metal plates respectively, and also middle-sided plates of a U-phase, a V-phase, and a W-phase;

Main electrode surfaces of both the semiconductor chips for the U-phase on the output sides thereof are directly joined, or joined via electrically conductive members to an inner main surface of the middle-sided plate for the U-phase, while the main electrode surfaces thereof are separated from each other.

Main electrode surfaces of both the semiconductor chips for the V-phase on the output sides thereof are directly joined, or joined via electrically conductive members to an inner main surface of the middle-sided plate for the V-phase, while the main electrode surfaces thereof are separated from each other.

Main electrode surfaces of both the semiconductor chips for the W-phase on the output sides thereof are directly joined, or joined via electrically conductive members to an inner main surface of the middle-sided plate for the W-phase, while the main electrode surfaces thereof are separated from each other.

A main electrode surface of the high-sided semiconductor chip for each phase on the side of a high potential power supply is directly joined, or joined via an electrically conductive member to an inner main surface of the high-sided plate.

A main electrode surface of the low-sided semiconductor chip for each phase on the side of a low potential power supply is directly joined, or joined via an electrically conductive member to an inner main surface of the low-sided plate.

Both the semiconductor chips are covered in an integral form by a sealing resin portion, which is molded, while exposing outer main surfaces of the middle-sided plate for each phase, the high-sided plate for each phase, and the low-sided plate for each phase.

In accordance with this arrangement, the three-phase inverter circuit is built in the semiconductor switching module, while employing five bus-bar-shaped members in total, namely the high-sided plate, the three middle-sided plate, and the low-sided plate. Furthermore, it is possible to realize such a module that the respective semiconductor chips are arranged in a matrix shape in a constant interval. Therefore, the arrangement of the semiconductor switching module can be considerably simplified, and also can output high power by cooling both surfaces thereof, while this semiconductor switching module can be made compact.

Other Embodiments

Embodiments explained below show semiconductor devices for large electric power, which are easily manufactured so as to be excellent in practical property, and have an excellent heat radiating characteristics.

Preferred modes of the present invention will be explained with reference to the following embodiments.

Eighteenth Embodiment (Entire Construction)

Figure 44:
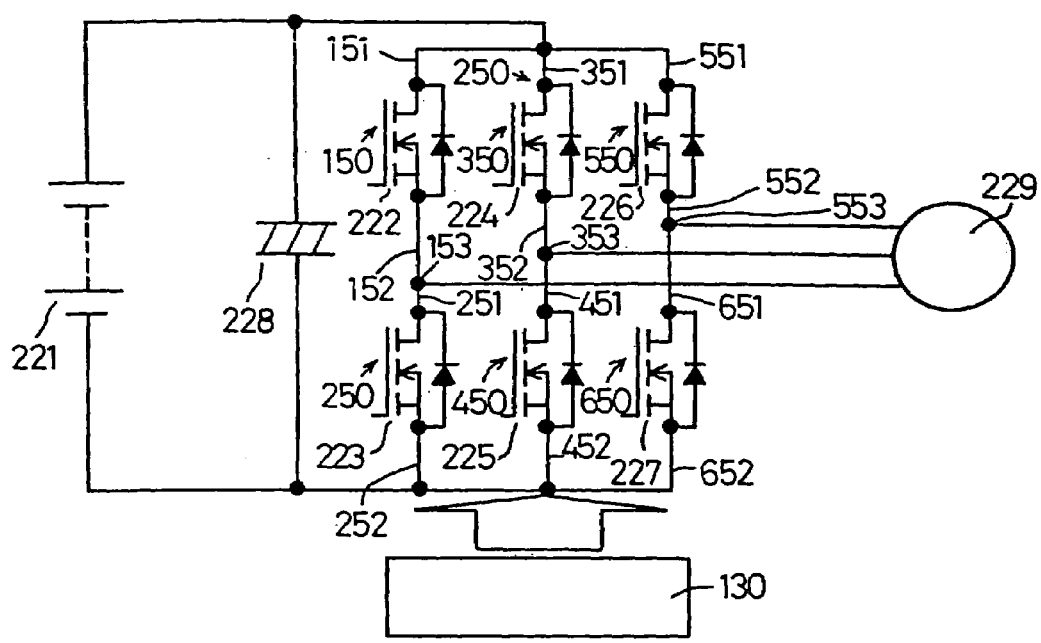
FIG. 44 is a circuit diagram of a three-phase inverter circuit device.

FIG. 44 is a circuit diagram of a three-phase inverter circuit device for controlling an operation of a driving motor of an electric automobile.

Reference numeral 221 designates a battery (direct current power source). Each of reference numerals 222 to 227 designates a semiconductor element constructed by an NMOS transistor utilizing a parasitic diode as a flywheel diode.

The semiconductor element 222 constitutes a U-phase upper arm, and the semiconductor element 223 constitutes a U-phase lower arm. The semiconductor element 224 constitutes a V-phase upper arm, and the semiconductor element 225 constitutes a V-phase lower arm. The semiconductor element 26 constitutes a W-phase upper arm, and the semiconductor element 227 designates a W-phase lower arm. These semiconductor elements are individually mounted as semiconductor modules 150 to 650, respectively.

Reference numerals 151 and 152 respectively designate a positive direct current power source terminal (drain side) of the U-phase upper (high side) arm, and an alternating current output terminal (source side) of the U-phase upper arm. Reference numerals 251 and 252 respectively designate an alternating current output terminal (drain side) of the U-phase lower (low side) arm, and a negative direct current terminal (source side) of the U-phase lower arm.

Reference numerals 351 and 352 respectively designate a positive direct current power source terminal (drain side) of the V-phase upper (high side) arm, and an alternating current output terminal (source side) of the V-phase upper arm. Reference numerals 451 and 452 respectively designate an alternating current output terminal (drain side) of the V-phase lower (low side) arm, and a negative direct current terminal (source side) of the V-phase lower arm.

Reference numerals 551 and 552 respectively designate a positive direct current power source terminal (drain side) of the W-phase upper (high side) arm, and an alternating current output terminal (source side) of the W-phase upper arm. Reference numerals 651 and 652 respectively designate an alternating current output terminal (drain side) of the W-phase lower (low side) arm, and a negative direct current terminal (source side) of the W-phase lower arm.

Each of the positive direct current power source terminals 151, 351, 551 is connected to a positive electrode terminal of a smoothing capacitor 228 and a positive electrode terminal of the battery 221. Each of the negative direct current power source terminals 252, 452, 652 is connected to a negative electrode terminal of the smoothing capacitor 228 and a negative electrode terminal of the battery 221. The U-phase alternating current output terminals 152, 251 are connected to each other at a connection point 153. The V-phase alternating current output terminals 352, 451 are connected to each other at a connection point 353. The W-phase alternating current output terminals 552, 651 are connected to each other at a connection point 553. Thus, electric power is supplied to a armature winding (not shown) of a three-phase alternating current motor 229.

A controller 130 outputs a control voltage to a gate electrode of each semiconductor element, and detects a temperature of each semiconductor element, etc. Operations of the above three-phase inverter circuit and the smoothing capacitor 228 are well known. Accordingly, a detailed explanation of these operations is omitted here.

(Semiconductor Module)

Figure 45A:
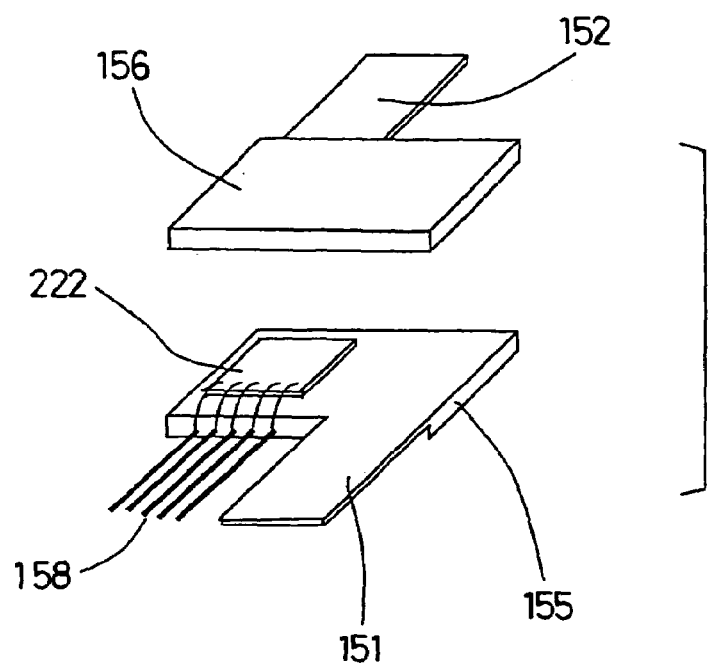
FIG. 45A is an exploded perspective view of a semiconductor module shown in FIG. 44.
Figure 45B:
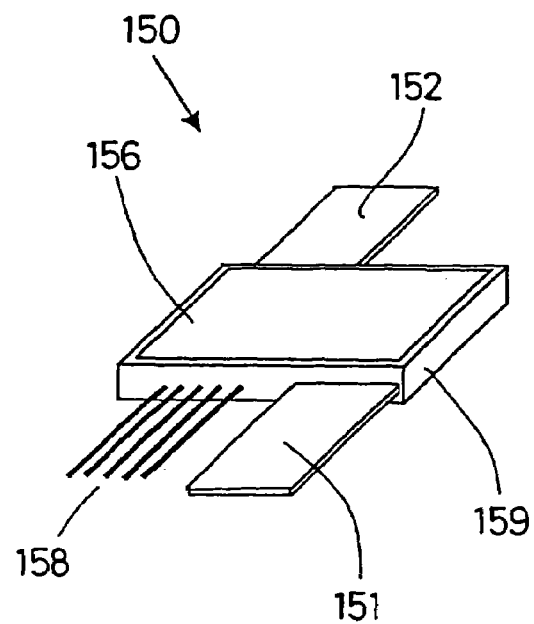
FIG. 45B is a perspective view of the semiconductor module shown in FIG. 44.

A semiconductor module 150 of the U-phase upper arm will next be explained with reference to FIGS. 45A and 45B. FIGS. 45A and 45B respectively show an exploded perspective view of this semiconductor module and a perspective view of the entire semiconductor module.

Reference numerals 155, 156 and 158 respectively designate a metallic heat transfer plate having the positive direct current power source terminal 151, a metallic heat transfer plate having the alternating current output terminal 152, and a signal terminal (also called a control electrode terminal) of the semiconductor element (a semiconductor element chip for large electric power) 222. The signal terminal 158 includes a terminal for controlling the operation of a gate electrode of an NMOS transistor, and a signal terminal for an internal monitor of the semiconductor element 222. Five signal terminals 158 are arranged in each of FIGS. 45A and 45B.

The semiconductor element 222 is soldered onto the metallic heat transfer plate 155, and the metallic heat transfer 156 is soldered onto an upper face of the semiconductor element 222. These metallic heat transfer plates are sealed by resin 159 in a state in which external main faces of the metallic heat transfer plates 155, 156 are exposed and terminals 151, 152, 158 are projected. These members constitute the semiconductor module 150.

In this embodiment, the signal terminal 158 and the positive direct current power source terminal (also called a drain electrode terminal) 151 are particularly arranged on the same side (particularly, a long side) of the rectangular semiconductor module 150. The signal terminal 158 is arranged on a half side of this long side, and the positive direct current power source terminal (drain electrode terminal) 101 is arranged on the other half side of this long side as shown in FIG. 45B. The alternating current output terminal (also called a source electrode terminal) 152 is arranged in a half portion on a side opposed to the side from which terminals 158, 151 are projected. Namely, the alternating current output terminal 152 is projected in a direction opposite to the signal terminal 158.

Here, heat resistance from a junction portion of the semiconductor element (NMOS transistor) 222 to the metallic heat transfer plate 155 on a drain side in the semiconductor module 150 is set to R1. Heat resistance from the junction portion of the semiconductor element 222 to the metallic heat transfer plate 156 on a source side is set to R2. If thickness of both the metallic heat transfer plates 155, 156 are set to be equal to each other, a relation between R1 and R2 becomes "R1<R2".

The reasons are as follows. A main face of the semiconductor element 222 disposed on its drain area side is joined to the metallic heat transfer plate 105 over an entire face of this main face. In contrast to this, with respect to a main face of the semiconductor element 222 disposed on its source area side, it is necessary to project one portion of the metallic heat transfer plate 156 disposed on a source side toward the semiconductor element 222 so as to secure a three-dimensional space for connection with each signal terminal 158 using wiring bonding and avoid this three-dimensional space. Therefore, only the remaining portion obtained by subtracting the above three-dimensional space from the main face of the semiconductor element 222 disposed on its source area side can be joined to the metallic heat transfer plate 156. Therefore, the above-mentioned heat resistance relation is formed.

The semiconductor modules 350, 550 of the other upper arms have the same construction as the semiconductor module 150. The semiconductor modules 250, 450, 650 of the lower arms also have the same construction as the semiconductor modules 150, 350, 550 of the upper arms. In this case, the positive direct current power source terminal of the semiconductor module of the upper arm is replaced with an alternating current output terminal in the semiconductor module of the lower arm, and the alternating current output terminal of the semiconductor module of the upper arm is replaced with a negative direct current power source terminal in the semiconductor module of the lower arm.

When an IGBT is adopted as the semiconductor module 222, a separate flywheel diode is required. However, the flywheel diode may be arranged on a left-hand side of the semiconductor element 222 in FIG. 45A. In this case, the flywheel diode is mounted in a shape in which a cathode side of the flywheel diode is directed to the metallic heat transfer plate 155 having the positive direct current power source terminal 151.

(Semiconductor Module)

Figure 46:
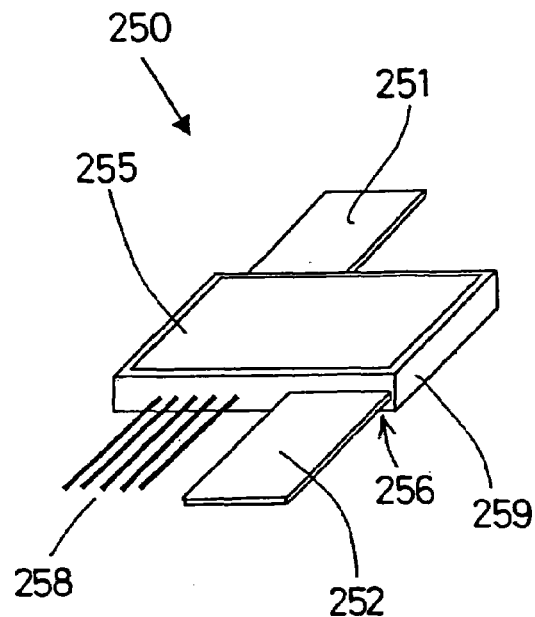
FIG. 46 is a perspective view of the semiconductor module shown in FIG. 44.

FIG. 46 shows the semiconductor module 250.

Reference numerals 255, 256, 258 and 259 respectively designate a metallic heat transfer plate having the alternating current output terminal 251, a metallic heat transfer plate having the negative direct current power source terminal 252, a control electrode terminal of the semiconductor element 223, and mold resin.

Figure 47:
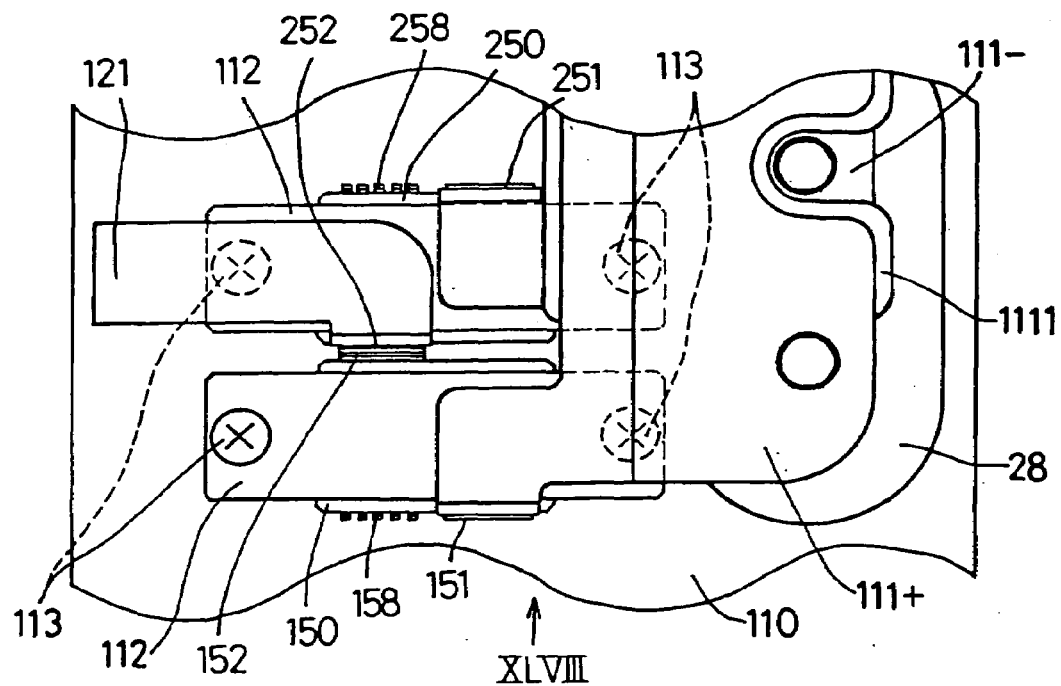
FIG. 47 is a plan view of a main portion of the inverter circuit device shown in FIG. 44.
Figure 48:
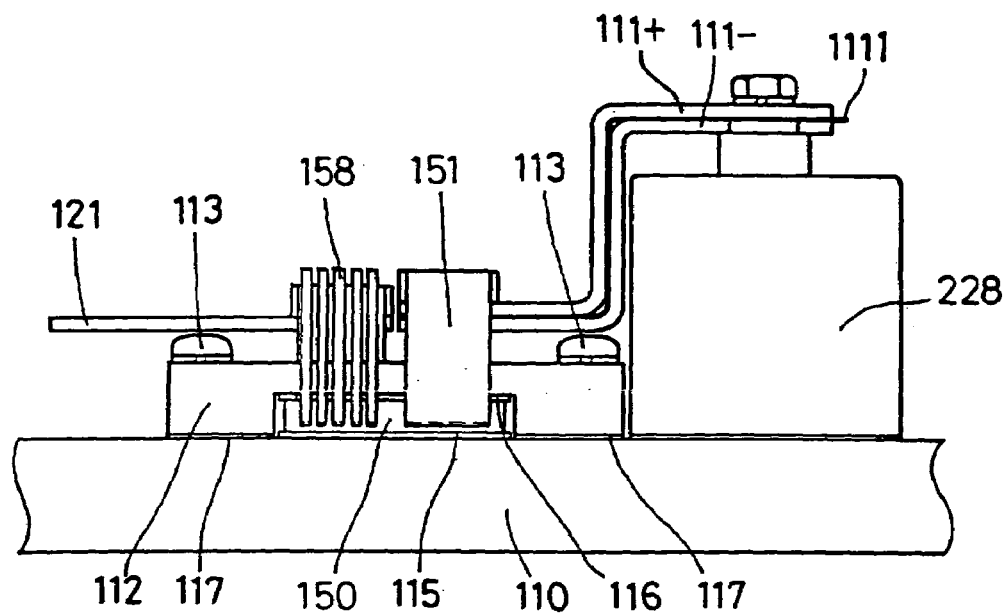
FIG. 48 is a side view of the inverter circuit device shown in FIG. 47.

FIGS. 47 and 48 show an inverter device using the semiconductor module 250. FIG. 48 shows a side view of this inverter device. FIG. 47 is a partial plan view of a U-phase portion, and FIG. 48 is a side view seen from an arrow XXXXVIII of FIG. 47.

A heat sink 110 is constructed by a metallic plate of a water cooling structure forming a cooling flow path therein. For example, the heat sink 110 is formed by an aluminum die-cast method. The heat sink 110 is not limited to water cooling. For example, the heat sink 110 may be constructed by a flat tube formed by extrusion or drawing of aluminum (Al) having strength and an airtight (sealing) property able to seal a refrigerant of an air conditioner for an automobile and the like, and may be also constructed by a well-known refrigerant reservoir of a boiling-cooling type.

Each of reference numerals 150, 250 designates a semiconductor module (hereinafter, also called a card type semiconductor module). Reference numeral 112 designates a fixing member (a biasing-holding member in the present invention). A pair of fixing members 112 is detachably fixed to the heat sink 110 by screws 113 from above the semiconductor modules 150, 250. The fixing members 112 individually press the semiconductor modules 150, 250 against an upper face of the heat sink 110.

A smoothing capacitor 228 is adjacent to the semiconductor modules 50, 250, and is fixed onto the heat sink 110 in a posture in which a bottom face of the smoothing capacitor 228 comes in contact with the heat sink. Reference numerals 111+ and 111− respectively designate a positive direct current input bus bar and a negative direct current input bus bar which are also respectively the direct current input terminals 151, 251 of the semiconductor modules 150 and 250, and positive and negative electrodes of the smoothing capacitor 228.

An insulator 1111 is interposed to electrically insulate the positive and negative direct current input bus bars 111+, 111−. Reference numeral 121 designates an alternating current output bus bar of the U-phase connecting the alternating current output terminals 152, 251 of the semiconductor modules 150, 250 and the three-phase alternating current motor 229. Constructions with respect to the V-phase and the W-phase are similar to the construction with respect to the U-phase. Accordingly, an explanation of these constructions are omitted here.

The controller 130 is arranged in parallel with the heat sink 110 above the semiconductor modules 150, 250 although this arrangement is not illustrated here. The controller 130 is connected to control electrode terminals 158, 258 of the respective semiconductor modules 150, 250, etc.

A member having a heat conducting property and an electric insulation performance, e.g., an insulation heat radiating sheet of a silicone system is nipped on a contact face 115 of each of the semiconductor modules 150, 250 and the heat sink 110, and a contact face 116 of each of the semiconductor modules 150, 250 and the fixing member 112. However, this insulation heat radiating sheet can be replaced with an insulating substrate such as ceramics, etc., and heat radiating grease on both faces of this insulating substrate. A heat radiating sheet of a silicone system having a good heat conducting property and a heat conducting grease, etc. are also interposed on a contact face 117 of the fixing member 112 and the heat sink 110. If the fixing member is an insulating member such as resin, etc., no electric insulating property is required in the heat conducting members nipped on the contact faces 116 and 117.

In accordance with the above embodiment, the semiconductor module 150 is stably held in the heat sink 110 without using solder joining. Accordingly, it is not necessary to consider life of solder, so that life of the entire semiconductor device can be extended. Since no solder joining is used, it is not necessary to use an expensive material such as Al—SiC, etc. in the heat sink 110 so that cost of the entire semiconductor device can be reduced.

Further, the semiconductor device can be assembled by a simple manufacture arrangement irrespective of large heat capacity of the heat sink 110. Since the semiconductor device is constructed so as to be mechanically detached, the semiconductor device is excellent in recycle property and is easily exchanged.

Further, heat can be radiated from both faces of the semiconductor element within the semiconductor module to the heat sink 110 by applying the fixing member 112 made by a metallic material having a good heat conducting property, e.g., Cu and aluminum. Accordingly, heat radiating performance can be greatly improved in comparison with a case in which heat is radiated from one face of the semiconductor element. As a result, the semiconductor element can be made compact so that the semiconductor device can be made compact and reduced in cost. One fixing member 112 may be prepared every semiconductor module, and a lot of semiconductor modules may be also fixed by one fixing member.

(Fixing Member)

Figure 49:
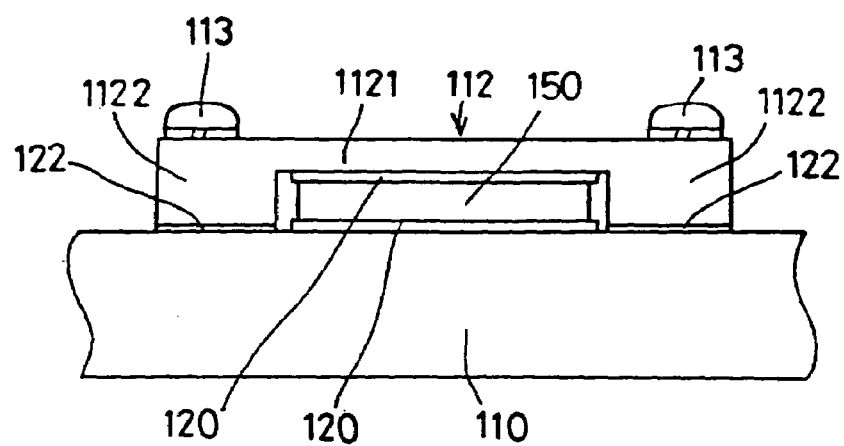
FIG. 49 is a side view showing a pinching structure of the semiconductor module shown in FIG. 44.

The fixing member 112 will be further explained with reference to FIG. 49. FIG. 49 is a side view of a main portion of this device.

The fixing member 112 has a beam portion 1121 for pressing and biasing the semiconductor module, and a pair of leg portions 1122 projected from both ends of the beam portion 1121 to a side of the heat sink 110. A hole (not shown) extends through each of both the leg portions 1122 in a thickness direction of the semiconductor module 150. The fixing member 112 is fixed to the heat sink 110 by fastening a screw 113 to the heat sink 110 through this hole. The semiconductor module 150 is nipped and pressed by the heat sink 110 and the beam portion 1121 of the fixing member 112.

An insulation heat conducting member 120 is arranged between a metallic heat radiating plate (not shown) of the semiconductor module 150 disposed on its heat sink side and an upper face of the heat sink 110. The insulation heat conducting member 120 is also arranged between a metallic heat radiating plate (not shown) of the semiconductor module 150 disposed on a side opposed to the heat sink and a lower face of the beam portion 1121 of the fixing member 112. A heat conducting member 122 is arranged between a lower face of the leg portion 1122 of the fixing member 112 and the upper face of the heat sink 110.

In this embodiment, the heat conducting member 122 is constructed by a soft material having a good heat conducting property, and is softer than the insulation heat conducting member 120.

In such a construction, when the fixing member 120 is fastened to the heat sink 110 by the screw 113, the semiconductor module 150 can be strongly pressed against the heat sink 110 by the hard heat conducting member 120. Accordingly, heat can be preferably radiated from a lower side face of the semiconductor module 150 to the heat sink 110. A material softer than the insulation heat conducting member 120 is used in the heat conducting member 122 so that the insulation heat conducting member 120 fully fits the lower face of the leg portion 1122 and the upper face of the heat sink 110, and heat resistance can be reduced.

For example, aluminum nitride and a hard silicone rubber sheet can be adopted as the insulation heat conducting member 120. For example, solder, heat conducting grease and a graphite sheet can be adopted as the heat conducting member 122. A material having an electric insulating property, e.g., a silicone rubber sheet having low hardness may be also adopted as the heat conducting member 122. The screw 113 may be manufactured by a metal, and may be also manufactured by resin having an electric insulating property.

(Modified Mode)

In the above embodiment, the insulation heat conducting member 120 is nipped between the semiconductor module 150 and the beam portion 1121 of the fixing member 112. However, the heat conducting member 122 may be changed to an insulation heat conducting member having an electric insulating property, and the insulation heat conducting member 120 may be also set to a conducting member having an electric conducting property. The semiconductor module 150 and the beam portion 1121 of the fixing member 112 may come in direct contact with each other. Resin is used in the screw 113. In such a construction, the fixing member 112 can be used as a wiring member or a terminal connected to the metallic heat radiating plate of the semiconductor module 150 on a side opposed to the heat sink.

Nineteenth Embodiment

Another embodiment will next be explained with reference to FIG. 49.

In this embodiment, an average coefficient km1 of thermal expansion of the leg portion 1122 of the fixing member 112 and the heat conducting member 122 is set to be in conformity (within an error of 1%) with an average coefficient km2 of thermal expansion of the semiconductor module 150 and two insulation heat conducting members 120 between a pair of metallic heat radiating faces. In this specification, an average coefficient km of thermal expansion of plural members A, B is set to be prescribed by the following formula.

$$km=(k1 \cdot t1+k2 \cdot t2)/(t1+t2)$$

Here, k1 is a coefficient of thermal expansion (a coefficient of linear expansion) of the member A, t1 is a thickness of the member A, k2 is a coefficient of thermal expansion (a coefficient of linear expansion) of the member B, and t2 is a thickness of the member B.

In such a construction, it is possible to dissolve thermal stress caused by the difference in coefficient of thermal expansion between the semiconductor module 150 and the leg portion 1122 so that reliability with the passage of time can be improved. The above difference in coefficient of thermal expansion is allowed if this difference lies in a range in which this difference has no bad influence on each portion of the semiconductor module at a maximum using temperature or a minimum using temperature.

(Modified Mode)

In conformity setting of this average coefficient of thermal expansion, temperatures of the leg portion 1122 of the fixing member 112, the heat conducting member 122, the semiconductor module 150 and the two insulation heat conducting members 120 are respectively different from each other. Therefore, expansion amounts of these members, etc. in their thickness directions are different from each other.

A material of the leg portion 1122, etc. can be selected to compensate the difference in expansion amount due to the difference in temperature between these respective parts such that a total expansion amount of the leg portion 1122 of the above fixing member 112 and the heat conducting member 122 in the thickness direction is conformed to that of the semiconductor module 150 and the two insulation heat conducting members 120 in the thickness direction at the maximum using temperature at which the expansion amount is maximized. Further, the material of the leg portion 1122, etc. can be selected such that the above difference in expansion amount lies in an allowable range at each using temperature of the semiconductor module 100.

Twentieth Embodiment

Figure 50:
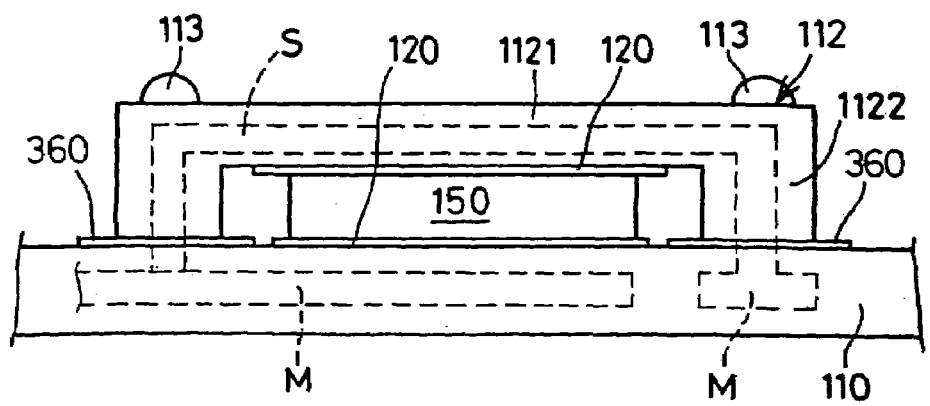
FIG. 50 is a side view showing a pinching structure of the semiconductor module in a twentieth embodiment.

Another embodiment will next be explained with reference to FIG. 50.

In this embodiment, a main cooling fluid passage M is formed within the heat sink 110, and a cooling fluid flows through this passage M. A sub-cooling fluid passage S is also formed in the fixing member 112. Both end openings of the sub-cooling fluid passage S of the fixing member 112 are communicated with the main cooling fluid passage M of the heat sink 110. Both the passages M, S are substantially connected in series or parallel to each other. Thus, the semiconductor module 150 can be further preferably cooled.

Reference numeral 360 designates a packing. This packing 360 can also have a function for elastically absorbing thermal stress due to the difference in coefficient of thermal expansion between the fixing member 112 and the semiconductor module 100 in the thickness direction of the semiconductor module 100. Reference numeral 120 designates an insulation heat conducting member for electrically insulating the metallic heat radiating plate of the semiconductor module 150, the heat sink 110 and the fixing member 112.

In this embodiment, the cooling fluid flows through the fixing member, but the fixing member may be constructed by a heat pipe and may be fixed to the heat sink.

Twenty-First Embodiment

Another embodiment will next be explained with reference to FIG. 51.

In this embodiment, other circuit parts (a smoothing capacitor in this embodiment) are overlapped and arranged on the semiconductor modules 150, 250 through bus bars 161, 262. The fixing member 112 presses the semiconductor modules 150, 250 against the heat sink 110 through the smoothing capacitor 228.

In such a construction, circuit mounting density can be improved. Further, it is possible to shorten the wiring distance between the semiconductor module 150 constituting an inverter circuit and the smoothing capacitor 228 absorbing a switching serge voltage between a pair of direct current terminals of this semiconductor module 150. Accordingly, electric power loss and generated loss due to wiring resistance can be reduced. The smoothing capacitor 228 and the bus bars 161, 262 can have a heat sink function of the semiconductor module 150. In other words, the bus bars 151 and 252 serve like the metallic heat transfer plate 155 and the metallic heat transfer plate 256.

The metallic heat radiating plate of each of the semiconductor modules 150, 250 on a side opposed to the heat sink constitutes a + or − direct current terminal of the inverter circuit. The metallic heat radiating plate (not shown) of each of the semiconductor modules 150, 250 on a heat sink side constitutes an alternating current output terminal. The two semiconductor modules 150, 250 are nipped and pressed by one fixing member 112.

Each of the bus bars 161, 262 has a concave portion c into which each of a + direct current terminal 281 and a − input terminal 282 of the smoothing capacitor 228 is fitted. Thus, a transversal shift of the smoothing capacitor 228 can be prevented, and a position of the smoothing capacitor is easily aligned at its mounting time. A side face of this concave portion c is set to a taper face having a gradually narrowed bottom so that both direct current terminals 281, 282 of the smoothing capacitor 228 are easily fitted and aligned in position. The smoothing capacitor 228 can have plural + direct current terminals 281 and plural − direct current terminals 282. In this case, a plurality of said concave portions fitted to these terminals are arranged.

(Modified Mode)

In this embodiment, a material of the leg portion 1122, etc. are selected such that an average expansion coefficient km3 of the semiconductor modules 150, 250, the smoothing capacitor 228 and the bus bars 161, 262 in the thickness direction of the semiconductor module 150 is conformed to an average expansion coefficient km4 of the leg portion 1122 of the fixing member 112 in its thickness direction.

Similarly to the above formula, each of the average expansion coefficients km3, km4 is defined as a value obtained by dividing a total expansion amount per rise in unit temperature of plural constructional members by a total distance of these plural members in their thickness directions. Otherwise, similarly to the above modified mode, while the actual expansion amount of each portion in its thickness direction is set by considering a temperature distribution at a predetermined temperature (normally a maximum using temperature) of the semiconductor modules 150, 250, the expansion amounts in the thickness direction on both of the leg portion 1122 and the semiconductor modules 150, 250 may be set to be in conformity with each other. In any case, the problem of thermal stress as a serious problem in a fixing system of the pinching semiconductor module of this construction can be solved at a practical level.

Twenty-Second Embodiment

Another embodiment will next be explained with reference to FIG. 51.

Figure 51:
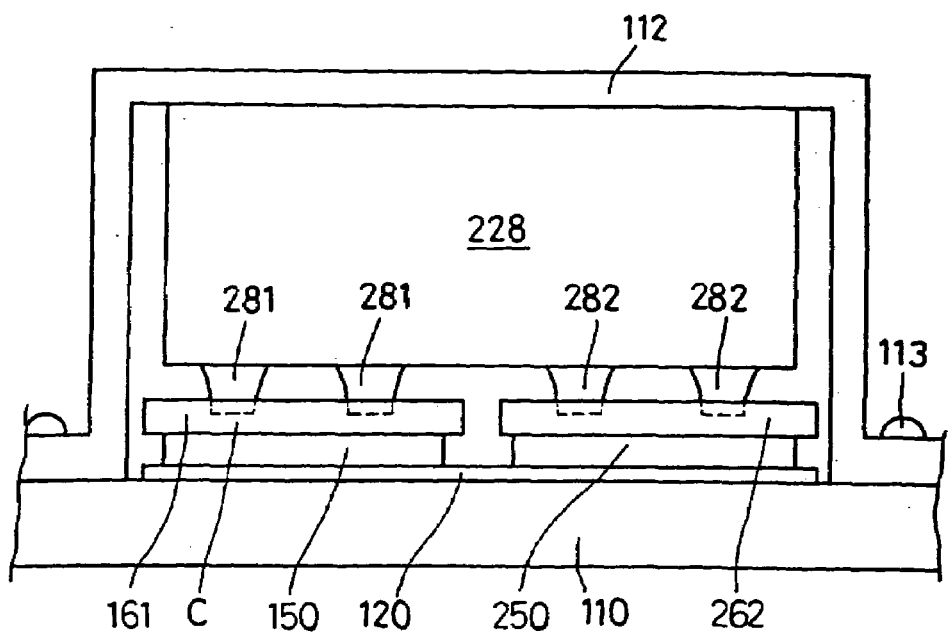
FIG. 51 is a side view showing a pinching structure of the semiconductor module in a twenty-first embodiment.

In this embodiment, the bus bars 161, 262 are set to metallic heat radiating plates of the semiconductor module 150 on a side opposed to the heat sink in a two-story circuit structure of the twenty-first embodiment shown in FIG. 51. Accordingly, in this embodiment, the metallic heat radiating plates 161, 262 of the semiconductor modules 150, 250 on the side opposed to the heat sink respectively have concave portions c into which a + direct current terminal 281 and a − minus input terminal 282 of the smoothing capacitor 228 are fitted. Thus, a transversal shift of the smoothing capacitor 228 can be prevented, and a position of the smoothing capacitor is easily aligned at its mounting time. The other effects are the same as the twenty-first embodiment.

(Modified Mode)

In this embodiment, the material of the leg portion 1122, etc. are selected such that an average expansion coefficient km5 of the semiconductor modules 150, 250 and the smoothing capacitor 228 in the thickness direction of the semiconductor module 150 is conformed to an average expansion coefficient km6 of the leg portion 1122 of the fixing member 112 in its thickness direction. The average expansion coefficients km5, km6 are calculated by the above formula although explanations of these calculations are omitted. Similarly to the above modified mode, while the actual expansion amount of each portion in its thickness direction is set by considering a temperature distribution at a predetermined temperature (normally a maximum using temperature) of the semiconductor modules 150, 250, the expansion amounts in the thickness direction on both of the leg portion 1122 and the semiconductor modules 150, 250 may be also conformed to each other. In any case, the problem of the thermal stress as a serious problem in a fixing system of the pinching semiconductor module this construction can be solved at a practical level.

Twenty-Third Embodiment

Figure 52:
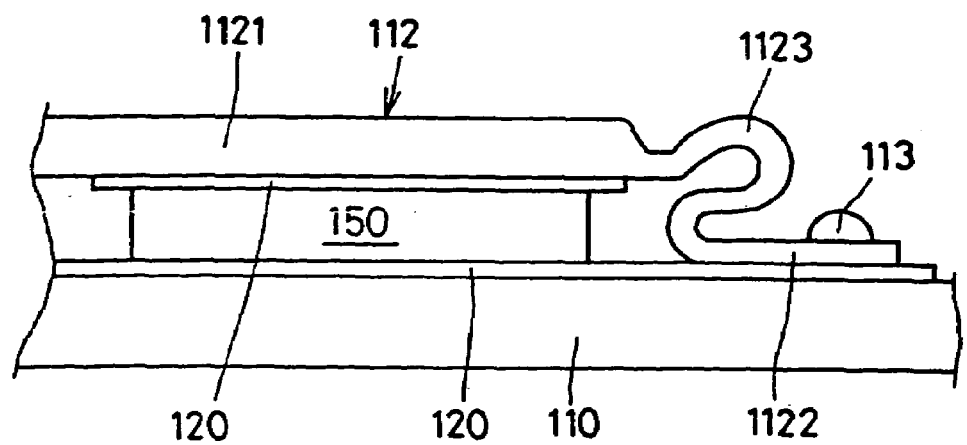
FIG. 52 is a side view showing a pinching structure of the semiconductor module in a twenty-third embodiment.

Another embodiment will next be explained with reference to FIG. 52.

In this embodiment, the fixing member 112 has an elastic deforming portion 1123 having a curving shape in which a beam portion 1121 particularly has a large elastic modulus toward the thickness direction of the semiconductor module 150. In such a construction, it is possible to greatly reduce the thermal stress caused by the difference in coefficient of thermal expansion already described between the semiconductor module 150 and the leg portion 1122 in the thickness direction of the semiconductor module 150.

Twenty-Fourth Embodiment

Figure 53:
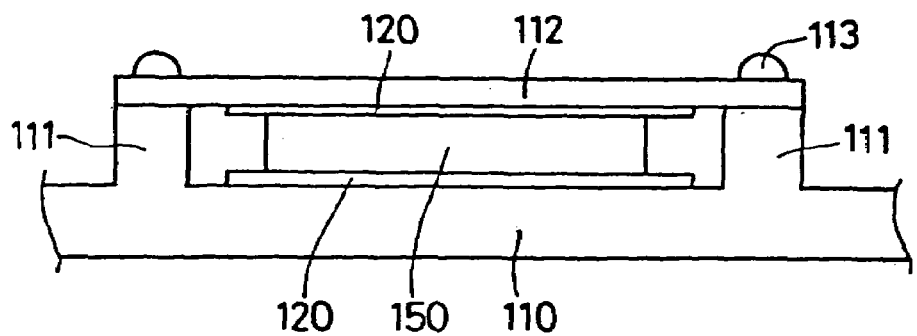
FIG. 53 is a side view showing a pinching structure of the semiconductor module in a twenty-fourth embodiment of the present invention.

Another embodiment will next be explained with reference to FIG. 53.

In this embodiment, the heat sink 110 has a pair of side wall portions 111 projected on both sides of the semiconductor module 150, and the fixing member 112 is formed by a metallic thin plate. Both end portions of the fixing member 112 are fixed to the side wall portions by screws 113 manufactured by resin.

In accordance with this construction, the fixing member 112 can be easily elastically deformed in the thickness direction of the semiconductor module 150 so that the above thermal stress can be preferably absorbed. Further, the heat radiating distance between the heat sink 110 and a metallic heat radiating plate of the semiconductor module 150 on a side opposed to the heat sink is shortened. Accordingly, a reduction in heat radiating property can be restrained although the fixing member 112 is made thin.

Twenty-Fifth Embodiment

Figure 54:
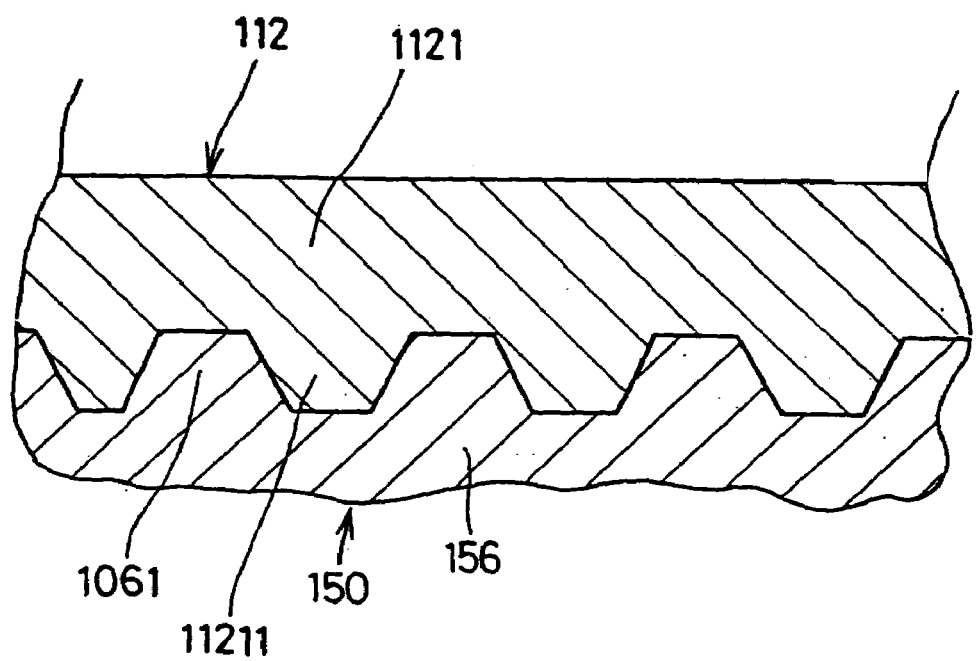
FIG. 54 is a side view showing a pinching structure of the semiconductor module in a twenty-fifth.

Another embodiment will next be explained with reference to FIG. 54.

In this embodiment, the metallic heat radiating plate 156 of the semiconductor module 150 on a side opposed to the heat sink has an irregular portion 1061 fitted to an irregular portion 11211 of a beam portion 1121 of the fixing member 112. A metallic heat radiating plate (not shown) of the semiconductor module 100 on a heat sink side and a leg portion 1122 of the fixing member 112 respectively come in close contact with the heat sink 110 through insulation heat conducting members having an electric insulating property. A screw 113 is manufactured by resin. A side face of the irregular portion is set to a taper face so as to easily fit and position the irregular portion. Thus, the fixing member 112 is easily positioned with respect to the semiconductor module 150 so that a transversal shift of the semiconductor module 150 can be prevented, and the heat resistance between the semiconductor module 150 and the fixing member 112 can be reduced. The fixing member 112 can be also used as a terminal of the metallic heat radiating plate 156 of the semiconductor module 150 on the side opposed to the heat sink.

This irregular fitting structure can be also used in contact of the metallic heat radiating plate of the semiconductor module 150 on the heat sink side and the heat sink 110. However, in this case, the metallic heat radiating plate of the semiconductor module 150 on the heat sink side is preferably set to have the same electric potential (normally ground electric potential) as the heat sink.

Twenty-Sixth Embodiment

Figure 55:
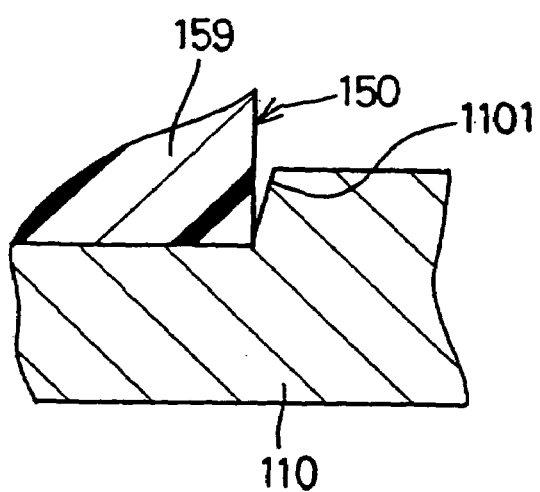
FIG. 55 is a side view showing one portion of a pinching structure of the semiconductor module in a twenty-sixth embodiment.

Another embodiment will next be explained with reference to FIG. 55.

In this embodiment, the heat sink 110 has a stopper 1101 coming in contact with a resin mold portion 159 of the semiconductor module 150 and regulating a transversal shift of the semiconductor module 150. Thus, no semiconductor module is transversally shifted from the heat sink or a biasing-holding member even in a high vibration environment such as an electric automobile so that reliability can be improved. Since a side face of this stopper 1101 is set to a taper face (slanting face), the semiconductor module 150 is easily positioned.

(Modified Mode)

In the above modified mode, the stopper is arranged in the heat sink 110, but may be also arranged in the fixing member 112 so as to prevent the transversal shift of the semiconductor module 150. In this case, the semiconductor module 150 is easily positioned by setting the side face of the stopper to a taper face (slanting face).

Twenty-Seventh Embodiment

Figure 56:
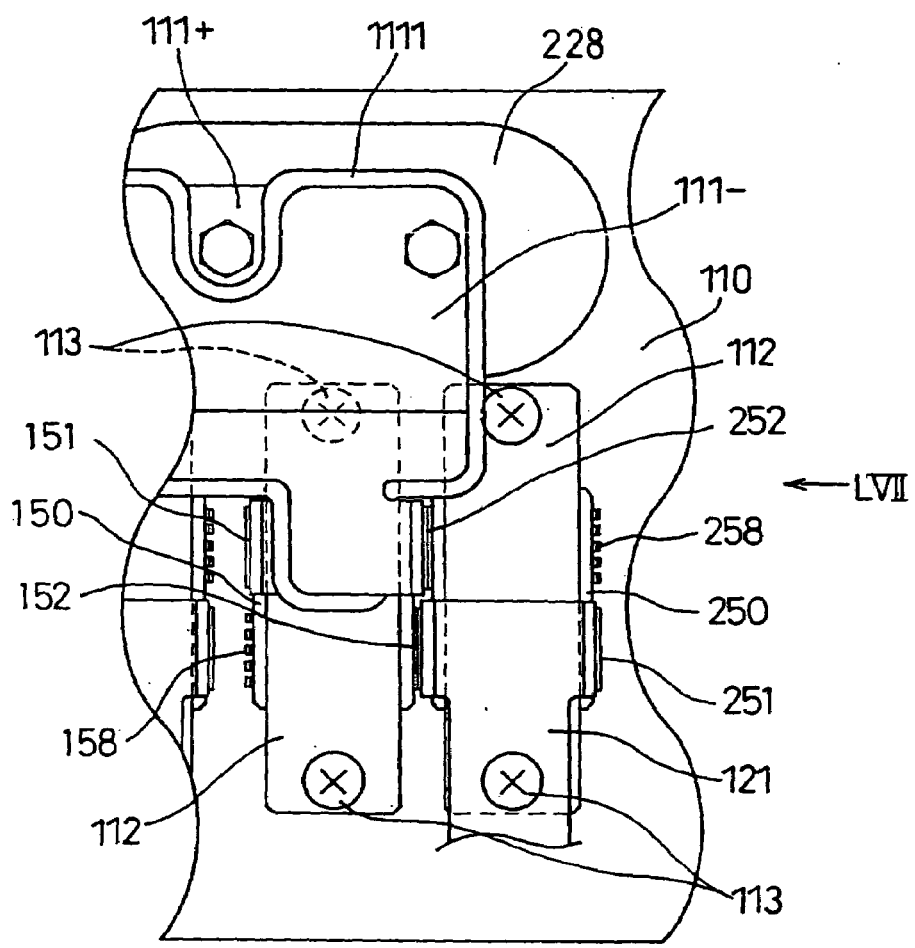
FIG. 56 is a plan view of a main portion of an inverter circuit device of a twenty-seventh embodiment.
Figure 57:
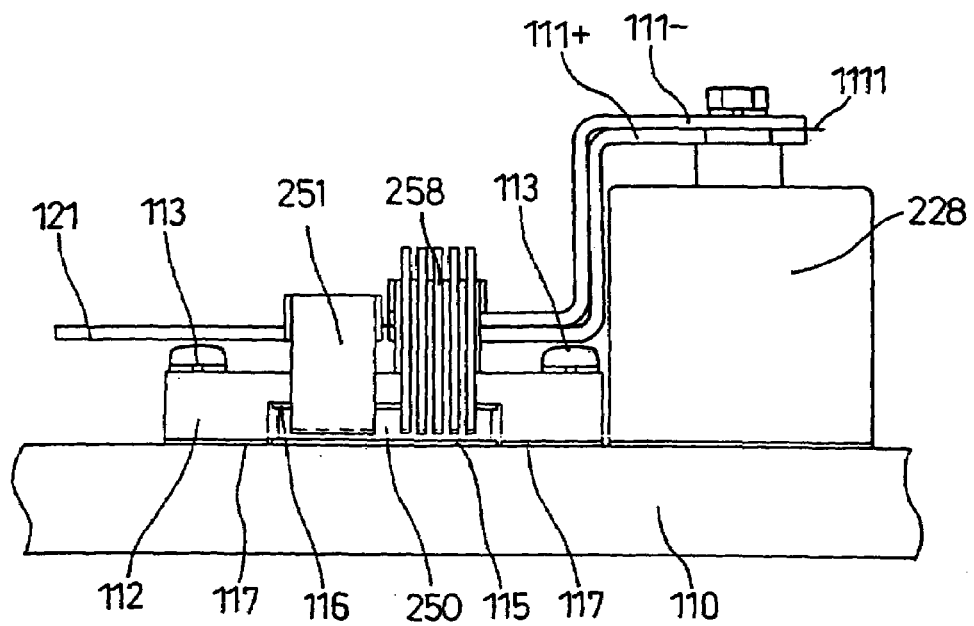
FIG. 57 is a side view of the inverter circuit device shown in FIG. 56.

Another embodiment of the inverter device of the present invention will be explained with reference to FIGS. 56 and 57. FIG. 56 is a partial plan view of a U-phase portion. FIG. 57 is a side view seen from an arrow LVII of FIG. 56.

The heat sink 110 is constructed by a metallic plate of a water cooling structure forming a cooling flow path therein. For example, the heat sink 110 is formed by a die-cast method. Reference numeral 150 designates a card type semiconductor module. The structure of the card type semiconductor module 150 is already explained in the eighteenth embodiment.

The card type semiconductor module (also called a semiconductor module) 150 is detachably fixed by fastening a screw 113 from above the fixing member (biasing-holding member) 112. The fixing member (biasing-holding member) 112 presses the semiconductor module 150 against an upper face of the heat sink 110. A semiconductor module 250 of a lower arm has the same construction as the semiconductor module 150. Similarly to the semiconductor module 150, the semiconductor module 250 is fixed so as to be pressed against the heat sink 110 in a state in which the semiconductor module 250 is horizontally rotated 180 degrees with respect to the semiconductor module 150 in FIG. 56.

A smoothing capacitor 228 is adjacent to the semiconductor modules 150, 250 and is fixed such that a bottom face of the smoothing capacitor 228 comes in contact with the heat sink 110. A positive direct current input bus bar 111+ and a negative direct current input bus bar 111− respectively connect direct current input terminals 151, 252 of the semiconductor modules 150 and 250, and positive and negative electrodes of the smoothing capacitor 228. An insulator 1111 nips the positive and negative direct current input bus bars 111+ and 111− so as to electrically insulate these bus bars from each other. An alternating current output bus bar 121 of the U-phase connects alternating current output terminals 152, 251 of the semiconductor modules 150, 250 and a three-phase alternating current motor 229. Constructions with respect to the V-phase and the W-phase are similar to the construction of the U-phase. Accordingly, an explanation of these constructions is omitted here.

A controller 130 is arranged approximately in parallel with the heat sink above the semiconductor module although this arrangement is not illustrated here. The controller 130 is connected to signal electrodes 158, 258 of the respective semiconductor modules, etc.

A member having a heat conducting property and an electrical insulative property, e.g., a heat radiating sheet of a silicone system is pinched between the heat sink 110 and each of the semiconductor modules 150, 250 at a contact face 115 and between the biasing-holding member 112 and each of the semiconductor modules 150, 250 at a contact face 116. A member having a good heat conducting property, e.g., a heat radiating sheet of a silicone system, grease, etc. are nipped on a contact face 117 of the biasing-holding member 112 and the heat sink 110. If the biasing-holding member is an insulating member such as resin having a good heat conducting property, etc., no electric insulating property is required in the heat conducting member nipped on the contact face 116. A member having a good heat conducting property may be also similarly nipped on the bottom face of a capacitor and a contact face of the heat sink.

FIG. 56 shows only the U-phase, but a three-phase inverter can be simply constructed by arranging similar constructions with respect to the V-phase and W-phase in parallel with each other on a side of FIG. 56.

The other constructions are the same as the eighteenth embodiment. In accordance with this embodiment, the following operational effects can be obtained.

First, semiconductor modules 150 to 650 are mounted to the heat sink 110 in a posture in which a main face of the semiconductor modules 150 to 650 on a drain area side having small heat resistance among two main faces of these semiconductor modules is pressed against the heat sink 110 having high cooling performance. Therefore, heat radiating property is improved, and the cooling property of a semiconductor element can be further improved.

Next, as shown in FIGS. 45B and 56, the drain electrode terminal (positive direct current power source terminal) 151 of the semiconductor module 150 is arranged approximately with rotation symmetry with respect to the source electrode terminal (alternating current output terminal) 152 of the semiconductor module 150. In other words, the drain electrode terminal 151 is arranged at a half portion of one of two longitudinal sides parallel to each other in a rectangular shape of the semiconductor module 150, which is positioned in a diagonal direction to a portion of the other of two longitudinal sides in which the source electrode terminal 152 is formed. Namely, the drain electrode terminal 151 is disposed on the one of the two longitudinal sides parallel to each other, while the source electrode terminal 152 is disposed on the other of two longitudinal sides. Additionally, the drain electrode terminal 151 and the source electrode terminal 152 are shifted from each other in a direction parallel to the two longitudinal sides.

The signal terminal 158 is arranged at another half of the one of the longitudinal sides parallel each other described above (another half portion on a side at which the drain electrode terminal 101 is formed in FIG. 45B). Accordingly, switching elements of six arms of the three-phase inverter can be reasonably arranged at high density by one kind of card module so that the inverter can be made compact.

Such a construction will be explained further in detail with reference to FIG. 56. The semiconductor module 150 of an upper arm of the U-phase and the semiconductor module 250 of a lower arm can be obtained by rotating the semiconductor module 250 180 degrees on the same plane with respect to the semiconductor module 150 and setting the semiconductor module 250 to be adjacent to the semiconductor module 150.

The source terminal 152 is projected from the semiconductor module 150 in a lower half in FIG. 56 along a pair of long sides opposing and parallel to each other of the semiconductor modules 150 and 250. Similarly, the source terminal 252 is projected from the semiconductor module 250 in an upper half in FIG. 56. Since these terminals 152, 252 are not overlapped, the distance between both the semiconductor modules 150, 250 can be shortened so that high density mounting can be performed. These terminals have the same construction with respect to a pair of semiconductor modules 350 and 450 and a pair of semiconductor modules 550 and 650 in the other phases.

The positive direct current input bus bar 111+ and the negative direct current input bus bar 111− can be mutually overlapped and extended until the positive direct current power source terminal 151 and the negative direct current power source terminal 152 of the semiconductor module 150. Accordingly, the wiring inductance occurred between both the bus bars 111+ and 111− can be reduced by mutual induction effects. As a result, a serge voltage superposed on the bus bars 111+ and 111− can be reduced in accordance with switching of semiconductor elements 222, 223.

Figure 58:
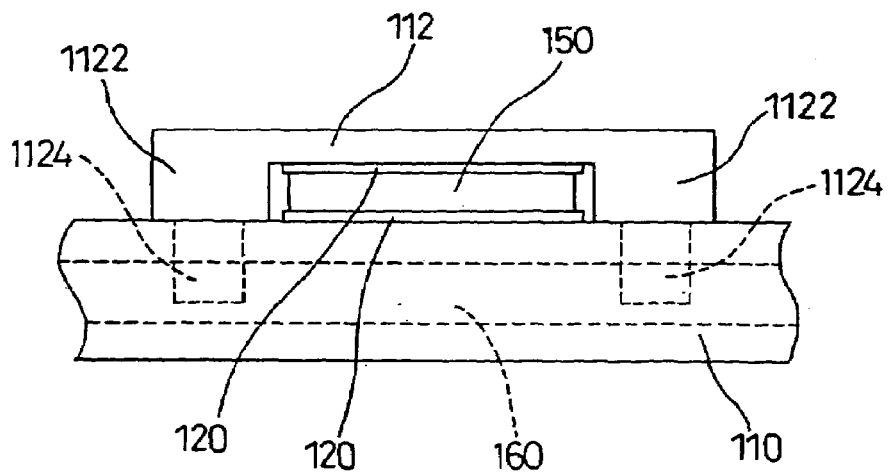
FIG. 58 is a side view showing a pinching structure of the semiconductor module shown in FIG. 56.

Next, in this embodiment, as shown in FIG. 58, a water cooling flow path 160 is arranged within the heat sink 110. Reference numeral 120 designates a good heat conducting member of e.g., a silicon system having a high electric insulating property. A columnar projecting portion 1123 is projected from a tip of the leg portion 1122 of the biasing-holding member 112. The projecting portion 1123 is pressed and fitted into a hole reaching the water cooling flow path 160, which is opened to an upper face of the heat sink 110.

Cooling water of the water cooling flow path 160 can preferably cool this projecting portion 1123 by increasing the length of a tip of the projecting portion 1123 projected into the water cooling flow path 160. As a result, the heat resistance between the heat sink 110 and the biasing-holding member 112 can be reduced. The screw 113 can be also omitted in this figure. However, in this case, the feature of mechanical detachability is lost.

Figure 59:
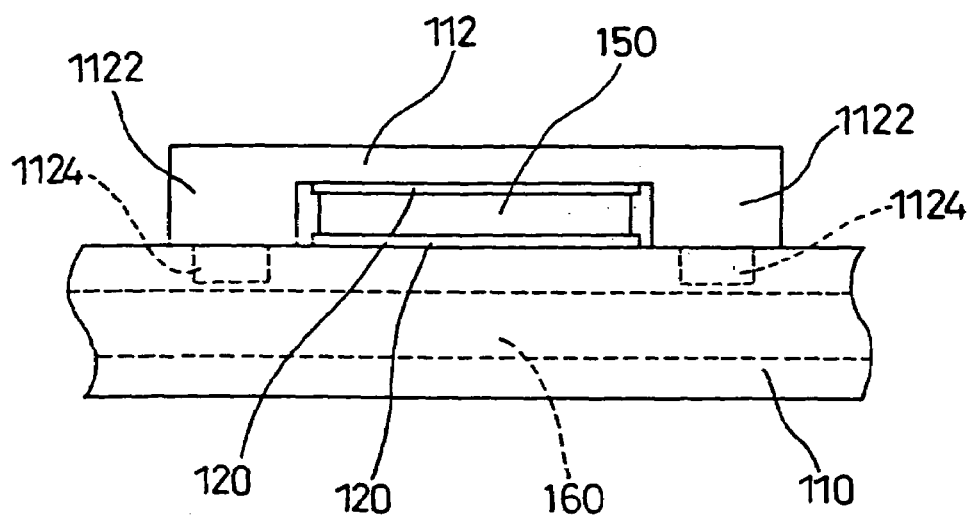
FIG. 59 is a side view showing a modified mode of FIG. 58.

As shown in FIG. 59, the tip of the projecting portion 1123 may be also set to have a length at which the projecting portion 1123 is not projected into the water cooling flow path 150. In this case, the heat resistance between the heat sink 110 and the biasing-holding member 112 is slightly increased in comparison with FIG. 58, but there is an advantage in which possibility of leakage of cooling water from the clearance of a press-fitting portion can be also excluded. Further, a cooling water passage communicated between projecting portions 1123 on both sides of the biasing-holding member 112 may be also arranged within the biasing-holding member 112. In such an arrangement, the cooling water can flow on both sides of the semiconductor module 150 so that excellent cooling effects can be realized.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
a cooling unit in which coolant flows;
a semiconductor chip having two main surfaces press-pinched by the cooling unit; and
an electronic member different from the semiconductor chip, wherein
the electronic member is located to contact the cooling unit;
the cooling unit includes a plurality of tubes;
the semiconductor chip is located between adjacent two tubes; and
the two main surfaces of the semiconductor chip contact the tubes.

2. The semiconductor device according to claim 1, wherein the tubes are located parallel with each other.

3. A semiconductor device comprising:
a cooling unit in which coolant flows;
a semiconductor chip having two main surfaces press-pinched by the cooling unit; and
an electronic member different from the semiconductor chip, wherein
the electronic member is located to contact the cooling unit;
the cooling unit includes a plurality of tubes, and a pair of header tanks connected to the tubes at two ends of each tube to communicate with the tubes;
the semiconductor chip is press-pinched by the two tubes of the cooling unit; and
the electronic member contacts one of the header tanks.

4. The semiconductor device according to claim 3, further comprising:
a plurality of semiconductor chips each of which is press-pinched by two tubes of the cooling unit.

5. The semiconductor device according to claim 3, wherein the electronic member is a capacitor having a flat surface positioned on a surface of the header tank.

* * * * *